(12) United States Patent
Yamazaki et al.

(10) Patent No.: US 10,084,096 B2
(45) Date of Patent: Sep. 25, 2018

(54) SEMICONDUCTOR DEVICE AND METHOD OF MANUFACTURING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Haruyuki Baba, Isehara (JP); Akio Suzuki, Yokohama (JP); Hiromi Sawai, Atsugi (JP); Masahiko Hayakawa, Atsugi (JP); Noritaka Ishihara, Koza (JP); Masashi Oota, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/697,513

(22) Filed: Sep. 7, 2017

(65) Prior Publication Data
US 2018/0013005 A1    Jan. 11, 2018

Related U.S. Application Data

(63) Continuation of application No. 14/953,632, filed on Nov. 30, 2015, now Pat. No. 9,761,733.

(30) Foreign Application Priority Data

Dec. 1, 2014    (JP) .................................. 2014-242856
Mar. 10, 2015    (JP) .................................. 2015-047546
(Continued)

(51) Int. Cl.
*H01L 29/10*    (2006.01)
*H01L 29/786*    (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC . H01L 29/7869; H01L 29/045; H01L 21/203; H01L 21/02266
(Continued)

(56) References Cited

U.S. PATENT DOCUMENTS 5,528,032 A    6/1996    Uchiyama
5,731,856 A    3/1998    Kim et al.
(Continued)

FOREIGN PATENT DOCUMENTS

EP    1737044 A    12/2006
EP    2226847 A    9/2010
(Continued)

OTHER PUBLICATIONS

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
(Continued)

*Primary Examiner* — David Vu
*Assistant Examiner* — Brandon Fox
(74) *Attorney, Agent, or Firm* — Fish & Richardson P.C.

(57) ABSTRACT

After a sputtering gas is supplied to a deposition chamber, plasma including an ion of the sputtering gas is generated in the vicinity of a target. The ion of the sputtering gas is accelerated and collides with the target, so that flat-plate particles and atoms of the target are separated from the target. The flat-plate particles are deposited with a gap therebetween so that the flat plane faces a substrate. The atom and the aggregate of the atoms separated from the target enter the gap between the deposited flat-plate particles
(Continued)

and grow in the plane direction of the substrate to fill the gap. A film is formed over the substrate. After the deposition, heat treatment is performed at high temperature in an oxygen atmosphere, which forms an oxide with a few oxygen vacancies and high crystallinity.

14 Claims, 58 Drawing Sheets

(30) Foreign Application Priority Data

Jun. 11, 2015 (JP) .................. 2015-118401
Jun. 24, 2015 (JP) .................. 2015-126832

(51) Int. Cl.
  *H01L 29/66* (2006.01)
  *H01L 29/24* (2006.01)
  *H01L 29/04* (2006.01)
  *H01L 21/02* (2006.01)
  *H01L 21/203* (2006.01)

(52) U.S. Cl.
  CPC ...... *H01L 21/02631* (2013.01); *H01L 29/045* (2013.01); *H01L 29/24* (2013.01); *H01L 29/66969* (2013.01); *H01L 29/78696* (2013.01); *H01L 21/02266* (2013.01); *H01L 21/02609* (2013.01); *H01L 21/02667* (2013.01); *H01L 21/203* (2013.01)

(58) Field of Classification Search
  USPC .......................................... 257/43
  See application file for complete search history.

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,202,365 B2 | 6/2012 | Umeda et al. |
| 8,274,077 B2 | 9/2012 | Akimoto et al. |
| 8,274,078 B2 | 9/2012 | Itagaki et al. |
| 8,293,661 B2 | 10/2012 | Yamazaki |
| 8,319,218 B2 | 11/2012 | Yamazaki et al. |
| 8,466,463 B2 | 6/2013 | Akimoto et al. |
| 8,492,758 B2 | 7/2013 | Yamazaki et al. |
| 8,530,285 B2 | 9/2013 | Yamazaki et al. |
| 8,669,556 B2 | 3/2014 | Yamazaki et al. |
| 8,748,215 B2 | 6/2014 | Yamazaki |
| 8,765,522 B2 | 7/2014 | Yamazaki |
| 8,871,565 B2 | 10/2014 | Yamazaki et al. |
| 8,987,728 B2 | 3/2015 | Honda et al. |
| 9,166,021 B2 | 10/2015 | Tezuka et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0127579 A1 | 6/2011 | Yamazaki |

(56) References Cited

U.S. PATENT DOCUMENTS

| | | |
|---|---|---|
| 2012/0153364 A1 | 6/2012 | Yamazaki et al. |
| 2012/0261657 A1 | 10/2012 | Takahashi et al. |
| 2012/0267622 A1 | 10/2012 | Yamazaki et al. |
| 2012/0312681 A1 | 12/2012 | Yamazaki et al. |
| 2013/0009111 A1 | 1/2013 | Morita et al. |
| 2013/0009147 A1 | 1/2013 | Koyama et al. |
| 2013/0153889 A1 | 6/2013 | Yamazaki et al. |
| 2014/0001032 A1 | 1/2014 | Yamazaki |
| 2014/0021036 A1 | 1/2014 | Yamazaki |
| 2014/0042014 A1 | 2/2014 | Yamazaki |
| 2014/0042018 A1 | 2/2014 | Yamazaki |
| 2014/0042674 A1 | 2/2014 | Yamazaki |
| 2014/0045299 A1 | 2/2014 | Yamazaki |
| 2014/0097428 A1 | 4/2014 | Yamazaki et al. |
| 2014/0102877 A1 | 4/2014 | Yamazaki |
| 2014/0145183 A1 | 5/2014 | Yamazaki |
| 2014/0183527 A1 | 7/2014 | Yamazaki et al. |
| 2014/0299873 A1 | 10/2014 | Yamazaki |
| 2014/0346500 A1 | 11/2014 | Yamazaki |
| 2015/0034475 A1 | 2/2015 | Yamazaki |
| 2015/0034947 A1 | 2/2015 | Yamazaki et al. |
| 2015/0107988 A1 | 4/2015 | Yamazaki |
| 2016/0118254 A1 | 4/2016 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2014-199905 A | 10/2014 |
| WO | WO-2004/114391 | 12/2004 |

OTHER PUBLICATIONS

Uraoka.Y et al., "Analysis of Thermal Degradation in Oxide Thin Film Transistors", ECS Transactions, Oct. 5, 2014, vol. 64, No. 10, pp. 71-78, The Electrochemical Society.

Kamiya.T et al., "Electron-Beam-Induced Crystallization of Amorphous In-Ga-Zn-O Thin Films Fabricated by UHV Sputtering", IDW'13 : Proceedings of the 20th International Display Workshops, Dec. 4, 2013, pp. 280-281.

Hosemann.R, "Crystalline and Paracrystalline Order in High Polymers", J. Appl. Phys. (Journal of Applied Physics) , 1963, vol. 34, No. 1, pp. 25-41.

Yamazaki.S et al., "Back-channel-etched thin-film transistor using c-axis-aligned crystal In-Ga-Zn oxide", J. Soc. Inf. Display (Journal of the Society for Information Display), 2014, vol. 22, No. 1, pp. 55-67.

Yamazaki.S et al., "Properties of crystalline In-Ga-Zn-oxide semiconductor and its transistor characteristics", Jpn. J. Appl. Phys. (Japanese Journal of Applied Physics) , Apr. 1, 2014, vol. 53, No. 4, pp. 04ED18-1-04ED18-10.

Matsuzawa et al., "Examination of RDF Measurements by SSRM", Extended Abstract of the 62th JSAP Spring Meeting, Mar. 11, 2015, pp. 12-221.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

(56) References Cited

OTHER PUBLICATIONS

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFe2O4, and YB2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

FIG. 2A
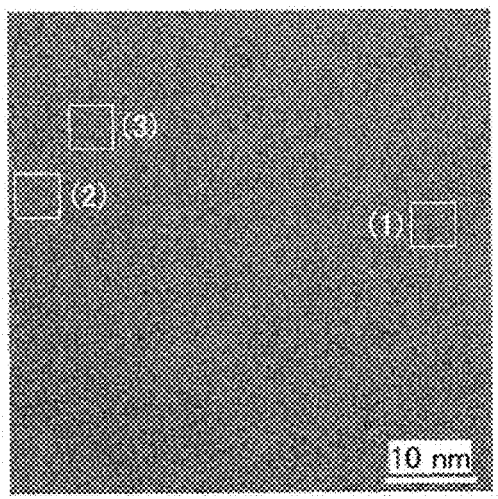
FIG. 2B          FIG. 2C          FIG. 2D
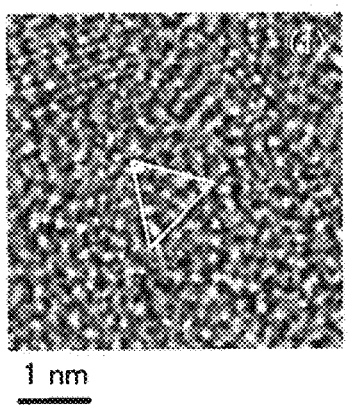   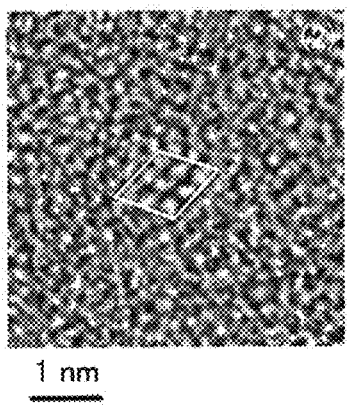   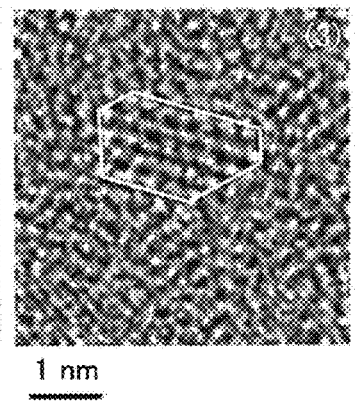

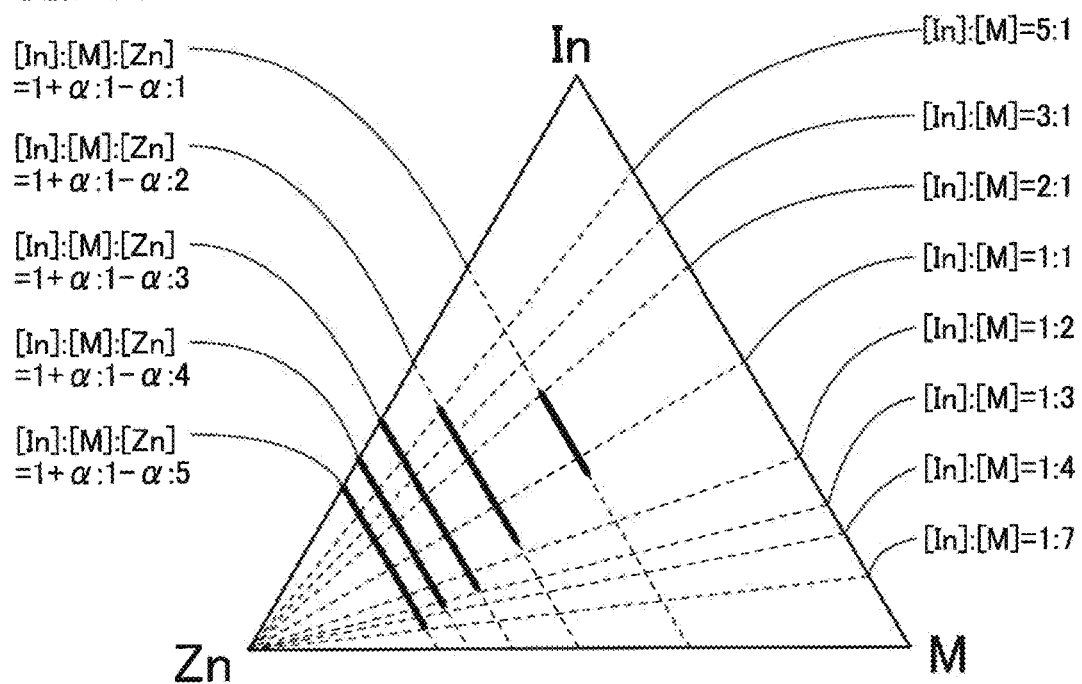

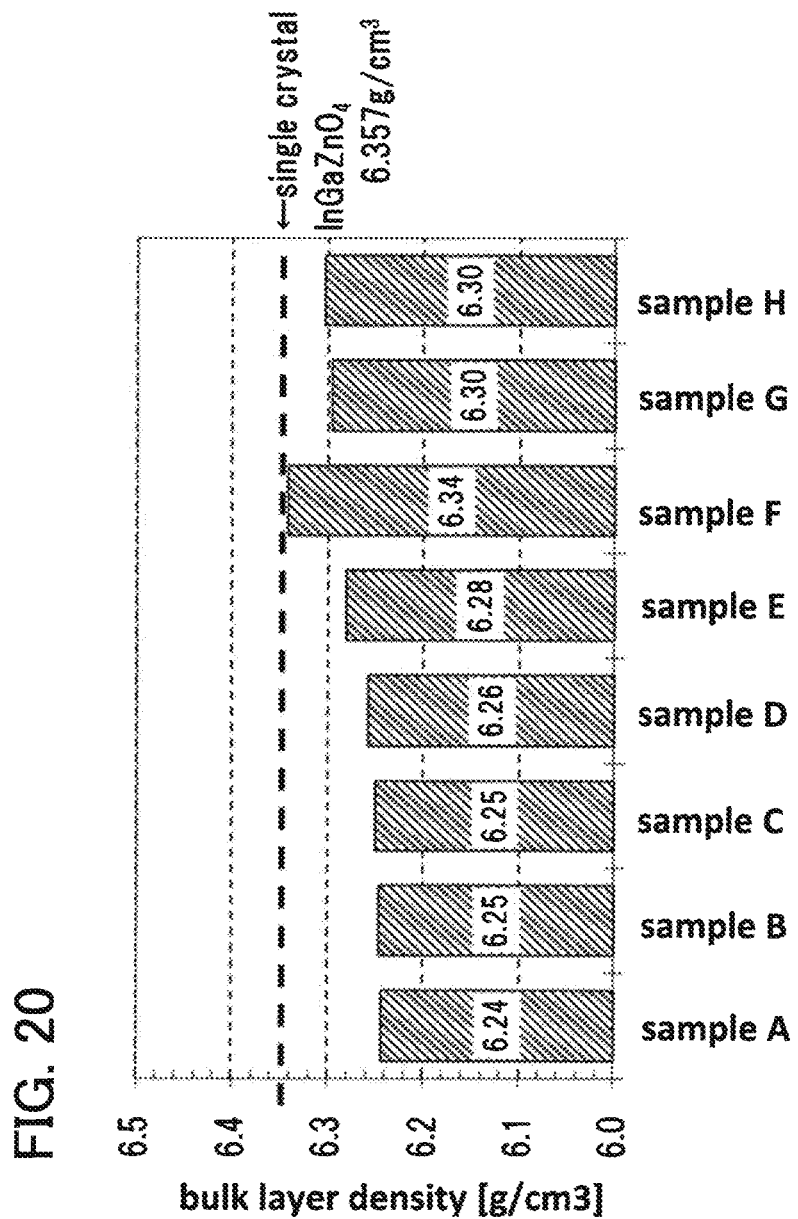

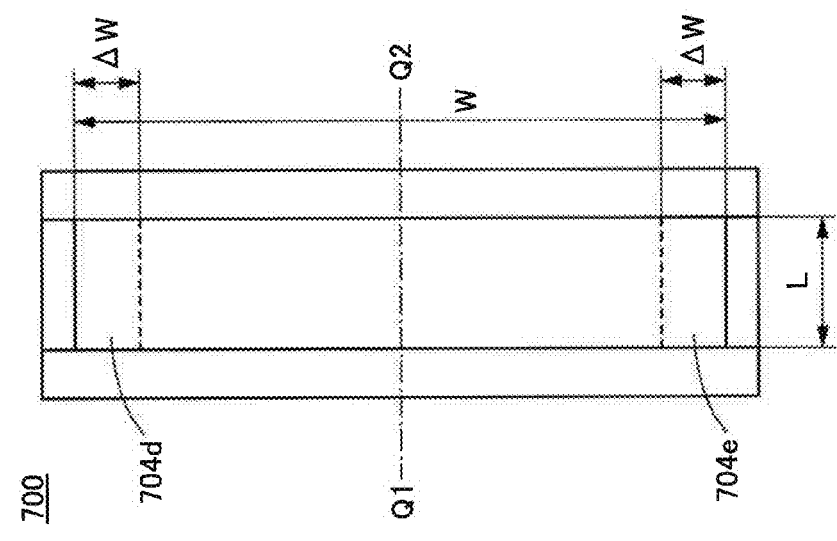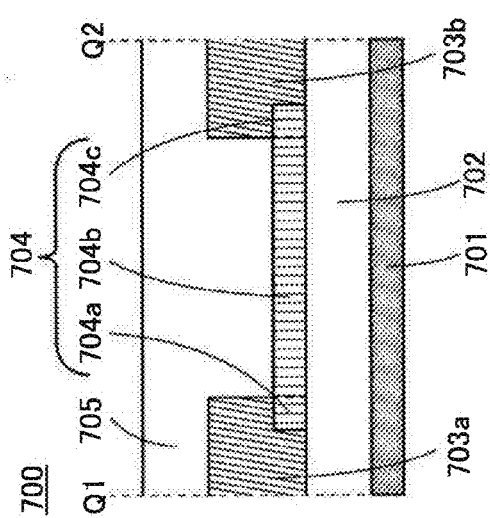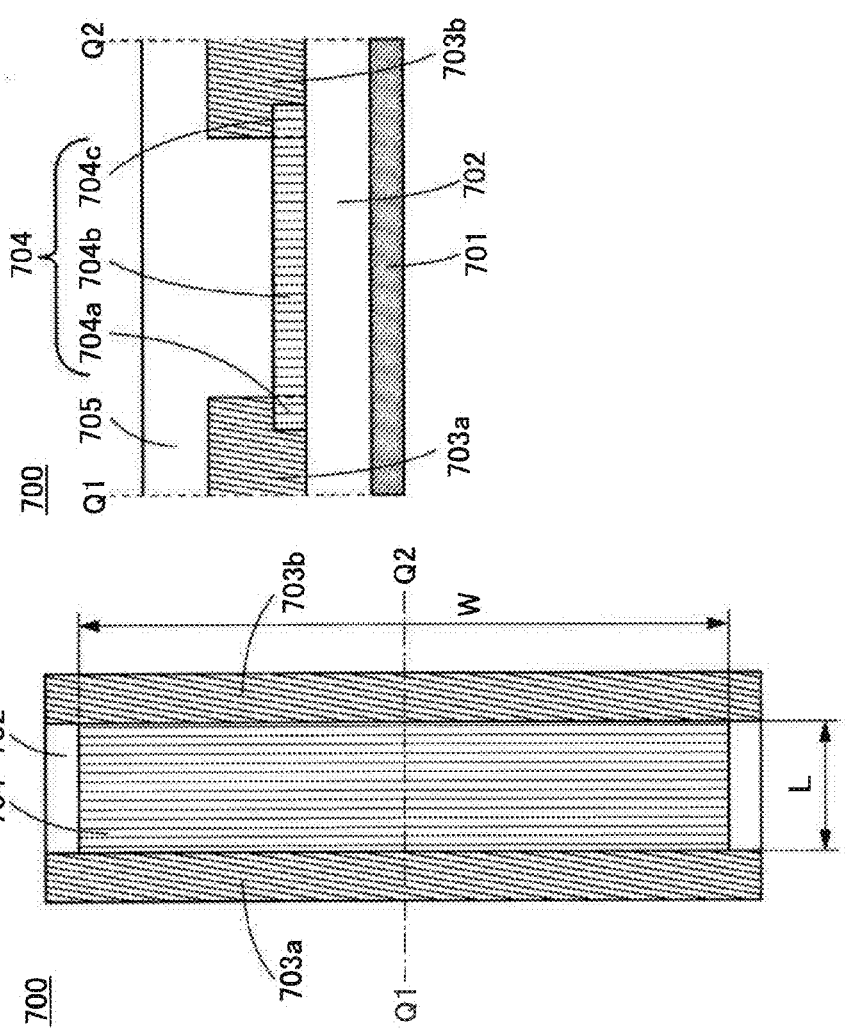

SEMICONDUCTOR DEVICE AND METHOD OF MANUFACTURING THE SAME

CROSS-REFERENCE TO RELATED APPLICATIONS

This application is a continuation of U.S. application Ser. No. 14/953,632, filed Nov. 30, 2015, now allowed, which claims the benefit of foreign priority applications filed in Japan as Serial No. 2014-242856 on Dec. 1, 2014, Serial No. 2015-047546 on Mar. 10, 2015, Serial No. 2015-118401 on Jun. 11, 2015, and Serial No. 2015-126832 on Jun. 24, 2015, all of which are incorporated by reference.

BACKGROUND OF THE INVENTION

1. Field of the Invention

One embodiment of the present invention relates to a semiconductor device including an oxide semiconductor, a method of manufacturing an oxide, or a method of testing an oxide.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, and a method for testing any of them.

2. Description of the Related Art

In recent years, display devices have been used in various electronic devices such as television receivers, personal computer monitors, and smart phones, and the performance of the display devices has been improved to achieve higher definition, lower power consumption, and other various objectives.

In addition, semiconductor devices such as central processing units (CPUs), memories, and sensors have been used in various electronic devices such as personal computers, smart phones, and digital cameras. The performance of the semiconductor devices has also been improved to achieve miniaturization, lower power consumption, and other various objectives.

One of the ways that have been proposed to achieve higher performance such as higher definition, lower power consumption, and miniaturization is the use of an oxide semiconductor for a semiconductor layer (hereinafter also referred to as an active layer, a channel layer, or a channel formation region) of a transistor in a semiconductor device. An example of the transistor includes an oxide of indium, gallium, and zinc (hereinafter also referred to as an In—Ga—Zn oxide) for a channel layer (see Patent Document 4).

In particular, a transistor using an oxide semiconductor in a channel layer is used as a switching element or the like in a display device (Patent Documents 1 and 2).

Oxide semiconductors have been researched since early times. In 1988, there was a disclosure of a crystal In—Ga—Zn oxide that can be used for a semiconductor element (see Patent Document 3).

In 2013, it is reported that an amorphous In—Ga—Zn oxide whose crystallization is promoted by irradiation with an electron beam has an unstable structure and that the formed amorphous In—Ga—Zn oxide has no ordering in observation with a high-resolution transmission electron microscope (see Non-Patent Document 1).

In 2014, electric characteristics and reliability of a transistor using an amorphous In—Sn—Zn oxide were reported (see Non-Patent Document 6). It was reported that, in the transistor using an amorphous In—Sn—Zn oxide, electrons accelerated by an electric field generated inside the oxide form a plurality of carriers because of impact ionization, which leads to deterioration with an increase in drain current.

In 2014, it was also reported that a transistor including a crystalline In—Ga—Zn oxide has more excellent electrical characteristics and higher reliability than a transistor including an amorphous In—Ga—Zn oxide (see Non-Patent Documents 2 to 4). These documents report that a crystal boundary is not clearly observed in an In—Ga—Zn oxide including a c-axis aligned a-b-plane-anchored crystalline oxide semiconductor (CAAC-OS).

As a kind of a structure of polymer crystal, a concept of "paracrystal" is known. A paracrystal seemingly has a trace of crystal lattice; however, compared with an ideal single crystal, the paracrystal has a distorted crystal structure (see Non-Patent Document 5).

REFERENCES

Patent Documents

Patent Document 1: Japanese Published Patent Application No. 2007-123861
Patent Document 2: Japanese Published Patent Application No. 2007-96055
Patent Document 3: Japanese Published Patent Application No. S63-239117
Patent Document 4: Japanese Translation of PCT International Application No. H11-505377
Patent Document 5: Japanese Published Patent Application No. H6-275697

Non-Patent Documents

Non-Patent Document 1: T. Kamiya, Koji Kimoto, N. Ohashi, K. Abe, Y. Hanyu, H. Kumomi, and H. Hosono, "Electron-Beam-Induced Crystallization of Amorphous In—Ga—Zn—O Thin Films Fabricated by UHV Sputtering", Proceedings of *The 20th International Display Workshops,* 2013, AMD2-5L
Non-Patent Document 2: S. Yamazaki, H. Suzawa, K. Inoue, K. Kato, T. Hirohashi, K. Okazaki, and N. Kimizuka, "Properties of crystalline In—Ga—Zn-oxide semiconductor and its transistor characteristics", *Japanese Journal of Applied Physics,* vol. 53, 2014, 04ED18
Non-Patent Document 3: S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, "Back-channel-etched thin-film transistor Using c-axis-aligned crystal In—Ga—Zn Oxide", *Journal of the Society for Information Display,* 8 Apr. 2014, Volume 22, Issue 1, pp. 55-67
Non-Patent Document 4: S. Yamazaki, "Crystalline Oxide Semiconductor Using CAAC-IGZO and its Application," *The Electrochemical Society Transactions,* 2014, vol. 64(10), pp. 155-164

Non-Patent Document 5: Rolf Hosemann, "Crystalline and Paracrystalline Order in High Polymers", *Journal of Applied Physics*, January 1963, vol. 34, number. 1, pp. 25-41

Non-Patent Document 6: Y. Uraoka, S. Urakawa, Y. Ishikawa: "Analysis of Thermal Degradation in Oxide Thin Film Transistor", *The Electrochemical Society Transactions*, 2014, vol. 64(10), pp. 71-78.

SUMMARY OF THE INVENTION

Semiconductor devices used as components of electronic devices need to be resistant to heat, electricity, light, or the like in accordance with uses and use environments of the electronic devices. For example, heat generated inside an electronic device during operation might cause a semiconductor device to break down. Alternatively, ultraviolet rays emitted on a semiconductor device, the ambient temperature of an electronic device, or the like might cause a breakdown when the electronic device is used outdoors.

As described above, a breakdown of an electronic device can be due to an incident in a semiconductor device itself, such as heat generation in the electronic device, or due to an external environment such as ultraviolet rays and the ambient temperature.

A semiconductor which is one of components of a transistor used in a semiconductor device is affected by, for example, heat, light, or current flowing through the semiconductor device. If affected significantly, the semiconductor deteriorates, which might degrade current characteristics of the transistor including the semiconductor. Specific deterioration examples of the transistor are a shift in threshold voltage and occurrence of short-channel effects.

The following tests measure characteristics and reliability of a transistor in a use environment: a bias-temperature stress test (hereinafter, also referred to as a BT test); and a test for observing or measuring current characteristics, temperature, light emission, or the like with respect to the time during which a high potential is kept being applied between two electrodes, a gate electrode and a source or drain electrode of a transistor.

In the above tests for a transistor, the behavior and lifetime of the transistor is examined in such a manner that a large load such as a high potential or heat is applied to the transistor to advance deterioration of a semiconductor. The application of a high potential between electrodes of the transistor might cause conduction with another electrode because of a foreign substance (e.g., dust or a residue), a remaining component (e.g., water or hydrogen), a structural defect, or the like in the semiconductor, which might result in a problem such as unintended current flow between electrodes.

In particular, in a transistor including an oxide semiconductor, a defect due to oxygen vacancies in the oxide semiconductor might cause current to flow between electrodes of the transistor.

An object of one embodiment of the present invention is to provide a method of manufacturing an oxide that can be used as a semiconductor of a transistor or the like. An object is to provide a method of manufacturing, for example, an oxide with fewer defects such as grain boundaries or oxygen vacancies.

Another object of one embodiment of the present invention is to provide a novel semiconductor device or the like using an oxide as a semiconductor. Another object of one embodiment of the present invention is to provide a module that includes a semiconductor device using an oxide as a semiconductor. Another object of one embodiment of the present invention is to provide an electronic device using a module that includes a semiconductor device using an oxide as a semiconductor. Another object of one embodiment of the present invention is to provide a novel semiconductor device, a novel display device, a novel module, a novel electronic device, or the like.

Another object of one embodiment of the present invention is to provide a transistor that is resistant to heat generated from itself and a semiconductor device using the transistor. Another object of one embodiment of the present invention is to provide a transistor that is unlikely to depend on the ambient temperature and a semiconductor device using the transistor. Another object of one embodiment of the present invention is to provide a transistor that can withstand high current and high voltage and a semiconductor device using the transistor. Another object of one embodiment of the present invention is to provide a transistor having favorable electrical characteristics and a semiconductor device using the transistor. Another object of one embodiment of the present invention is to provide a transistor having stable electrical characteristics and a semiconductor device using the transistor. Another object of one embodiment of the present invention is to provide a transistor having low off-state current and a semiconductor device using the transistor.

Another object of one embodiment of the present invention is to provide a method of testing oxygen vacancies in the oxide semiconductor used in the transistor. Another object of one embodiment of the present invention is to provide a method of quantitatively testing the amount of oxygen in an oxide semiconductor, an insulator, and a conductor that are included in the transistor.

Note that the objects of one embodiment of the present invention are not limited to the above objects. The objects described above do not disturb the existence of other objects. The other objects are ones that are not described above and will be described below. The other objects will be apparent from and can be derived from the description of the specification, the drawings, and the like by those skilled in the art. One embodiment of the present invention solves at least one of the above objects and/or the other objects. One embodiment of the present invention need not solve all the aforementioned objects and/or the other objects.

(1)

One embodiment of the present invention is a semiconductor device including a transistor. The transistor includes an oxide that includes indium, zinc, and an element M (M is any one of aluminum, gallium, yttrium, and tin) and has a c-axis-aligned crystalline structure. The carrier density of the oxide is less than $8\times10^{11}/cm^3$, and the film density of the oxide is greater than or equal to 90% of a film density obtained when the oxide has a single crystal structure. The transistor has a property of withstanding voltage and a property of withstanding current.

(2)

Another embodiment of the present invention is the semiconductor device according to (1), in which the carrier density of the oxide is less than $1\times10^{11}/cm^3$ and greater than or equal to $1\times10^{-9}/cm^3$.

(3)

Another embodiment of the present invention is the semiconductor device according to (1) or (2), in which the spin density of a signal observed by electron spin resonance (ESR) of the oxide at a g-factor greater than or equal to 1.90 and less than or equal to 1.95 is less than or equal to $1\times10^{17}$ spins/$cm^3$.

(4)

Another embodiment of the present invention is the semiconductor device according to any one of (1) to (3), in which the transistor includes first to third conductive films, an insulating film, and first to third oxide semiconductor films. The second oxide semiconductor film comprises the oxide. The second oxide semiconductor film comprises a first region between the first oxide semiconductor film and the third oxide semiconductor film. The first conductive film comprises a second region in contact with at least any of the first to third oxide semiconductor films. The second conductive film comprises a third region in contact with at least any of the first to third oxide semiconductor films. The insulating film comprises a fourth region in contact with a top surface of the third oxide semiconductor film. The third conductive film and the first region overlap with each other with the insulating film interposed therebetween.

(5)

Another embodiment of the present invention is the semiconductor device according to any one of (1) to (3), in which the transistor includes first to third conductive films, an insulating film, and first to third oxide semiconductor films. The second oxide semiconductor film comprises the oxide. The second oxide semiconductor film comprises a first region located between the first oxide semiconductor film and the third oxide semiconductor film. The first conductive film comprises a second region in contact with at least any of the first to third oxide semiconductor films. The second conductive film comprises a third region in contact with at least any of the first to third oxide semiconductor films. The insulating film comprises a fourth region in contact with a lower portion of the first oxide semiconductor film. The third conductive film and the first region overlap with each other with the insulating film interposed therebetween.

(6)

Another embodiment of the present invention is the semiconductor device according to (4) or (5), wherein at least one of the first and third oxide semiconductor films comprises the oxide.

(7)

Another embodiment of the present invention is a method of manufacturing an oxide by a sputtering method using a deposition chamber, a target in the deposition chamber, and a substrate, the oxide having a c-axis-aligned crystalline structure, a carrier density less than $8 \times 10^{11}/cm^3$, and a film density greater than or equal to 90% of a film density obtained when the oxide has a single crystal structure. The method includes the following steps: after supplying a sputtering gas containing oxygen and/or a rare gas into the deposition chamber, generating a potential difference between the target and the substrate, thereby generating plasma including an ion of the sputtering gas in the vicinity of the target; accelerating the ion of the sputtering gas toward the target by the potential difference; separating a plurality of flat-plate particles of a compound containing a plurality of elements, an atom of the target, and an aggregate of atoms of the target from the target by collision of the accelerated ion of the sputtering gas with the target; negatively charging surfaces of the plurality of flat-plate particles that receive a negative charge from an ion of the sputtering gas while the plurality of flat-plate particles fly in the plasma; depositing one of the negatively charged flat-plate particles so that the surface faces the substrate; depositing another negatively charged flat-plate particle in a region apart from the one negatively charged flat-plate particle over the substrate while the one negatively charged flat-plate particle and the another negatively charged flat-plate particle repel each other; placing the atom and the aggregate of the atoms into a gap between the one negatively charged flat-plate particle and the another negatively charged flat-plate particle; and growing the atom and the aggregate of the atoms in a lateral direction in the gap between the flat-plate particles, so that the gap between the one negatively charged flat-plate particle and the another negatively charged flat-plate particle is filled with the atom and the aggregate of the atoms.

(8)

Another embodiment of the present invention is the method of manufacturing an oxide according to (7), in which the atom and the aggregate are grown in the lateral direction from the flat-plate particle so as to have the same structure as the flat-plate particle, and the gap between the flat-plate particles is filled.

(9)

Another embodiment of the present invention is the method of manufacturing an oxide according to (7) or (8), in which the flat-plate particles are stacked to form a thin film structure.

(10)

Another embodiment of the present invention is the method of manufacturing an oxide according to any one of (7) to (9), in which after formation of the oxide, thermal annealing or rapid thermal annealing (RTA) is performed at a temperature that is higher than a temperature at which the oxide is formed and that is lower than a temperature at which the oxide comes to have a different crystal structure, so that the oxide is made to have a high density or to be a single crystal.

(11)

Another embodiment of the present invention is the method of manufacturing an oxide according to (10), in which the temperature of the thermal annealing or RTA is higher than 300° C. and lower than 1500° C.

(12)

Another embodiment of the present invention is the method of manufacturing an oxide according to (11), wherein the thermal annealing or the RTA is performed in an oxygen atmosphere.

(13)

Another embodiment of the present invention is the method of manufacturing an oxide according to any one of (7) to (12), in which the oxide is formed on a surface having an amorphous structure.

(14)

Another embodiment of the present invention is the method of forming an oxide according to any one of (7) to (13), in which the target includes indium, zinc, an element M (M is any one of aluminum, gallium, yttrium, and tin), and oxygen, and the target has a region with a polycrystalline structure.

(15)

Another embodiment of the present invention is a semiconductor device comprising a transistor, the transistor comprising the oxide according to any one of (7) to/or (14)

According to one embodiment of the present invention, a method of forming an oxide that can be used as a semiconductor of a transistor or the like can be provided. In particular, a method of forming an oxide with fewer defects such as grain boundaries or oxygen vacancies can be provided.

According to one embodiment of the present invention, a novel semiconductor device using an oxide as a semiconductor can be provided. According to one embodiment of the present invention, a module that includes a semiconductor device using an oxide as a semiconductor can be provided. According to one embodiment of the present invention, an electronic device including a module that includes a semiconductor device using an oxide as a semiconductor can be provided. According to one embodiment of the present invention, a novel semiconductor device, a novel display device, a novel module, a novel electronic device or the like can be provided.

According to another embodiment of the present invention, a transistor that is resistant to heat generated from itself and a semiconductor device using the transistor can be provided. According to another embodiment of the present invention, a transistor that is unlikely to depend on the ambient temperature and a semiconductor device using the transistor can be provided. According to another embodiment of the present invention, a transistor that can withstand high current and high voltage and a semiconductor device using the transistor can be provided. According to another embodiment of the present invention, a transistor having favorable electrical characteristics and a semiconductor device using the transistor can be provided. According to another embodiment of the present invention, a transistor having stable electrical characteristics and a semiconductor device using the transistor can be provided. Another object of one embodiment of the present invention is to provide a transistor having low off-state current and a semiconductor device using the transistor can be provided.

According to another embodiment of the present invention, a method of testing oxygen vacancies in the oxide semiconductor used in the transistor can be provided. According to another embodiment of the present invention, a method of quantitatively testing the amount of oxygen in an oxide semiconductor, an insulator, and a conductor that are included in the transistor can be provided.

Note that the effects of one embodiment of the present invention are not limited to the above effects. The effects described above do not disturb the existence of other effects. The other effects are ones that are not described above and will be described below. The other effects will be apparent from and can be derived from the description of the specification, the drawings, and the like by those skilled in the art. One embodiment of the present invention has at least one of the above effects and/or the other effects. Accordingly, one embodiment of the present invention does not have the aforementioned effects in some cases.

BRIEF DESCRIPTION OF THE DRAWINGS

In the accompanying drawings:

FIGS. 2A to 2D are Cs-corrected high-resolution TEM images of a plane of a CAAC-OS;

FIG. 11 is a ternary diagram showing the composition of an In-M-Zn oxide;

FIG. 20 shows film densities of oxide semiconductors;

FIGS. 52A to 52C illustrate calculation conditions of a transistor;

DETAILED DESCRIPTION OF THE INVENTION

Figure 1A:
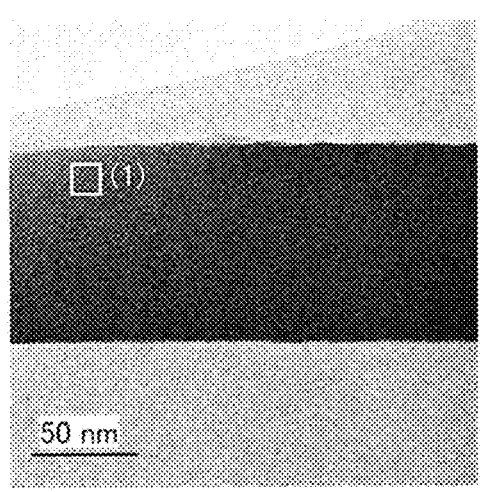
FIGS. 1A to 1D are Cs-corrected high-resolution TEM images of a cross section of a CAAC-OS and a cross-sectional schematic view of the CAAC-OS.

Hereinafter, embodiment of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

In this specification and the like, ordinal numbers such as "first", "second", and "third" are used in order to avoid confusion among components. Thus, the terms do not limit the number or order of components. For example, in the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals in some cases, and the description thereof is not repeated in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Furthermore, when the semiconductor layer is silicon, examples of an impurity which changes the characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

<Structure of Oxide Semiconductor>

First, a structure of an oxide semiconductor is described with reference to FIGS. 1A to 1D, FIGS. 2A to 2D, FIGS. 3A to 3C, FIGS. 4A and 4B, and FIG. 5.

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

The CAAC-OS observed with a TEM is described below. FIG. 1A shows a high-resolution TEM image of a cross section of the CAAC-OS which is observed from a direction substantially parallel to the specimen surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 1B:
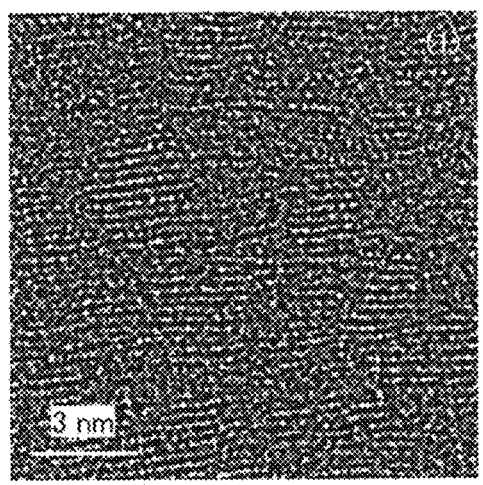

FIG. 1B is an enlarged Cs-corrected high-resolution TEM image of a region (1) in FIG. 1A. FIG. 1B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 1C:
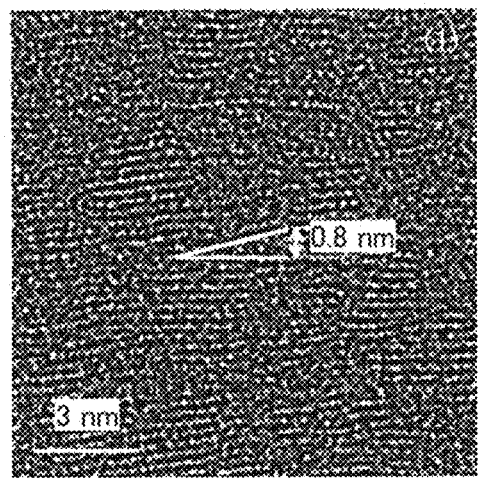

As shown in FIG. 1B, the CAAC-OS has a characteristic atomic arrangement. The characteristic atomic arrangement is denoted by an auxiliary line in FIG. 1C. FIGS. 1B and 1C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 1D:
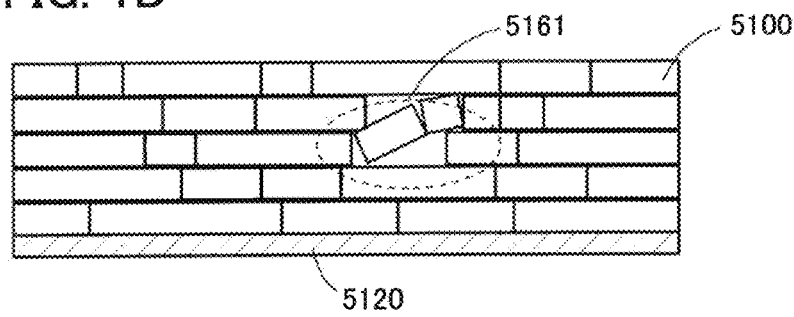

Here, according to the Cs-corrected high-resolution TEM images, the schematic arrangement of pellets 5100 of a CAAC-OS over a substrate 5120 is illustrated by such a structure in which bricks or blocks are stacked (see FIG. 1D). The part in which the pellets are tilted as observed in FIG. 1C corresponds to a region 5161 shown in FIG. 1D.

FIG. 2A shows a Cs-corrected high-resolution TEM image of a plane of the CAAC-OS observed from a direction substantially perpendicular to the specimen surface. FIGS. 2B, 2C, and 2D are enlarged Cs-corrected high-resolution TEM images of regions (1), (2), and (3) in FIG. 2A, respectively. FIGS. 2B, 2C, and 2D indicate that metal atoms are arranged in a triangular, quadrangular, or hexagonal configuration in a pellet. However, there is no regularity of arrangement of metal atoms between different pellets.

Figure 3A:
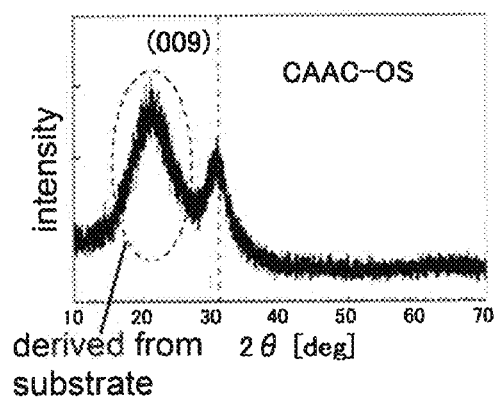
FIGS. 3A to 3C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 3A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 3B:
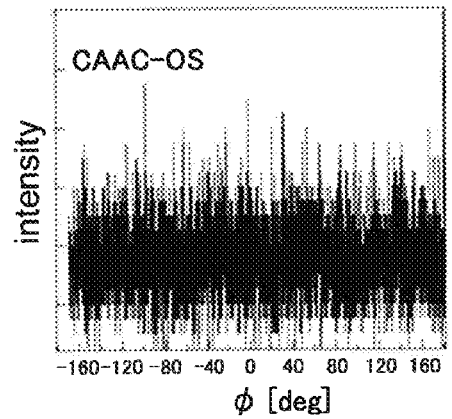
Figure 3C:
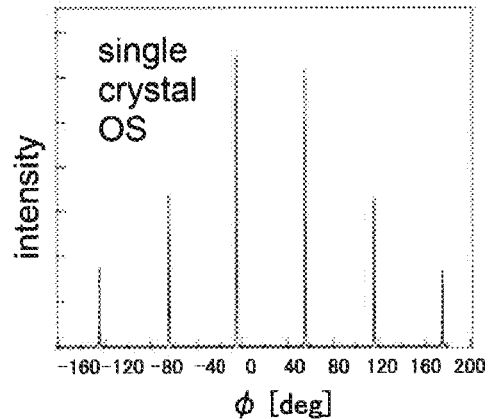

On the other hand, in structural analysis of the CAAC-OS by an in-plane method in which an X-ray is incident on a specimen in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the specimen rotated using a normal vector of the specimen surface as an axis (φ axis), as shown in FIG. 3B, a peak is not clearly observed. In contrast, in the case of a single crystal oxide semiconductor of InGaZnO$_4$, when φ scan is performed with 2θ fixed at around 56°, as shown in FIG. 3C, six peaks which are derived from crystal planes equivalent to the (110) plane are observed. Accordingly, the structural analysis using XRD shows that the directions of a-axes and b-axes are irregularly oriented in the CAAC-OS.

Figure 4A:
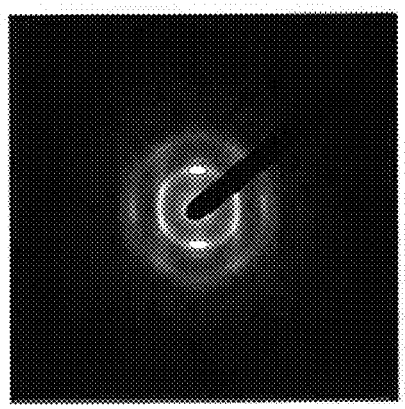
FIGS. 4A and 4B show electron diffraction patterns of a CAAC-OS.
Figure 4B:
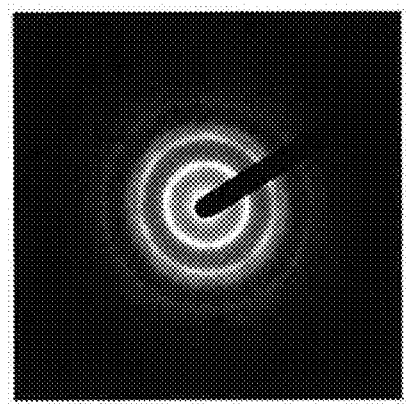

Next, a CAAC-OS analyzed by electron diffraction is described. For example, when an electron beam with a probe diameter of 300 nm is incident on a CAAC-OS including an InGaZnO$_4$ crystal in a direction parallel to the specimen surface, a diffraction pattern (also referred to as a selected-area transmission electron diffraction pattern) shown in FIG. 4A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 4B shows a diffraction pattern obtained in such a manner that an electron beam with a probe diameter of 300 nm is incident on the same specimen in a direction perpendicular to the specimen surface. As shown in FIG. 4B, a ring-like diffraction pattern is observed. Thus, the electron diffraction also indicates that the a-axes and b-axes of the pellets included in the CAAC-OS do not have regular alignment. The first ring in FIG. 4B is considered to be derived from the (010) plane, the (100) plane, and the like of the InGaZnO$_4$ crystal. The second ring in FIG. 4B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$).

Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as a specimen A), an nc-OS (referred to as a specimen B), and a CAAC-OS (referred to as a specimen C) are prepared as specimens subjected to electron irradiation. Each of the specimens is an In—Ga—Zn oxide.

First, a high-resolution cross-sectional TEM image of each specimen is obtained. The high-resolution cross-sectional TEM images show that all the specimens have crystal parts.

Note that which part is regarded as a crystal part is determined as follows. It is known that a unit cell of the InGaZnO$_4$ crystal has a structure in which nine layers including three In—O layers and six Ga—Zn—O layers are layered in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 5:
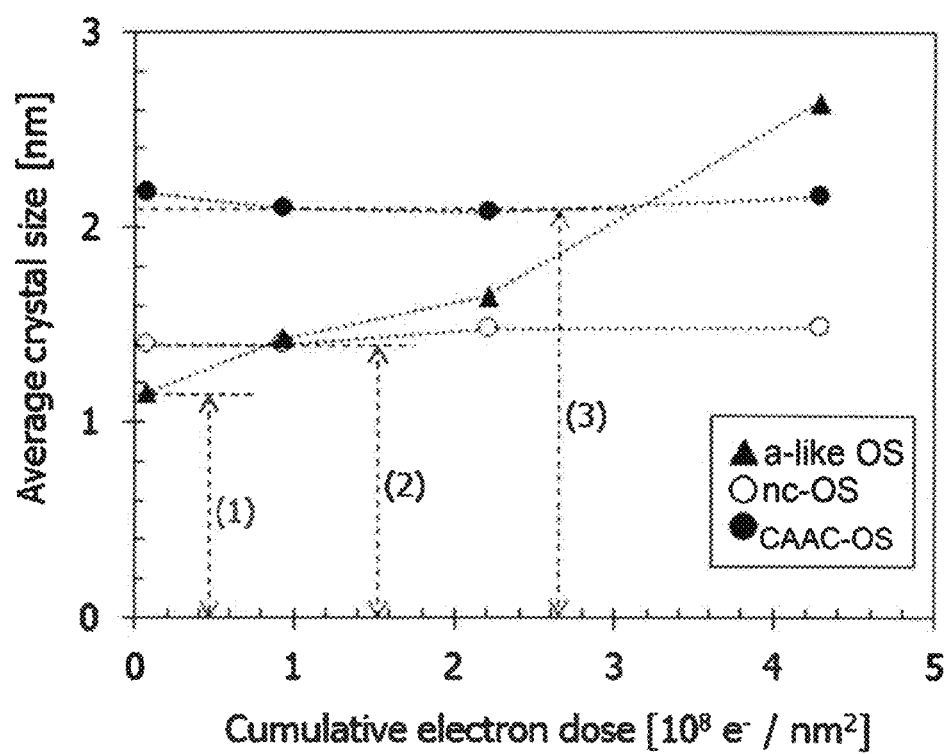
FIG. 5 shows a change in crystal parts of In—Ga—Zn oxide by electron irradiation.

FIG. 5 shows change in the average size of crystal parts (at 22 points to 45 points) in each specimen. Note that the crystal part size corresponds to the length of a lattice fringe. FIG. 5 indicates that the crystal part size in the a-like OS increases with an increase in the cumulative electron dose. Specifically, as shown by (1) in FIG. 5, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 5, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 2

<Deposition Method>

In this example, an example of a method of depositing a CAAC-OS film is described as an example of a method of depositing an oxide according to one embodiment of the disclosed invention with reference to FIGS. 6A to 6D, FIG. 7, FIGS. 8A to 8E, FIGS. 9A to 9C, and FIG. 10.

Figure 6A:
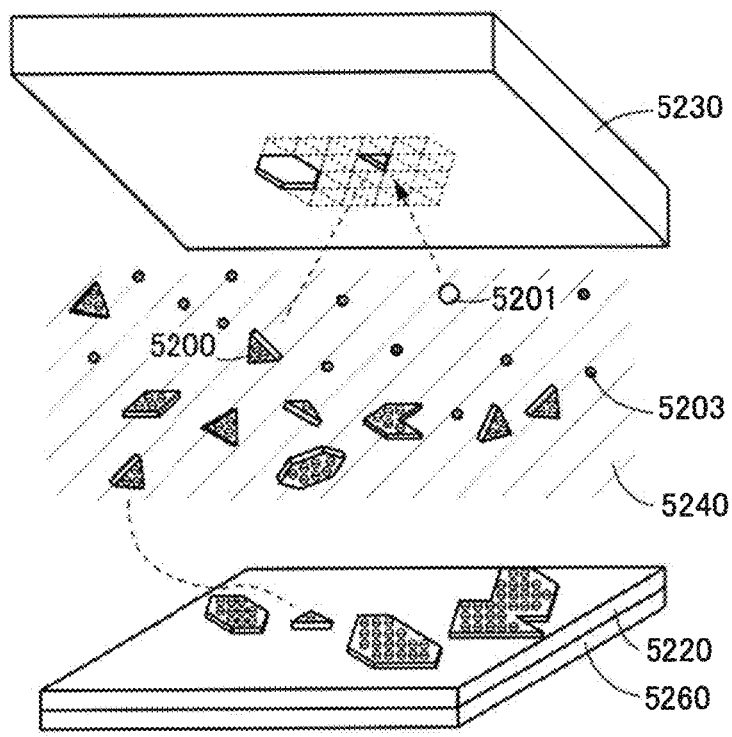
FIGS. 6A to 6D illustrate an example of a deposition method of a CAAC-OS.

FIG. 6A is a schematic view of the inside of a deposition chamber. The CAAC-OS can be deposited by a sputtering method.

As shown in FIG. 6A, a substrate 5220 and a target 5230 are arranged to face each other. Plasma 5240 is generated between the substrate 5220 and the target 5230. A heating mechanism 5260 is under the substrate 5220. The target 5230 is attached to a backing plate although not shown in the drawing. A plurality of magnets is arranged to face the target 5230 with the backing plate positioned therebetween. A sputtering method in which the disposition speed is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or more) and controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and plasma 5240 is observed. Note that the magnetic field in the vicinity of the target 5230 forms a high-density plasma region. In the high-density plasma region, the deposition gas is ionized, so that an ion 5201 is generated. Examples of the ion 5201 include an oxygen cation (O$^+$) and an argon cation (Ar$^+$).

Figure 7:
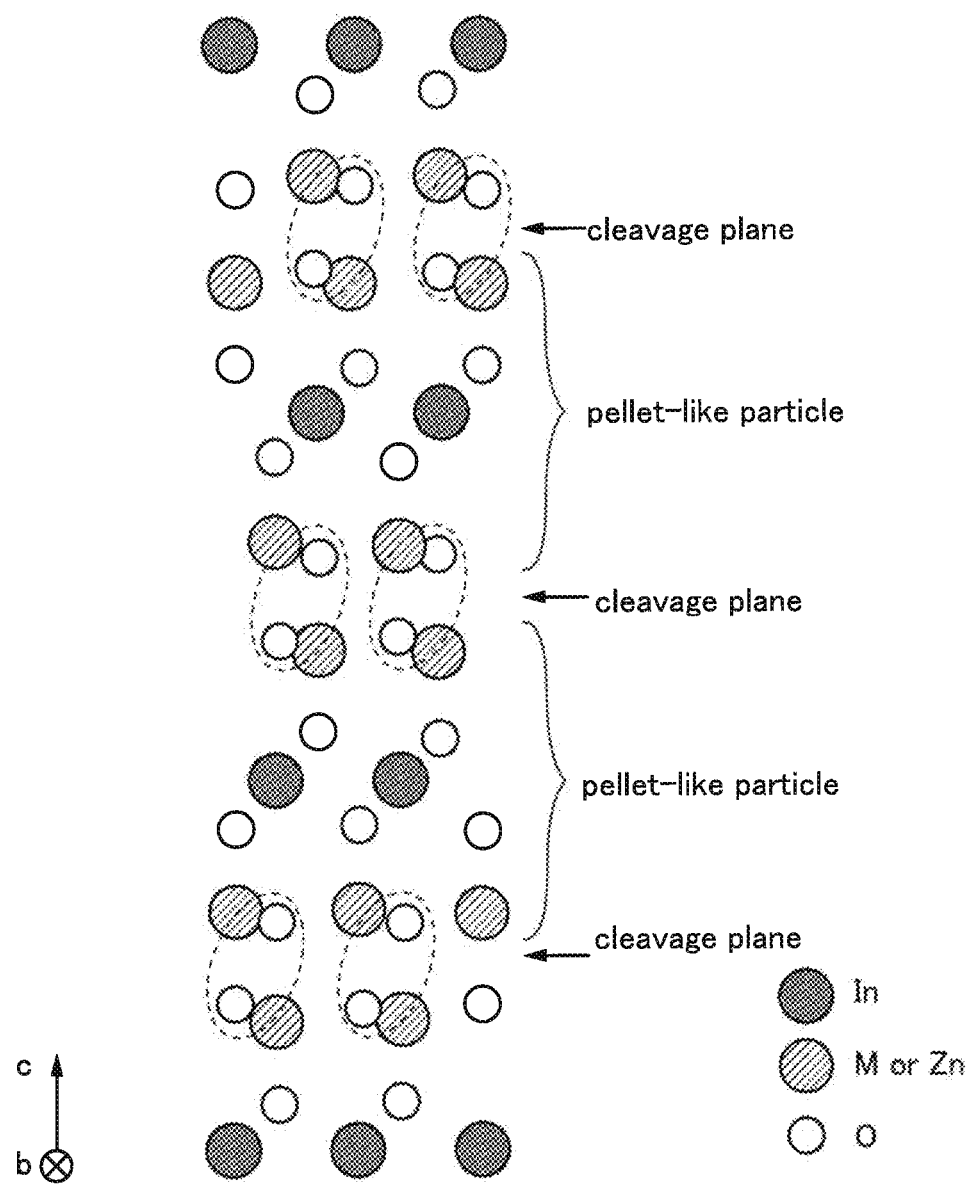
FIG. 7 illustrates an InMZnO4 crystal.

The target 5230 has a polycrystalline structure which includes a plurality of crystal grains and in which a cleavage plane exists in any of the crystal grains. FIG. 7 shows a crystal structure of InMZnO$_4$ (M is an element such as aluminum, gallium, yttrium, or tin) included in the target 5230 as an example. Note that the crystal structure shown in FIG. 7 is InMZnO$_4$ observed from a direction parallel to a b-axis. In the crystal of InMZnO$_4$, oxygen atoms are negatively charged, whereby repulsive force is generated between the two adjacent M-Zn—O layers. Thus, the InMZnO$_4$ crystal has a cleavage plane between the two adjacent M-Zn—O layers.

Figure 6B:
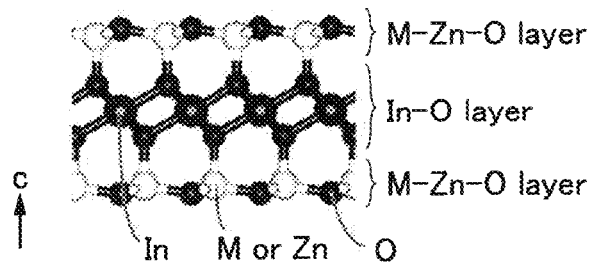
Figure 6C:
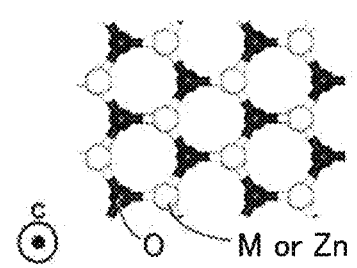

The ion 5201 generated in the high-density plasma region is accelerated to move toward the target 5230 side by an electric field, and then collides with the target 5230. At this time, a pellet 5200 which is a flat-plate-like or pellet-like sputtered particle is separated from the cleavage plane (see FIG. 6A). The pellet 5200 corresponds to a portion between the two cleavage planes shown in FIG. 7. Thus, when the pellet 5200 is observed, the cross-section thereof is as shown in FIG. 6B, and the top surface thereof is as shown in FIG. 6C. Note that structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of deposition gas and the like. For example, the thickness of the pellet 5200 is greater than or equal to 0.4 nm and less than or equal to 1 nm, preferably greater than or equal to 0.6 nm and less than or equal to 0.8 nm. In addition, the width of the pellet 5200 is, for example, greater than or equal to 1 nm and less than or equal to 3 nm, preferably greater than or equal to 1.2 nm and less than or equal to 2.5 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 may receive a charge when passing through the plasma 5240, so that surfaces thereof are negatively or positively charged. For example, the pellet 5200 receives a negative charge from O$^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach the surface of the substrate 5220. Note that part of the particle 5203 is discharged to the outside by a vacuum pump or the like because the particle 5203 is small in mass.

Figure 8A:
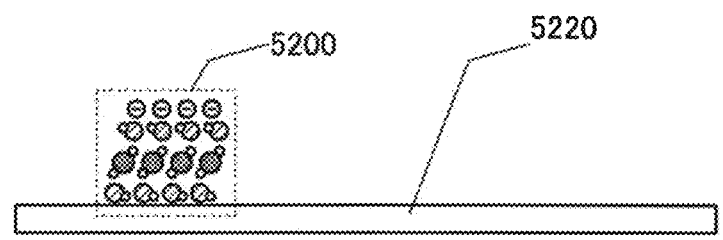
FIGS. 8A to 8E illustrate an example of a deposition method of a CAAC-OS.
Figure 8B:
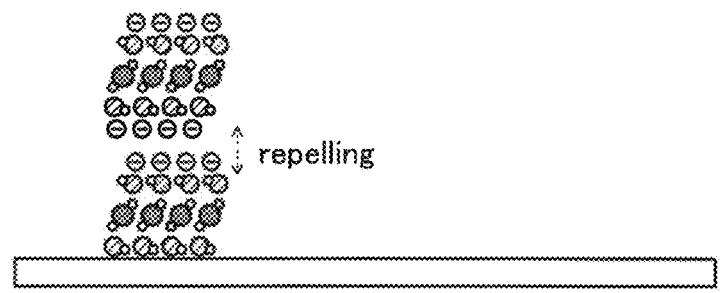

Next, deposition of the pellet 5200 and the particle 5203 over the surface of the substrate 5220 is described with reference to FIGS. 8A to 8C.

First, a first of the pellets 5200 is deposited over the substrate 5220. Since the pellet 5200 has a flat-plate-like shape, it is deposited so that the flat plane faces the surface of the substrate 5220 (FIG. 8A). Here, a charge on a surface of the pellet 5200 on the substrate 5220 side is lost through the substrate 5220.

Next, a second of the pellets 5200 reaches the substrate 5220. Here, since the surface of the first of the pellets 5200 and the surface of the second of the pellets 5200 are charged, they repel each other (FIG. 8B).

Figure 8C:
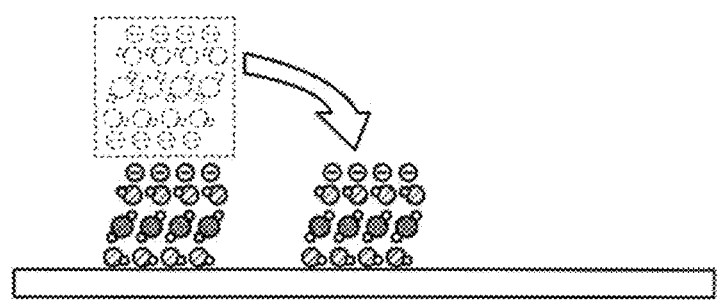

As a result, the second of the pellets 5200 avoids being deposited over the first of the pellets 5200, and is deposited over the surface of the substrate 5220 so as to be a little distance away from the first of the pellets 5200 (FIG. 8C). With repetition of this, millions of the pellets 5200 are deposited over the surface of the substrate 5220 to have a thickness of one layer. A region where any pellet 5200 is not deposited is generated between adjacent pellets 5200.

Figure 8D:
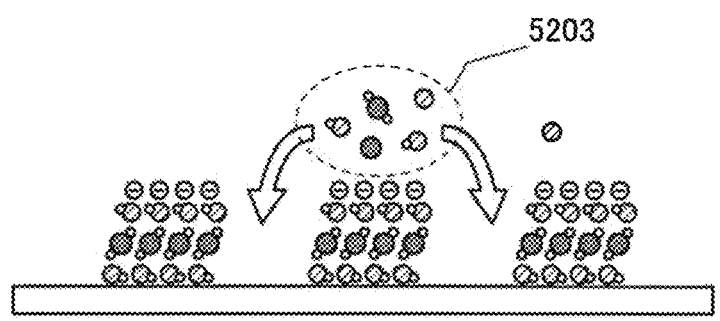

Next, the particle 5203 reaches the surface of the substrate 5220 (FIG. 8D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of an atomic layer deposition (ALD) method.

Figure 8E:
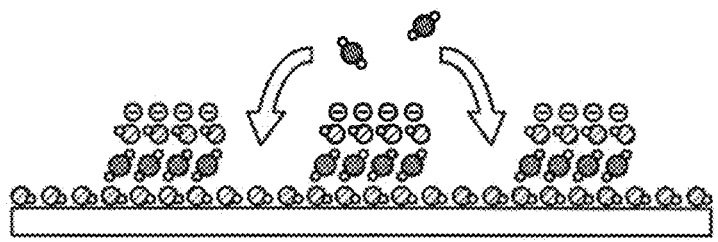

Note that there can be several mechanisms for the lateral growth of the particles 5203 between the pellets 5200. For example, as shown in FIG. 8E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 9A:
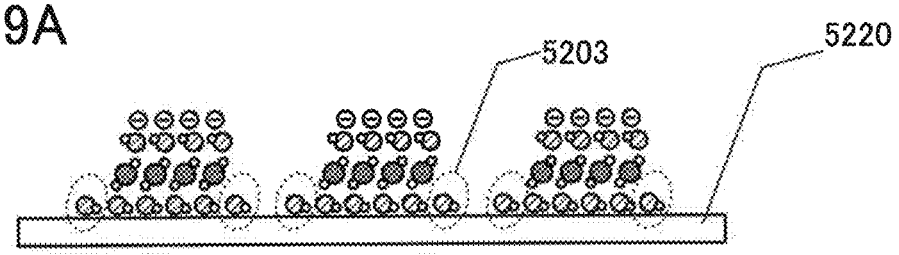
FIGS. 9A to 9C illustrate an example of a deposition method of a CAAC-OS.
Figure 9B:
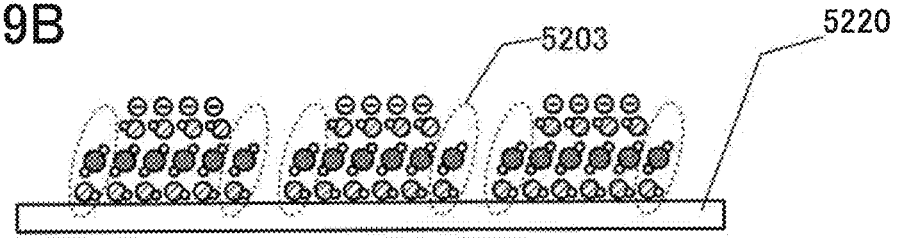
Figure 9C:
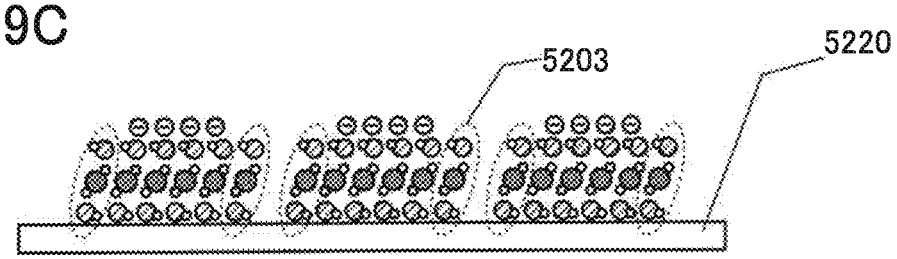
Figure 10:
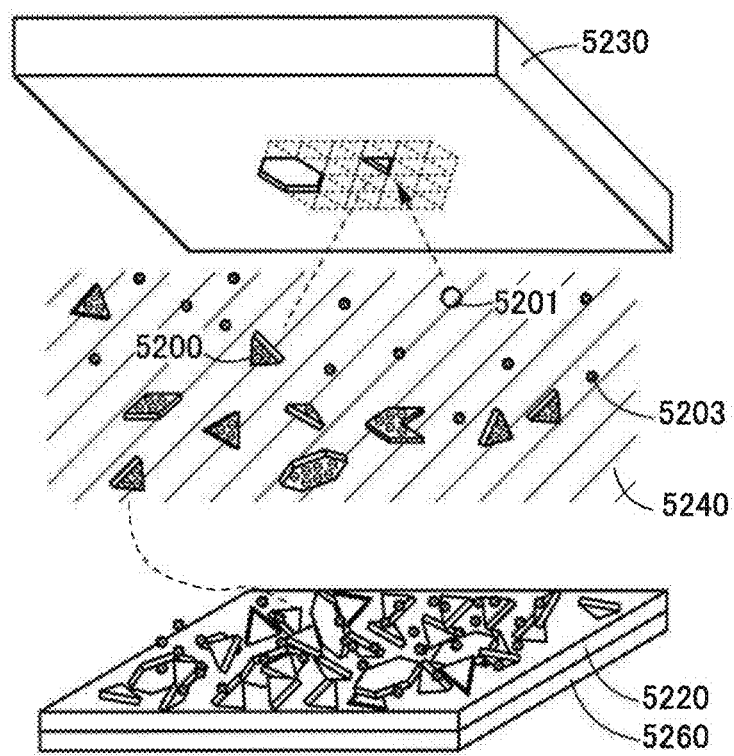
FIG. 10 illustrates an example of a deposition method of an nc-OS.

Alternatively, as shown in FIG. 9A, first, the particles 5203 are connected to the sides of the first M-Zn—O layers so that each side of the first M-Zn—O layer has one particle 5203. Then, as shown in FIG. 9B, the particle 5203 is connected to each side of the In—O layers. After that, as shown in FIG. 9C, the particle 5203 is connected to each side of the second M-Zn—O layers (the second mechanism). Note that the connection can also be made by the simultaneous occurrence of the deposition in FIGS. 9A, 9B, and 9C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions, and thus, it will be not appropriate to say that the regions have an amorphous structure.

Figure 6D:
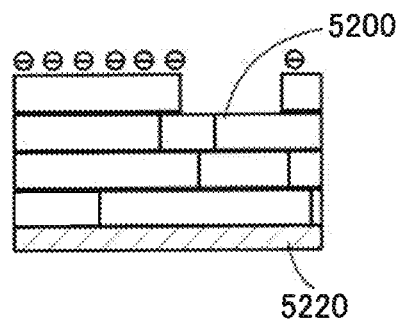

When the particles 5203 completely fill the regions between the pellets 5200, a first layer with a thickness almost the same as that of the pellet 5200 is formed. Then, a new first of the pellets 5200 is deposited over the first layer, and a second layer is formed. With repetition of this cycle, the stacked-layer thin film structure is formed (FIG. 6D).

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for the deposition of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 5220, a warp or the like hardly occurs.

On the other hand, if the surface temperature of the substrate 5220 is low, the migration of the pellets 5200 over the substrate 5220 does not easily occur. As a result, the pellets 5200 overlap with each other, whereby a nanocrystalline oxide semiconductor (nc-OS) with low orientation or the like is made (see FIG. 10). In the nc-OS, the pellets 5200 are deposited with certain gaps because the pellets 5200 are negatively charged. Therefore, the nc-OS film has low orientation but some regularity, and thus it has a denser structure than an amorphous oxide semiconductor.

When gaps between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the surface of the substrate 5220. Thus, a CAAC-OS can be deposited even when a formation surface does not have a crystal structure; therefore, a growth mechanism in this case is different from epitaxial growth. In addition, uniform deposition of a CAAC-OS or an nc-OS can be performed even over a large-sized glass substrate or the like. For example, even when the surface of the substrate 5220 (formation surface) has an amorphous structure (e.g., such as amorphous silicon oxide), a CAAC-OS can be deposited.

Furthermore, it is found that the pellets 5200 are arranged in accordance with a surface shape of the substrate 5220 that is the deposition surface even when the deposition surface has unevenness.

Embodiment 3

<Transistors>

In this embodiment, transistors according to one embodiment of the disclosed invention are described with reference to FIG. 11, FIGS. 12A and 12B, FIGS. 13A and 13B, FIGS. 14A and 14B, and FIGS. 15A and 15B.

Transistors according to one embodiment of the present invention each preferably include the above-described nc-OS or CAAC-OS.

<Transistor Structure 1>

Figure 12A:
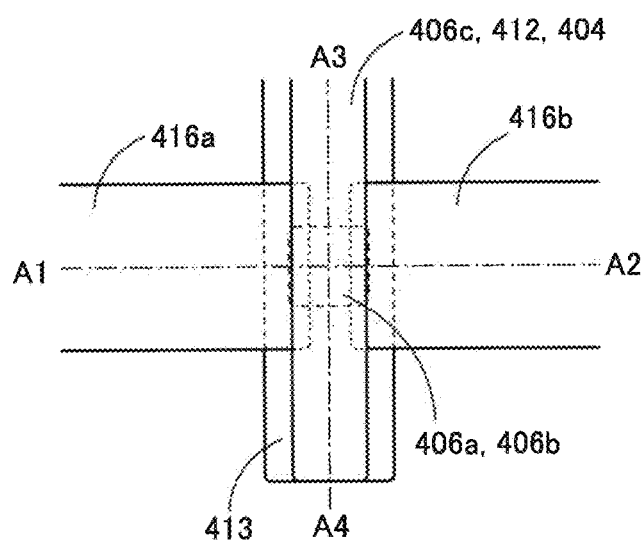
FIGS. 12A and 12B are a top view and a cross-sectional view illustrating a structural example of a transistor.
Figure 12B:
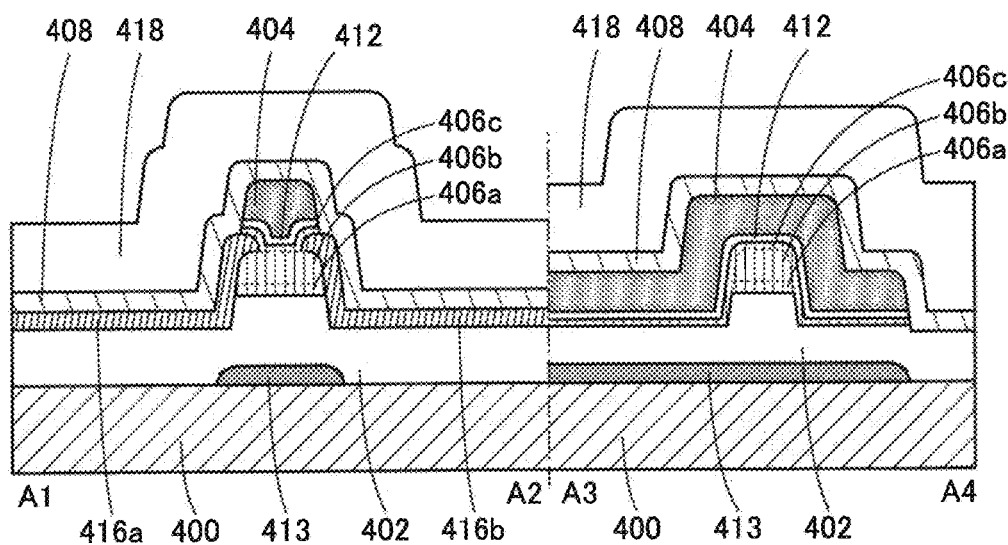

FIGS. 12A and 12B are a top view and a cross-sectional view which illustrate a transistor of one embodiment of the present invention. FIG. 12A is a top view and FIG. 12B is a cross-sectional view taken along dashed-dotted line A1-A2 and dashed-dotted line A3-A4 in FIG. 12A. Note that for simplification of the drawing, some components are not illustrated in the top view in FIG. 12A.

The transistor in FIGS. 12A and 12B includes a conductor 413 over a substrate 400, an insulator 402 having a projection over the substrate 400 and the conductor 413, an insulator 406a over the projection of the insulator 402, a semiconductor 406b over the insulator 406a, a conductor 416a and a conductor 416b which are in contact with a top surface and a side surface of the semiconductor 406b and which are arranged to be separated from each other, an insulator 406c over the semiconductor 406b, the conductor 416a, and the conductor 416b, an insulator 412 over the insulator 406c, a conductor 404 over the insulator 412, an insulator 408 over the conductor 416a, the conductor 416b, and the conductor 404, and an insulator 418 over the insulator 408. Although the conductor 413 is part of the transistor here, a transistor structure of one embodiment of the present invention is not limited thereto. For example, the conductor 413 may be a component independent of the transistor.

Note that the insulator 406c is in contact with at least a top surface and a side surface of the semiconductor 406b in the cross section taken along line A3-A4. Furthermore, the conductor 404 faces the top surface and the side surface of the semiconductor 406b with the insulator 406c and the insulator 412 provided therebetween in the cross section taken along line A3-A4. The conductor 413 faces a bottom surface of the semiconductor 406b with the insulator 402 provided therebetween. The insulator 402 does not necessarily include a projection. The insulator 406c, the insulator 408, and/or the insulator 418 is not necessarily provided.

The semiconductor 406b serves as a channel formation region of the transistor. The conductor 404 serves as a first gate electrode (also referred to as a front gate electrode) of the transistor. The conductor 413 serves as a second gate electrode (also referred to as a back gate electrode) of the transistor. The conductor 416a and the conductor 416b serve as a source electrode and a drain electrode of the transistor. The insulator 408 functions as a barrier layer. The insulator 408 has, for example, a function of blocking oxygen and/or hydrogen. Alternatively, the insulator 408 has, for example, a higher capability of blocking oxygen and/or hydrogen than the insulator 406a and/or the insulator 406c.

Note that the insulator 406a or the insulator 406c is categorized as a semiconductor in some cases depending on which of the materials described later is used and the ratio between the materials. Since the semiconductor 406b serves as a channel formation region of the transistor as described above, carriers do not move in the insulator 406a and the insulator 406c in some cases. Thus, even when the insulator 406a or the insulator 406c has semiconductor properties, it is referred to as an insulator in this embodiment.

The insulator 402 is preferably an insulator containing excess oxygen.

The insulator containing excess oxygen means an insulator from which oxygen is released by heat treatment, for example. The silicon oxide layer containing excess oxygen means a silicon oxide layer which can release oxygen by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the insulator 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such an oxygen vacancy and forms an electron serving as a carrier. Therefore, by reducing the oxygen vacancies in the semiconductor 406b, the transistor can have stable electrical characteristics.

Here, an insulator from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectroscopy (TDS) analysis in the range of a surface temperature of 100° C. to 700° C. or 100° C. to 500° C.

Here, the method of measuring the amount of released oxygen using TDS analysis is described below.

The total amount of released gas from a measurement specimen in TDS analysis is proportional to the integral value of the ion intensity of the released gas. Then, comparison with a reference specimen is made, whereby the total amount of released gas can be calculated.

For example, the number of released oxygen molecules ($N_{O2}$) from a measurement specimen can be calculated according to the following formula using the TDS results of a silicon substrate containing hydrogen at a predetermined density, which is a reference specimen, and the TDS results of the measurement specimen. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the amount of hydrogen molecules desorbed from the standard specimen into densities. The value $S_{H2}$ is the integral value of ion intensity in the case where the standard specimen is subjected to the TDS analysis. Here, the reference value of the standard specimen is set to $N_{H2}/S_{H2}$. $S_{O2}$ is the integral value of ion intensity when the measurement specimen is analyzed by TDS. The value α is a coefficient affecting the ion intensity in the TDS analysis. Refer to Patent Document 5 for details of the above formula. The amount of released oxygen was measured with a thermal desorption spectroscopy apparatus produced by ESCO Ltd., EMD-WA1000S/W using a silicon substrate containing hydrogen atoms at $1 \times 10^{16}$ atoms/cm$^2$ as the reference specimen.

Furthermore, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The insulator containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

As illustrated in FIG. 12B, the side surfaces of the semiconductor 406b are in contact with the conductor 416a and the conductor 416b. The semiconductor 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406b (bulk) in some cases. In the s-channel structure, a large amount of current can flow between a source electrode and a drain electrode of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Furthermore, by applying a lower voltage or a higher voltage than a source electrode to the conductor 413, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 413 may be a variable or a fixed voltage. When the voltage applied to the conductor 413 is a variable, a circuit for controlling the voltage may be electrically connected to the conductor 413.

Next, a semiconductor and an insulator which can be used as the insulator 406a, the semiconductor 406b, the insulator 406c, or the like is described below.

The semiconductor 406b is an oxide semiconductor containing indium, for example. An oxide semiconductor can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the insulator 406a and the insulator 406c include one or more elements other than oxygen included in the semiconductor 406b. Since the insulator 406a and the insulator 406c each include one or more elements other than oxygen included in the semiconductor 406b, an interface state is less likely to be formed at the interface between the insulator 406a and the semiconductor 406b and the interface between the semiconductor 406b and the insulator 406c.

The insulator 406a, the semiconductor 406b, and the insulator 406c preferably include at least indium. In the case of using an In-M-Zn oxide as the insulator 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 406c may be an oxide that is a type the same as that of the insulator 406a. Note that the insulator 406a and/or the insulator 406c do/does not necessarily contain indium in some cases. For example, the insulator 406a and/or the insulator 406c may be gallium oxide.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the insulator 406c preferably includes an indium gallium oxide. The gallium atomic ratio [Ga/(In+Ga)] is, for example, higher than or equal to 70%, preferably higher than or equal to 80%, further preferably higher than or equal to 90%.

Note that the composition of the insulator 406a is preferably in the neighborhood of the composition represented by the bold line in FIG. 11. The composition of the semiconductor 406b is preferably in the neighborhood of the composition represented by the bold line in FIG. 11. The composition of the insulator 406c is preferably in the neighborhood of the composition represented by the bold line in FIG. 11. When these compositions are employed, the channel formation region of the transistor can have a single crystal structure. Alternatively, the channel formation region, the source region, and the drain region of the transistor can have a single crystal structure in some cases. When the channel formation region of the transistor has a single crystal structure, the transistor can have high frequency characteristics in some cases.

At this time, when a gate voltage is applied, a channel is formed in the semiconductor 406b having the highest electron affinity in the insulator 406a, the semiconductor 406b, and the insulator 406c.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of interface states. For that reason, the stack of the insulator 406a, the semiconductor 406b, and the insulator 406c has a band structure where energy at each interface and in the vicinity of the interface is changed continuously (continuous junction).

At this time, electrons move mainly in the semiconductor 406b, not in the insulator 406a and the insulator 406c. As described above, when the interface state density at the interface between the insulator 406a and the semiconductor 406b and the interface state density at the interface between the semiconductor 406b and the insulator 406c are decreased, electron movement in the semiconductor 406b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 µm×1 µm of a top surface or a bottom surface of the semiconductor 406b (a formation surface; here, the insulator 406a) is less than 1 nm, preferably less than 0.6 nm, further preferably less than 0.5 nm, still further preferably less than 0.4 nm. The average surface roughness (also referred to as Ra) with the measurement area of 1 µm×1 µm is less than 1 nm, preferably less than 0.6 nm, further preferably less than 0.5 nm, still further preferably less than 0.4 nm. The maximum difference (P–V) with the measurement area of 1 µm×1 µm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 406b contains oxygen vacancies ($V_O$), an elemental hydrogen, a hydrogen molecule, a hydrogen atom, or a hydrogen ion (also collectively referred to as hydrogen in this specification) might enter sites of the oxygen vacancies to form a donor level (hereinafter, hydrogen entering the sites of oxygen vacancies are also referred to as $V_OH$). Because $V_OH$ scatters electrons, it is a factor of decreasing the on-state current of the transistor. Note that the sites of oxygen vacancies become more stable by entry of oxygen than by entry of hydrogen. Thus, by decreasing oxygen vacancies in the semiconductor 406b, the on-state current of the transistor can be increased in some cases.

To decrease oxygen vacancies in the semiconductor 406b, for example, there is a method in which excess oxygen in the insulator 402 is moved to the semiconductor 406b through the insulator 406a. In this case, the insulator 406a is preferably a layer having an oxygen-transmitting property (a layer through which oxygen passes or is transmitted).

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness greater than or equal to 10 nm, preferably greater than or equal to 20 nm, more preferably greater than or equal to 40 nm, further preferably greater than or equal to 60 nm, still further preferably greater than or equal to 100 nm. Note that the semiconductor 406b has a region with a thickness, for example, less than or equal to 300 nm, preferably less than or equal to 200 nm, further preferably less than or equal to 150 nm because the productivity of the semiconductor device might be decreased. In some cases, when the channel formation region is reduced in size, the electrical characteristics of the transistor are improved. Therefore, the semiconductor 406b may have a thickness less than 10 nm.

Moreover, the thickness of the insulator 406c is preferably as small as possible to increase the on-state current of the transistor. The thickness of the insulator 406c is less than 10 nm, preferably less than or equal to 5 nm, more preferably less than or equal to 3 nm, for example. Meanwhile, the insulator 406c has a function of blocking entry of elements other than oxygen (such as hydrogen and silicon) included in the adjacent insulator into the semiconductor 406b where a channel is formed. For this reason, it is preferable that the insulator 406c have a certain thickness. The thickness of the insulator 406c is greater than or equal to 0.3 nm, preferably greater than or equal to 1 nm, further preferably greater than or equal to 2 nm, for example. The insulator 406c preferably has an oxygen blocking property to suppress outward diffusion of oxygen released from the insulator 402 and the like.

To improve reliability, preferably, the thickness of the insulator 406a is large and the thickness of the insulator 406c is small. For example, the insulator 406a has a region with a thickness, for example, greater than or equal to 10 nm, preferably greater than or equal to 20 nm, further preferably greater than or equal to 40 nm, still further preferably greater than or equal to 60 nm. When the thickness of the insulator 406a is made large, a distance from an interface between the adjacent insulator and the insulator 406a to the semiconductor 406b in which a channel is formed can be large. Since the productivity of the semiconductor device might be decreased, the insulator 406a has a region with a thickness, for example, less than or equal to 200 nm, preferably less than or equal to 120 nm, further preferably less than or equal to 80 nm.

For example, a region in which the concentration of silicon which is measured by secondary ion mass spectrometry (SIMS) is lower than $1 \times 10^{19}$ atoms/cm$^3$, preferably lower than $5\times10^{18}$ atoms/cm$^3$, or further preferably lower than $2\times10^{18}$ atoms/cm$^3$ is provided between the semiconductor 406b and the insulator 406a. A region with a silicon concentration lower than $1\times10^{19}$ atoms/cm$^3$, preferably lower than $5\times10^{18}$ atoms/cm$^3$, further preferably lower than $2\times10^{18}$ atoms/cm$^3$ which is measured by SIMS is provided between the semiconductor 406b and the insulator 406c.

It is preferable to reduce the concentration of hydrogen in the insulator 406a and the insulator 406c in order to reduce the concentration of hydrogen in the semiconductor 406b. The insulator 406a and the insulator 406c each have a region in which the concentration of hydrogen measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the insulator 406a and the insulator 406c in order to reduce the concentration of nitrogen in the semiconductor 406b. The insulator 406a and the insulator 406c each have a region in which the concentration of nitrogen measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The above three-layer structure is an example. For example, a two-layer structure without the insulator 406a or the insulator 406c may be employed. Alternatively, a four-layer structure in which any one of the semiconductors described as examples of the insulator 406a, the semiconductor 406b, and the insulator 406c is provided below or over the insulator 406a or below or over the insulator 406c may be employed. Alternatively, an n-layer structure (n is an integer of 5 or more) in which any one of the semiconductors described as examples of the insulator 406a, the semiconductor 406b, and the insulator 406c is provided at two or more of the following positions: over the insulator 406a, below the insulator 406a, over the insulator 406c, and below the insulator 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate containing silicon carbide, silicon germanium, gallium arsenide, indium phosphide, zinc oxide, or gallium oxide as a material is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method of providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 µm and less than or equal to 700 µm, preferably greater than or equal to 10 µm and less than or equal to 500 µm, or further preferably greater than or equal to 15 µm and less than or equal to 300 µm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400. In the case where the semiconductor 406b is an oxide semiconductor, the insulator 402 can have a function of supplying oxygen to the semiconductor 406b.

Each of the conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Due to the conductor 416a and the conductor 416b, a defect may be formed in the insulator 406a, the semiconductor 406b, or the insulator 406c in some cases. The defect makes the insulator 406a, the semiconductor 406b, or the insulator 406c an n-type semiconductor in some cases. As a result, ohmic contact is made between any of the insulator 406a, the semiconductor 406b, or the insulator 406c and the conductor 416a and the conductor 416b. For example, in the case where the defect formed in the insulator 406a, the semiconductor 406b, or the insulator 406c is reduced by dehydrogenation or supplying excess oxygen, a Schottky junction is made between any of the insulator 406a, the semiconductor 406b, or the insulator 406c and the conductor 416a and the conductor 416b.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 13A:
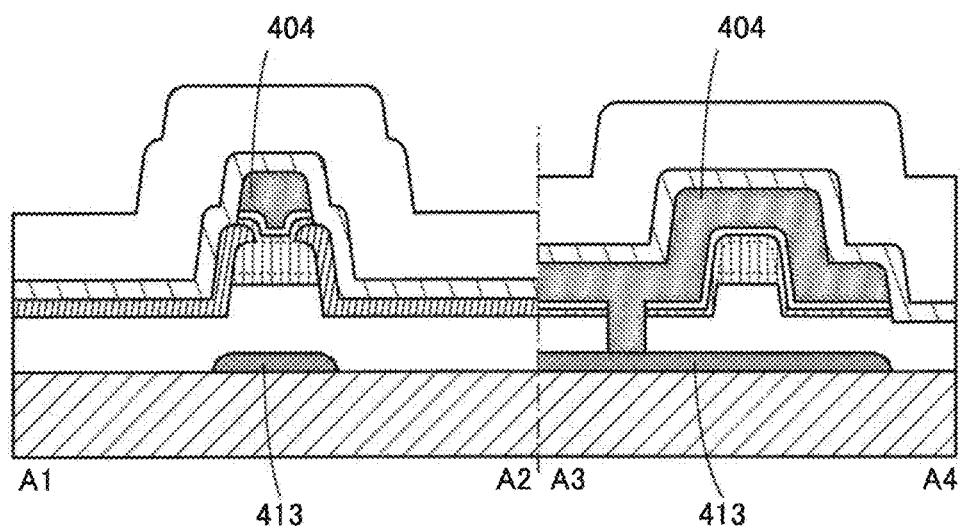
FIGS. 13A and 13B are cross-sectional views each illustrating a structural example of a transistor.
Figure 13B:
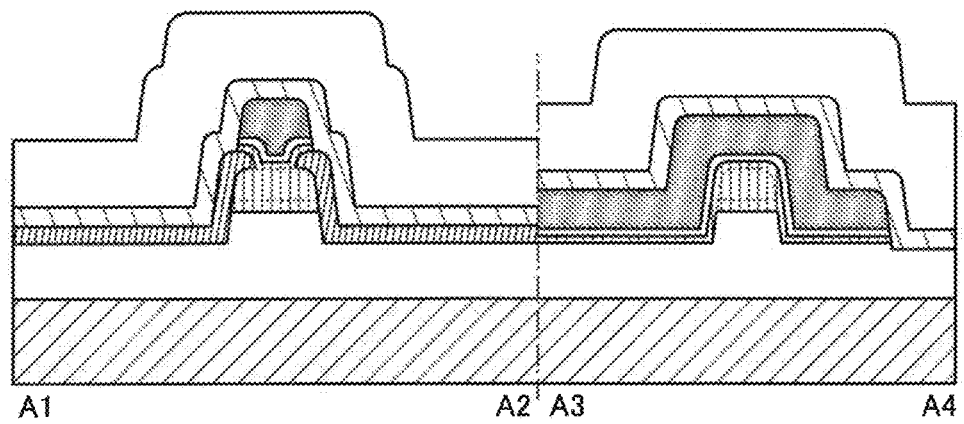

Although FIGS. 12A and 12B show an example where the conductor 404 which is a first gate electrode of a transistor is not electrically connected to the conductor 413 which is a second gate electrode, a transistor structure of one embodiment of the present invention is not limited thereto. For example, as illustrated in FIG. 13A, the conductor 404 may be electrically connected to the conductor 413. With such a structure, the conductor 404 and the conductor 413 are supplied with the same potential; thus, switching characteristics of the transistor can be improved. Alternatively, as illustrated in FIG. 13B, the conductor 413 is not necessarily provided.

Figure 14A:
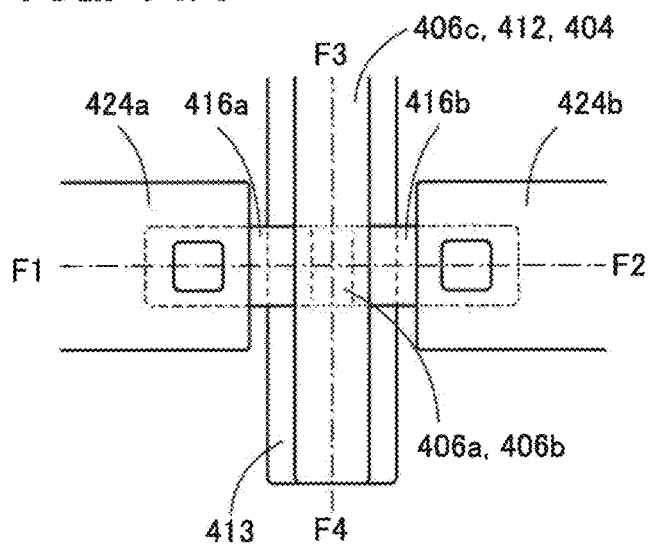
FIGS. 14A and 14B are a top view and a cross-sectional view illustrating a structural example of a transistor.
Figure 14B:
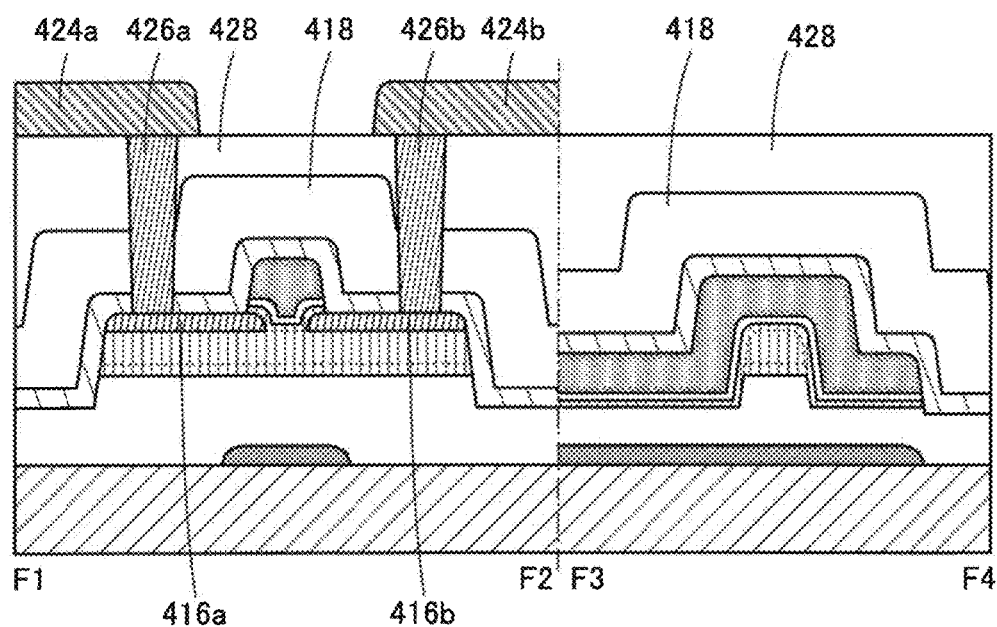

FIG. 14A is an example of a top view of a transistor. FIG. 14B is an example of a cross-sectional view taken along dashed-dotted line F1-F2 and dashed-dotted line F3-F4 in FIG. 14A. Note that some components such as an insulator are omitted in FIG. 14A for easy understanding.

Although FIGS. 12A and 12B and the like show an example where the conductor 416a and the conductor 416b which function as a source electrode and a drain electrode are in contact with a top surface and a side surface of the semiconductor 406b, a top surface of the insulator 402, and the like, a transistor structure of one embodiment of the present invention is not limited thereto. For example, as illustrated in FIGS. 14A and 14B, the conductor 416a and the conductor 416b may be in contact with only the top surface of the semiconductor 406b.

As illustrated in FIG. 14B, an insulator 428 may be provided over the insulator 418. The insulator 428 preferably has a flat top surface. The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulator 428, planarization treatment may be performed by a chemical mechanical polishing (CMP) method or the like.

A resin may be used as the insulator 428. For example, a resin containing polyimide, polyamide, acrylic, silicone, or the like may be used. The use of a resin does not need planarization treatment performed on the top surface of the insulator 428 in some cases. By using a resin, a thick film can be formed in a short time; thus, the productivity can be increased.

As illustrated in FIGS. 14A and 14B, a conductor 424a and a conductor 424b may be provided over the insulator 428. The conductor 424a and the conductor 424b may function as wirings, for example. The insulator 428 may include an opening and the conductor 416a and the conductor 424a may be electrically connected to each other through the opening. The insulator 428 may have another opening and the conductor 416b and the conductor 424b may be electrically connected to each other through the opening. In this case, the conductor 426a and the conductor 426b may be provided in the respective openings.

Each of the conductor 424a and the conductor 424b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIGS. 14A and 14B, the conductor 416a and the conductor 416b are not in contact with side surfaces of the semiconductor 406b. Thus, an electric field applied from the conductor 404 functioning as a first gate electrode to the side surfaces of the semiconductor 406b is less likely to be blocked by the conductor 416a and the conductor 416b. The conductor 416a and the conductor 416b are not in contact with a top surface of the insulator 402. Thus, excess oxygen (oxygen) released from the insulator 402 is not consumed to oxidize the conductor 416a and the conductor 416b. Accordingly, excess oxygen (oxygen) released from the insulator 402 can be efficiently used to reduce oxygen vacancies in the semiconductor 406b. In other words, the transistor having the structure illustrated in FIGS. 14A and 14B has excellent electrical characteristics such as a high on-state current, high field-effect mobility, a small subthreshold swing value, and high reliability.

Figure 15A:
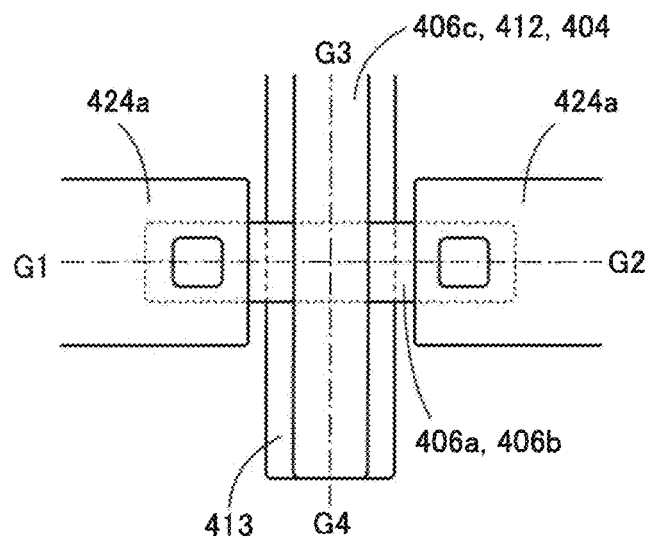
FIGS. 15A and 15B are a top view and a cross-sectional view illustrating a structural example of a transistor.
Figure 15B:
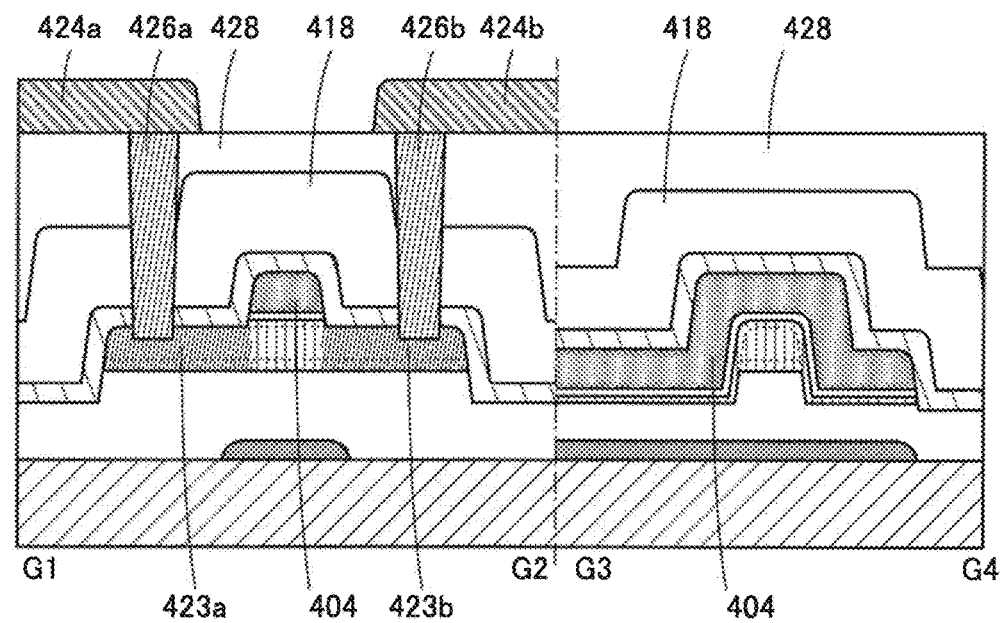

FIGS. 15A and 15B are a top view and a cross-sectional view which illustrate a transistor of one embodiment of the present invention. FIG. 15A is a top view and FIG. 15B is a cross-sectional view taken along dashed-dotted line G1-G2 and dashed-dotted line G3-G4 in FIG. 15A. Note that for simplification of the drawing, some components are not illustrated in the top view in FIG. 15A.

The transistor may have a structure in which, as illustrated in FIGS. 15A and 15B, the conductor 416a and the conductor 416b are not provided and the conductor 426a and the conductor 426b are in contact with the semiconductor 406b. In this case, a low-resistance region 423a (low-resistance region 423b) is preferably provided in a region in contact with at least the conductor 426a and the conductor 426b in the semiconductor 406b and/or the insulator 406a. The low-resistance region 423a and the low-resistance region 423b may be formed in such a manner that, for example, the conductor 404 and the like are used as masks and impurities are added to the semiconductor 406b and/or the insulator 406a. The conductor 426a and the conductor 426b may be provided in holes (portions which penetrate) or recessed portions (portions which do not penetrate) of the semiconductor 406b. When the conductor 426a and the conductor 426b are provided in holes or recessed portions of the semiconductor 406b, contact areas between the conductors 426a and 426b and the semiconductor 406b are increased; thus, the adverse effect of the contact resistance can be decreased. In other words, the on-state current of the transistor can be increased.

<Transistor Structure 2>

Figure 16A:
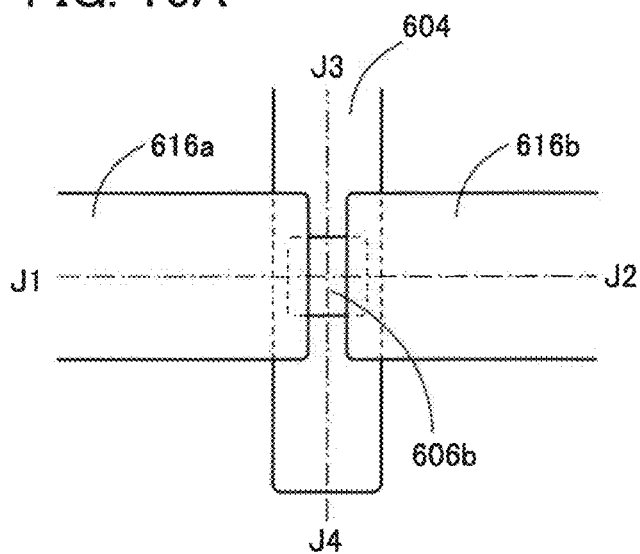
FIGS. 16A and 16B are a top view and a cross-sectional view illustrating a structural example of a transistor.
Figure 16B:
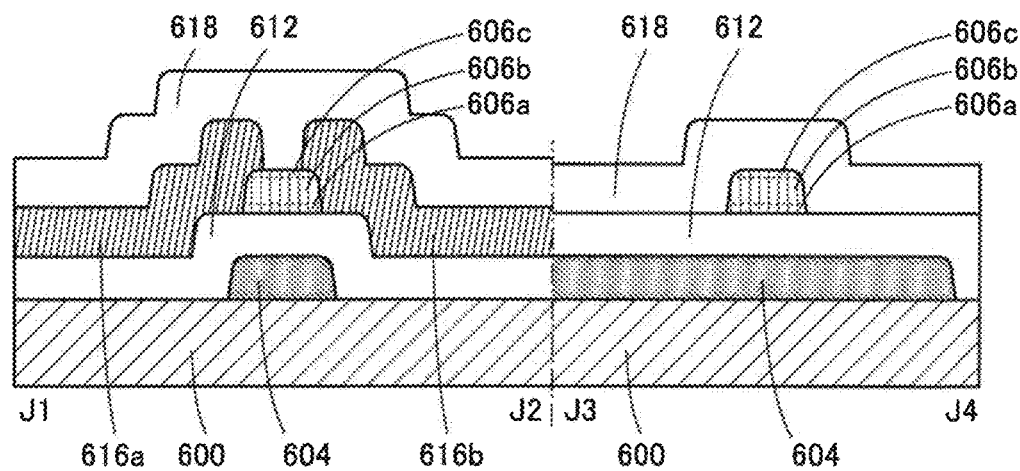

FIGS. 16A and 16B are a top view and a cross-sectional view of a transistor of one embodiment of the present invention. FIG. 16A is a top view and FIG. 16B is a cross-sectional view taken along dashed-dotted line J1-J2 and dashed-dotted line J3-J4 in FIG. 16A. Note that for simplification of the drawing, some components are not illustrated in the top view in FIG. 16A.

The transistor in FIGS. 16A and 16B includes a conductor 604 over a substrate 600, an insulator 612 over the conductor 604, an insulator 606a over the insulator 612, a semiconductor 606b over the insulator 606a, an insulator 606c over the semiconductor 606b, a conductor 616a and a conductor 616b which are in contact with the insulator 606a, the semiconductor 606b, and the insulator 606c and which are arranged to be apart from each other, and an insulator 618 over the insulator 606c, the conductor 616a, and the conductor 616b. The conductor 604 faces a bottom surface of the semiconductor 606b with the insulator 612 provided therebetween. The insulator 612 may have a projection. An insulator may be provided between the substrate 600 and the conductor 604. For the insulator, the description of the insulator 402 or the insulator 408 is referred to. The insulator 606a and/or the insulator 618 is not necessarily provided.

The semiconductor 606b serves as a channel formation region of the transistor. The conductor 604 serves as a first gate electrode (also referred to as a front gate electrode) of the transistor. The conductor 616a and the conductor 616b serve as a source electrode and a drain electrode of the transistor.

Note that the insulator 606a or the insulator 606c is categorized as a semiconductor in some cases depending on which of the materials described later is used and the ratio between the materials. Since the semiconductor 606b serves as a channel formation region of the transistor as described above, carriers do not move in the insulator 606a and the insulator 606c in some cases. Thus, even when the insulator 606a or the insulator 606c has semiconductor properties, it is referred to as an insulator in this embodiment.

The insulator 618 is preferably an insulator containing excess oxygen.

For the substrate 600, the description of the substrate 400 is referred to. For the conductor 604, the description of the conductor 404 is referred to. For the insulator 612, the description of the insulator 412 is referred to. For the insulator 606a, the description of the insulator 406c is referred to. For the semiconductor 606b, the description of the semiconductor 406b is referred to. For the insulator 606c, the description of the insulator 406a is referred to. For the conductor 616a and the conductor 616b, the description of the conductor 416a and the conductor 416b is referred to. For the insulator 618, the description of the insulator 402 is referred to.

Over the insulator 618, a display element may be provided. For example, a pixel electrode, a liquid crystal layer, a common electrode, a light-emitting layer, an organic EL layer, an anode electrode, a cathode electrode, or the like may be provided. The display element is connected to the conductor 616a or the like, for example.

Figure 17A:
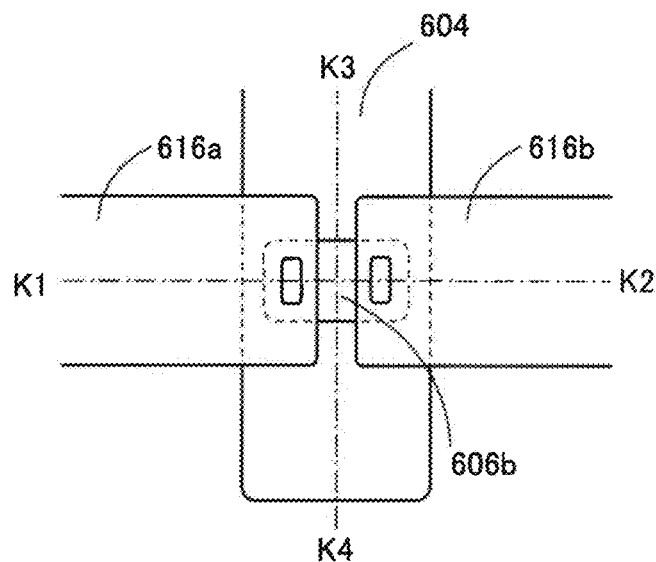
FIGS. 17A and 17B are a top view and a cross-sectional view illustrating a structural example of a transistor.
Figure 17B:
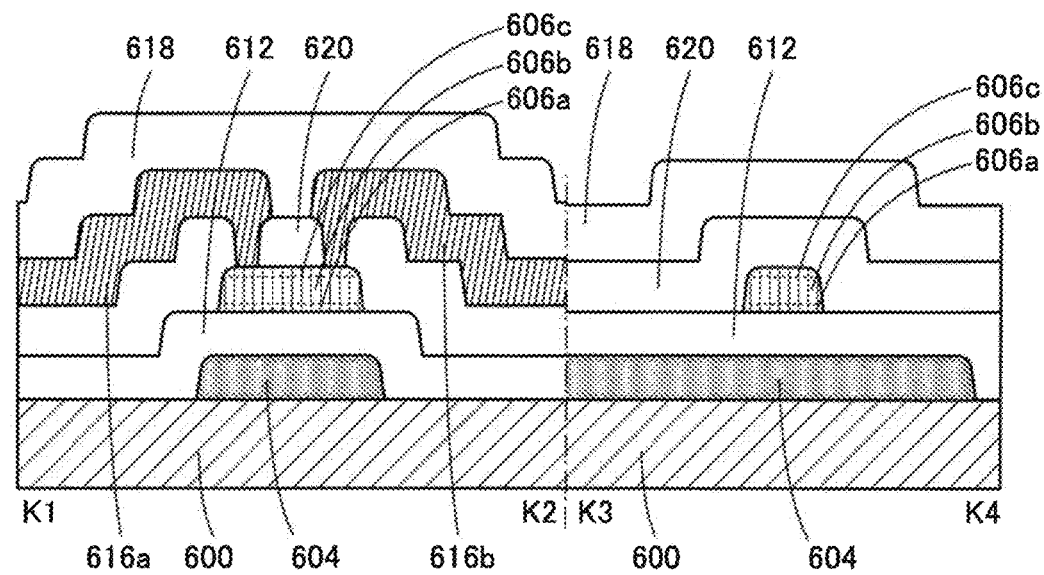

FIG. 17A is an example of a top view of a transistor. FIG. 17B is an example of a cross-sectional view taken along dashed-dotted line K1-K2 and dashed-dotted line K3-K4 in FIG. 17A. Note that some components such as an insulator are omitted in FIG. 17A for easy understanding.

Over the insulator 606c, an insulator that can function as a channel protective film may be provided. For example, as illustrated in FIGS. 17A and 17B, an insulator 620 may be provided between the insulator 606c and the conductors 616a and 616b. In that case, the conductor 616a (conductor 616b) and the insulator 606c are connected to each other through an opening in the insulator 620. For the insulator 620, the description of the insulator 618 may be referred to.

Figure 18A:
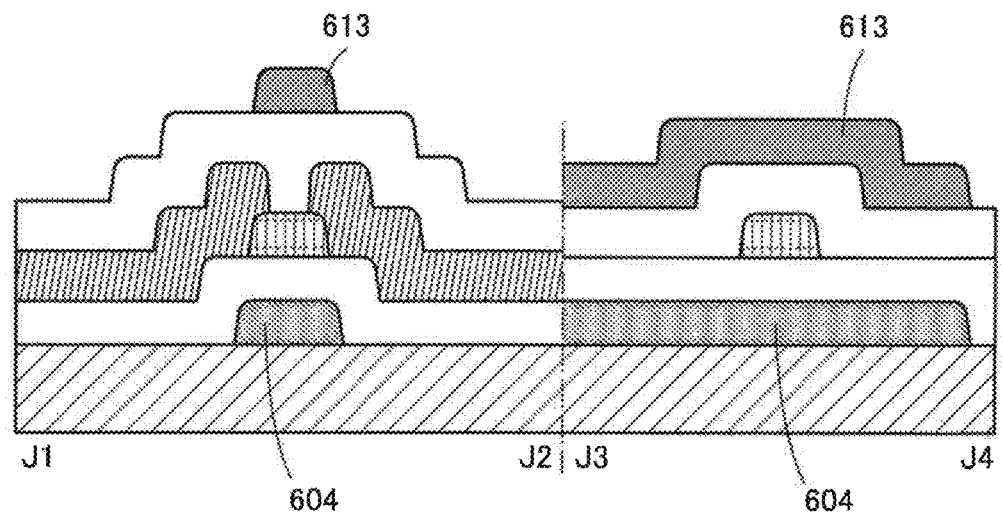
FIGS. 18A and 18B are cross-sectional views each illustrating a structural example of a transistor.
Figure 18B:
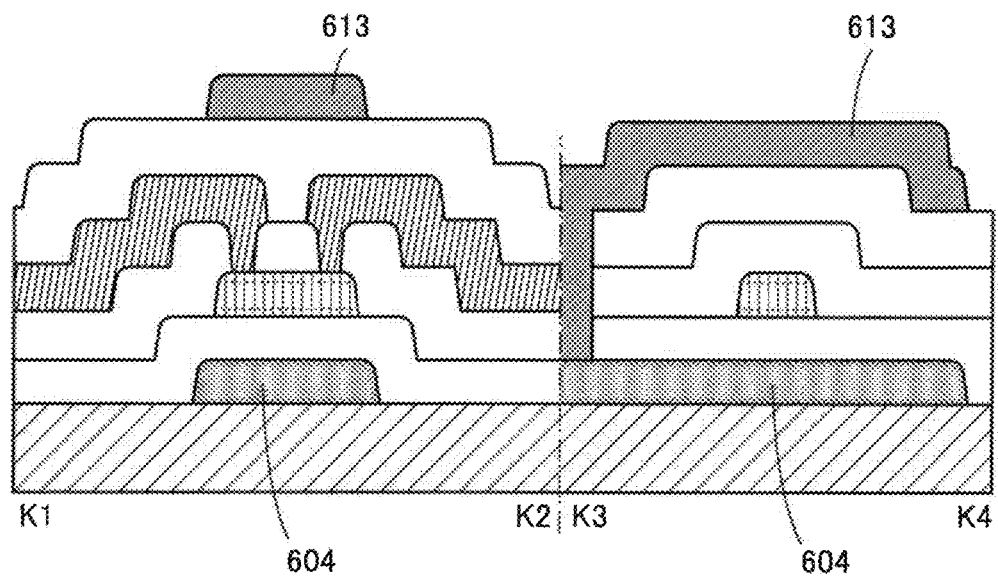

In FIG. 16B and FIG. 17B, a conductor 613 may be provided over the insulator 618. Examples in that case are shown in FIGS. 18A and 18B. For the conductor 613, the description of the conductor 413 is referred to. A potential or signal which is the same as that supplied to the conductor 604 or a potential or signal which is different from that supplied to the conductor 604 may be supplied to the conductor 613. For example, by supplying a constant potential to the conductor 613, the threshold voltage of a transistor may be controlled. In other words, the conductor 613 can function as a second gate electrode. Furthermore, an s-channel structure may be formed using the conductor 613 and the like.

Embodiment 4

Figure 23:
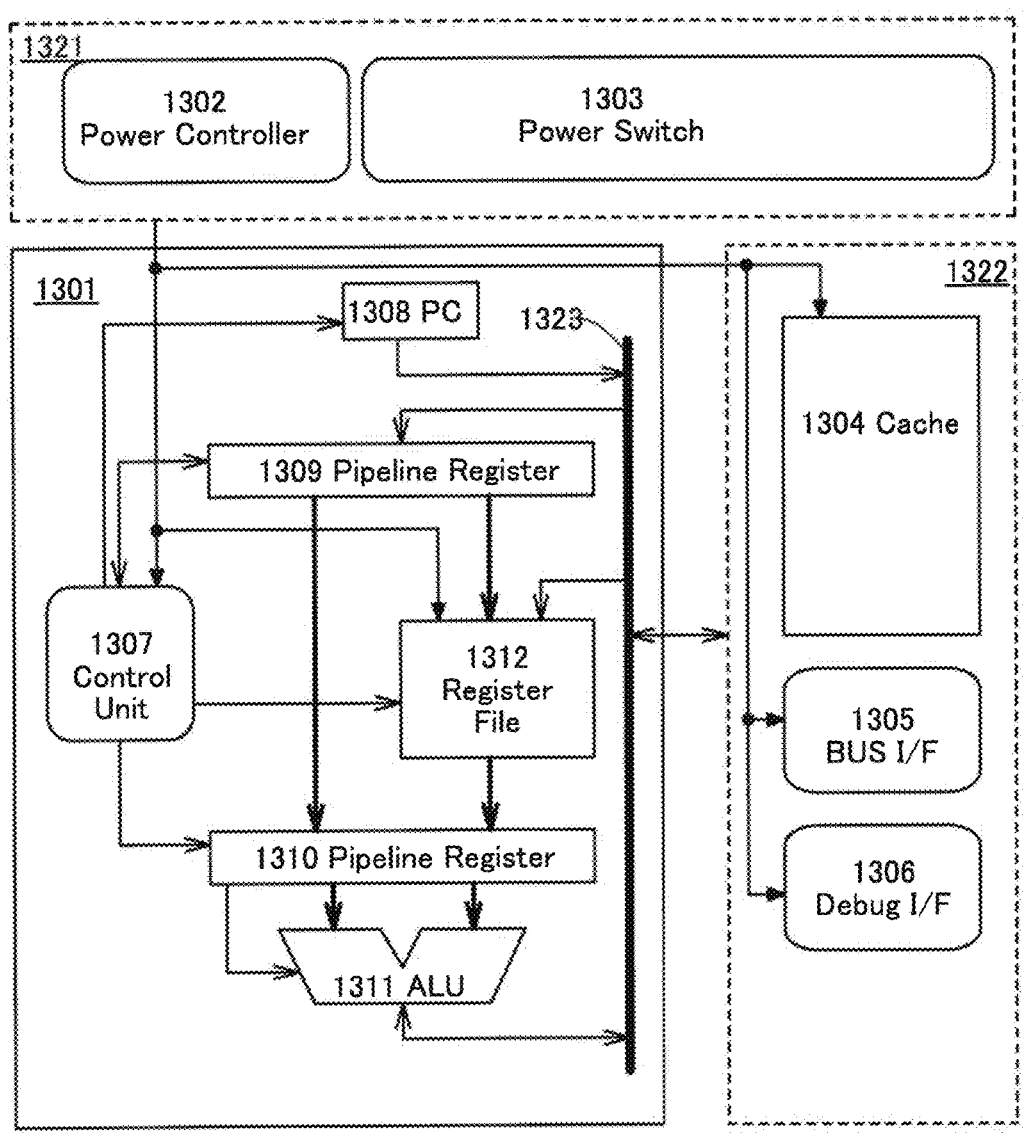
FIG. 23 is a block diagram illustrating an example of a CPU.

An example of the structure of a semiconductor device using the semiconductor device (cell) according to one embodiment of the present invention is described using FIG. 23.

A semiconductor device 1300 shown in FIG. 23 includes a CPU core 1301, a power management unit 1321, and a peripheral circuit 1322. The power management unit 1321 includes a power controller 1302 and a power switch 1303. The peripheral circuit 1322 includes a cache 1304 including cache memory, a bus interface (BUS I/F) 1305, and a debug interface (Debug I/F) 1306. The CPU core 1301 includes a data bus 1323, a control unit 1307, a PC (program counter) 1308, a pipeline register 1309, a pipeline register 1310, an ALU (Arithmetic logic unit) 1311, and a register file 1312. Data is transmitted between the CPU core 1301 and the peripheral circuit 1322 such as the cache 1304 via the data bus 1323.

The semiconductor device (cell) according to one embodiment of the present invention can be used for many logic circuits typified by the power controller 1302 and the control unit 1307, particularly to all logic circuits that can be constituted using standard cells. Accordingly, the semiconductor device 1300 can be small. The semiconductor device 1300 can have reduced power consumption. The semiconductor device 1300 can have a higher operating speed. The semiconductor device 1300 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) according to one embodiment of the present invention and the semiconductor device is used in the semiconductor device 1300, the semiconductor device 1300 can be small. The semiconductor device 1300 can have reduced power consumption. The semiconductor device 1300 can have a higher operating speed. Particularly when the Si transistors are only p-channel ones, the manufacturing cost can be reduced.

The control unit 1307 has functions of totally controlling operations of the PC 1308, the pipeline register 1309, the pipeline register 1310, the ALU 1311, the register file 1312, the cache 1304, the bus interface 1305, the debug interface 1306, and the power controller 1302 to decode and execute instructions contained in a program such as input applications.

The ALU 1311 has a function of performing a variety of arithmetic operations such as four arithmetic operations and logic operations.

The cache 1304 has a function of temporarily storing frequently-used data. The PC 1308 is a register having a function of storing an address of an instruction to be executed next. Note that although not shown in FIG. 23, the cache 1304 is provided with a cache controller for controlling the operation of the cache memory.

The pipeline register 1309 has a function of temporarily storing instruction data.

The register file 1312 includes a plurality of registers including a general purpose register and can store data that is read from the main memory, data obtained as a result of arithmetic operations in the ALU 1311, or the like.

The pipeline register 1310 has a function of temporarily storing data used for arithmetic operations of the ALU 1311, data obtained as a result of arithmetic operations of the ALU 1311, or the like.

The bus interface 1305 has a function as a path for data between the semiconductor device 1300 and various devices outside the semiconductor device 1300. The debug interface 1306 has a function as a path of a signal for inputting an instruction to control debugging to the semiconductor device 1300.

The power switch 1303 has a function of controlling supply of a power source voltage to various circuits included in the semiconductor device 1300 other than the power controller 1302. The above various circuits belong to several different power domains. The power switch 1303 controls whether the power supply voltage is supplied to the various circuits in the same power domain. In addition, the power controller 1302 has a function of controlling the operation of the power switch 1303.

The semiconductor device 1300 having the above structure is capable of performing power gating. A description will be given of an example of the power gating operation sequence.

First, by the CPU core 1301, timing for stopping the supply of the power supply voltage is set in a register of the power controller 1302. Then, an instruction of starting power gating is sent from the CPU core 1301 to the power controller 1302. Then, various registers and the cache 1304 included in the semiconductor device 1300 start data storing. Then, the power switch 1303 stops the supply of a power supply voltage to the various circuits other than the power controller 1302 included in the semiconductor device 1300. Then, an interrupt signal is input to the power controller 1302, whereby the supply of the power supply voltage to the various circuits included in the semiconductor device 1300 is started. Note that a counter may be provided in the power controller 1302 to be used to determine the timing of starting the supply of the power supply voltage regardless of input of an interrupt signal. Next, the various registers and the cache 1304 start data recovery. Then, the instruction is resumed in the control unit 1307.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 1301 or the peripheral circuit 1322 is preferably restored in a short time. In that case, the power can be turned on or off in a short time, and an effect of saving power becomes significant.

In order that the data held by the CPU core 1301 or the peripheral circuit 1322 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation data can restore and return data in a short time in some cases.

Figure 24:
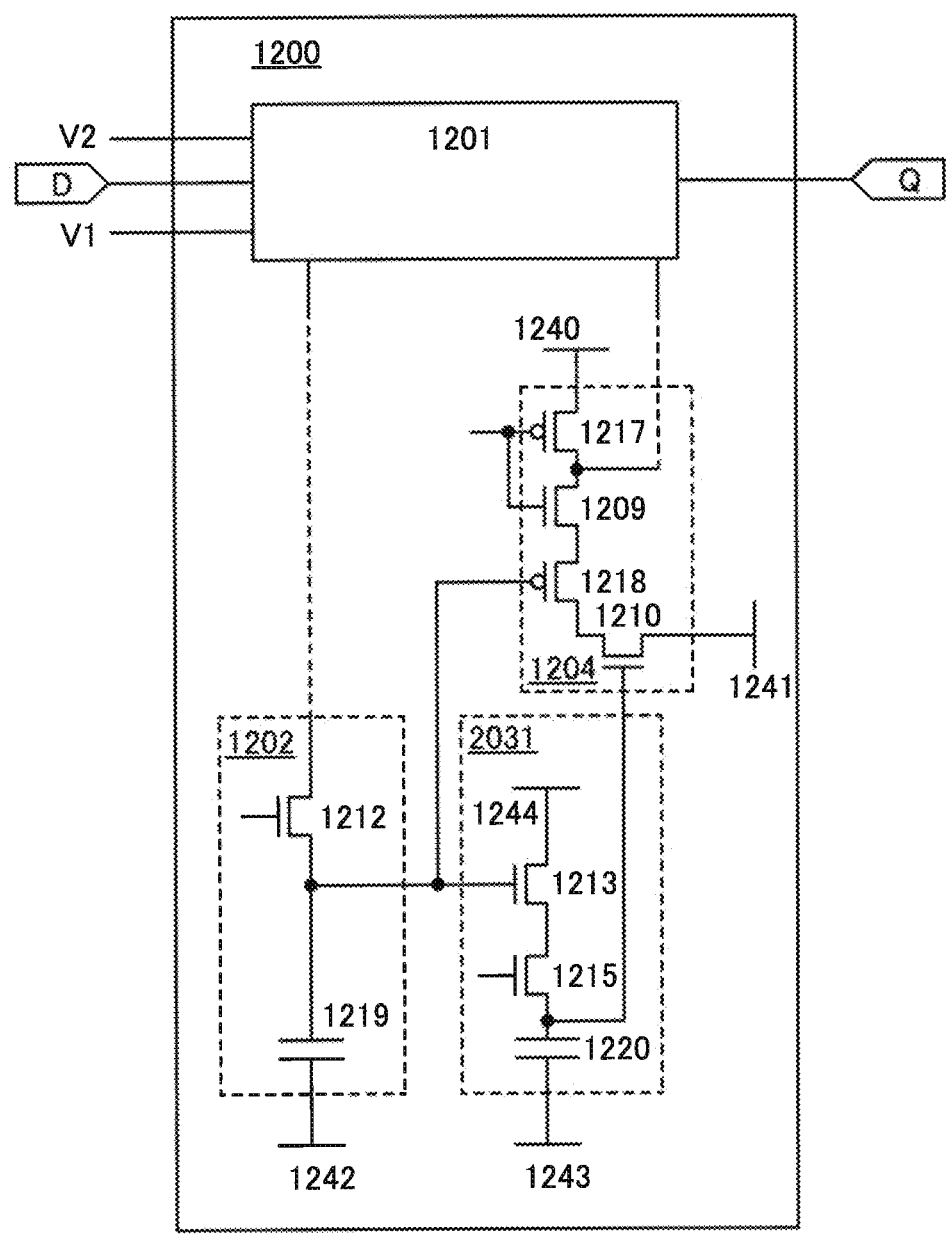
FIG. 24 is a circuit diagram showing an example of a semiconductor device.
Figure 25:
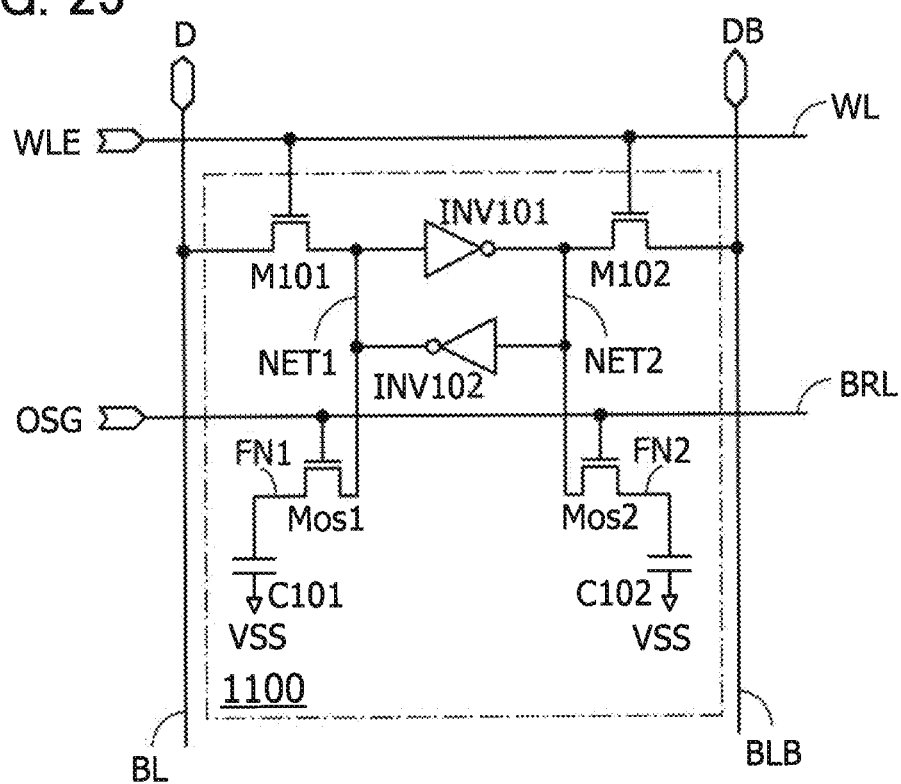
FIG. 25 is a circuit diagram showing an example of a semiconductor device.

Examples of the flip-flop circuit capable of backup operation and the SRAM cell capable of backup operation are described using FIG. 24 and FIG. 25.

A semiconductor device 1200 shown in FIG. 24 is an example of the flip-flop circuit capable of backup operation. The semiconductor device 1200 includes a first memory circuit 1201, a second memory circuit 1202, a third memory circuit 1203, and a read circuit 1204. As a power supply voltage, a potential difference between a potential V1 and a potential V2 is supplied to the semiconductor device 1200. One of the potential V1 and the potential V2 is at a high level, and the other is at a low level. An example of the structure of the semiconductor device 1200 when the potential V1 is at a low level and the potential V2 is at a high level will be described below.

The first memory circuit 1201 has a function of retaining data when a signal D including the data is input in a period during which the power supply voltage is supplied to the semiconductor device 1200. Furthermore, the first memory circuit 1201 outputs a signal Q including the retained data in the period during which the power supply voltage is supplied to the semiconductor device 1200. On the other hand, the first memory circuit 1201 cannot retain data in a period during which the power supply voltage is not supplied to the semiconductor device 1200. That is, the first memory circuit 1201 can be referred to as a volatile memory circuit.

The second memory circuit 1202 has a function of reading the data held in the first memory circuit 1201 to store (or restore) it. The third memory circuit 1203 has a function of reading the data held in the second memory circuit 1202 to store (or restore) it. The read circuit 1204 has a function of reading the data held in the second memory circuit 1202 or the third memory circuit 1203 to store (or return) it in (to) the first memory circuit 1201.

In particular, the third memory circuit 1203 has a function of reading the data held in the second memory circuit 1202 to store (or restore) it even in the period during which the power supply voltage is not supplied to the semiconductor device 1200.

As shown in FIG. 24, the second memory circuit 1202 includes a transistor 1212 and a capacitor 1219. The third memory circuit 1203 includes a transistor 1213, a transistor 1215, and a capacitor 1220. The read circuit 1204 includes a transistor 1210, a transistor 1218, a transistor 1209, and a transistor 1217.

The transistor 1212 has a function of charging and discharging the capacitor 1219 in accordance with data held in the first memory circuit 1201. The transistor 1212 is desirably capable of charging and discharging the capacitor 1219 at a high speed in accordance with data held in the first memory circuit 1201. Specifically, the transistor 1212 desirably contains crystalline silicon (preferably polycrystalline silicon, more preferably single crystal silicon) in a channel formation region.

The conduction state or the non-conduction state of the transistor 1213 is determined in accordance with the charge held in the capacitor 1219. The transistor 1215 has a function of charging and discharging the capacitor 1220 in accordance with the potential of a wiring 1244 when the transistor 1213 is in a conduction state. It is desirable that the off-state current of the transistor 1215 be extremely low. Specifically, the transistor 1215 desirably contains an oxide semiconductor (preferably an oxide containing In, Ga, and Zn) in a channel formation region.

Specific connection relations between the elements will be described. One of a source electrode and a drain electrode of the transistor 1212 is connected to the first memory circuit 1201. The other of the source electrode and the drain electrode of the transistor 1212 is connected to one electrode of the capacitor 1219, a gate electrode of the transistor 1213, and a gate electrode of the transistor 1218. The other electrode of the capacitor 1219 is connected to the wiring 1242. One of a source electrode and a drain electrode of the transistor 1213 is connected to the wiring 1244. The other of the source electrode and the drain electrode of the transistor 1213 is connected to one of a source electrode and a drain electrode of the transistor 1215. The other of the source electrode and the drain electrode of the transistor 1215 is connected to one electrode of the capacitor 1220 and a gate electrode of the transistor 1210. The other electrode of the capacitor 1220 is connected to the wiring 1243. One of a source electrode and a drain electrode of the transistor 1210 is connected to a wiring 1241. The other of the source electrode and the drain electrode of the transistor 1210 is connected to one of a source electrode and a drain electrode of the transistor 1218. The other of the source electrode and the drain electrode of the transistor 1218 is connected to one of a source electrode and a drain electrode of the transistor 1209. The other of the source electrode and the drain electrode of the transistor 1209 is connected to one of a source electrode and a drain electrode of the transistor 1217 and the first memory circuit 1201. The other of the source electrode and the drain electrode of the transistor 1217 is connected to a wiring 1240. Furthermore, although a gate electrode of the transistor 1209 is connected to a gate electrode of the transistor 1217 in FIG. 24, the gate electrode of the transistor 1209 is not necessarily connected to the gate electrode of the transistor 1217.

The transistor described in the above embodiment as an example can be applied to the transistor 1215. Because of the low off-state current of the transistor 1215, the semiconductor device 1200 can retain data for a long time without power supply. The favorable switching characteristics of the transistor 1215 allow the semiconductor device 1200 to perform high-speed backup and recovery.

The semiconductor device 1100 shown in FIG. 25 is an example of the SRAM cell capable of backup operation. The semiconductor device 1100 includes transistors (M101, M102, Mos1, and Mos2), inverters (INV101 and INV102), and capacitors (C101 and C102). The semiconductor device 1100 is connected to wirings (WL, BL, BLB, and BRL). In addition, the low power supply voltage (VSS) and the like are supplied as power supply voltages to the semiconductor device 1100.

An input node and an output node of the inverter INV101 are connected with an output node and an input node of the inverter INV102, respectively, whereby an inverter loop circuit is formed. A gate electrode of the transistor M101 and a gate electrode of the transistor M102 are connected to the wiring WL. The transistor M101 functions as a switch connecting the wiring BL and the input node of the inverter INV101, and the transistor M102 functions as a switch connecting the wiring BLB and the input node of the inverter INV102.

The wiring WL functions as a writing/reading word line, and a signal (WLE) for selecting a memory cell is input from a word line driver circuit. The wirings BL and BLB function as bit lines that send signals D and DB. The signal DB is a signal that is obtained by inverting the logic value of the signal D. The signals D and DB are supplied from a bit line driver circuit. Furthermore, the wirings BL and BLB are also wirings for transmitting data read from the semiconductor device 1100 to an output circuit.

The semiconductor device 1100 corresponds to a circuit including a volatile memory circuit (INV101, INV102, M101, and M102) and a pair of memory circuits (Mos1 and C101) and (Mos2 and C102). The memory circuits (Mos1 and C101) and (Mos2 and C102) are each a circuit for backing up data of the volatile memory circuit by storing potentials held in a node NET1 and a node NET2, respectively. These memory circuits turn on the transistors Mos1 and Mos2 to charge or discharge the capacitors C101 and C102 so that data is written, and turns off them to store charge accumulated in the capacitors so that data is retained without power supply.

Data is recovered by turning on the transistors Mos1 and Mos2. The transistors Mos1 and Mos2 are turned on while power supply to the inverters INV101 and INV102 is stopped, whereby a node FN1 and a node NET1 are connected so that charge is shared by the node FN1 and the node NET1, and a node FN2 and a node NET2 are connected so that charge is shared by the node FN2 and the node NET2. Then, power is supplied to the inverters INV101 and INV102, whereby data is returned to an inverter loop circuit, depending on the potentials of the node NET1 and the node NET2. After that, the transistors Mos1 and Mos2 are turned off.

Gate electrodes of the transistors Mos1 and Mos2 are connected to the wiring BRL. A signal OSG is input to the wiring BRL. In response to the signal OSG, the pair of memory circuits (Mos1, C101) and (Mos2, C102)) is driven and backup or recovery is performed.

Configurations and operations of the memory circuit (Mos1, C101) and the memory circuit (Mos2, C102) are described below.

The memory circuits (Mos1 and C101) and (Mos2 and C102) store charge in the capacitors C101 and C102, thereby holding the potentials of the nodes FN1 and FN2. When the transistors Mos1 and Mos2 are turned on, the node NET1 and the node FN1 are connected and the potential held in the node NET1 is applied to the node FN1. Furthermore, when the transistor Mos2 is turned on, the node NET2 and the node FN2 are connected and the potential held in the node NET2 is applied to the node FN2. In addition, turning off the transistors Mos1 and Mos2 brings the nodes FN1 and FN2 into an electrically floating state, so that charge stored in the capacitors C101 and C102 is held and the memory circuits are brought into a data holding state.

For example, in the case where the node FN1 is at H level, charge may leak from C101, gradually decreasing the voltage thereof. The transistors Mos1 and Mos2 desirably contain an oxide semiconductor (preferably an oxide containing In, Ga, and Zn) in a channel formation region. Consequently, the leakage current flowing between a source electrode and a drain electrode in an off state (off-state current) is extremely low; thus, a voltage variation of the node FN1 can be suppressed. That is to say, the circuit including the transistor Mos1 and the capacitor C101 can be operated as a nonvolatile memory circuit or a memory circuit that can retain data for a long time without power supply. Furthermore, in a similar manner, the circuit including the transistor Mos2 and the capacitor C102 can be used as a backup memory circuit of the volatile memory circuit (INV101, INV102, M101, and M102).

The transistor described as an example in the above embodiment can be used as the transistors Mos1 and Mos2. Because of the low off-state current of the transistors Mos1 and Mos2, the semiconductor device 1100 can retain data for a long time without power supply. The favorable switching speed of the transistors Mos1 and Mos2 allows the semiconductor device 1100 to perform high-speed backup and recovery.

The semiconductor device (cell) according to one embodiment of the present invention, and the flip-flop circuit and SRAM cell, which are capable of backup operation and use the transistor which includes an oxide semiconductor in a channel formation region and is described as an example in the above embodiment, can be used in the semiconductor device 1300, so that the power of the semiconductor device can be turned on or off in a short time and power consumption thereof can further be reduced.

The transistor described as an example in the above embodiment can be used in the semiconductor device (cell) according to one embodiment of the present invention or the flip-flop circuit and SRAM cell, which are capable of backup operation and includes the oxide semiconductor in a channel formation region in the semiconductor device 1300 to reduce the manufacturing cost thereof. In particular, n-channel transistors used in the flip-flop circuit and the SRAM cells may each be replaced with the transistor which includes an oxide semiconductor in a channel formation region and is described as an example in the above embodiment. When Si transistors are only p-channel ones, manufacturing cost can be reduced.

The semiconductor device (cell) according to one embodiment of the present invention can be used for a graphics processing unit (GPU), a programmable logic device (PLD), a digital signal processor (DSP), a microcontroller unit (MCU), a radio frequency integrated circuit (RFIC), a custom LSI, and the like as well as a CPU.

Embodiment 5

In this embodiment, application examples of the semiconductor device (cell) according to one embodiment of the present invention are described.

Figure 26A:
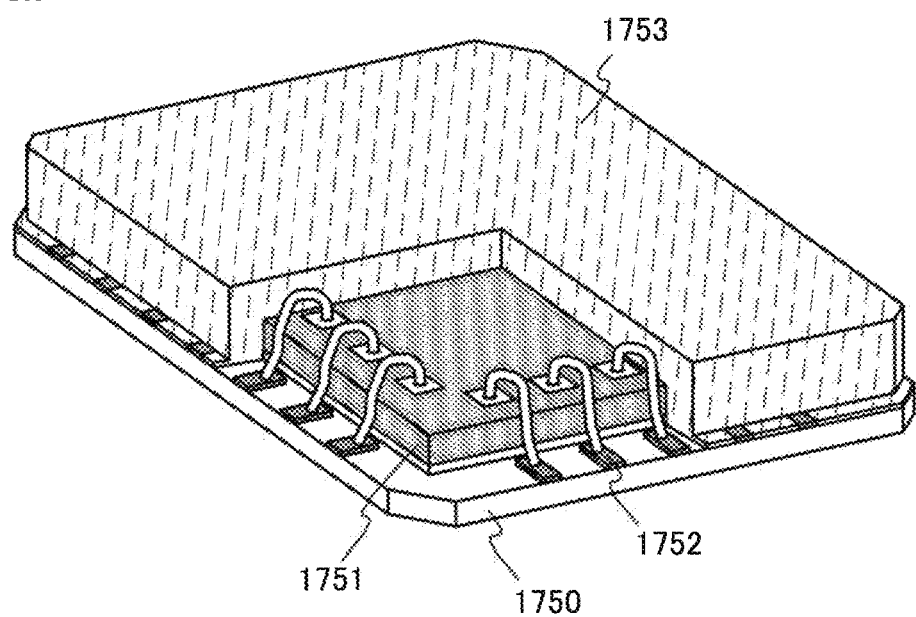
FIGS. 26A and 26B illustrate structural examples of a chip and a module.

FIG. 26A shows a perspective view illustrating a part of the inside of a package including a lead frame type interposer. In the package illustrated in FIG. 26A, a chip 1751 to which the semiconductor device (cell) according to one embodiment of the present invention is applied is connected to a terminal 1752 over an interposer 1750 by a wire bonding method. The terminal 1752 is placed on a surface of the interposer 1750 on which the chip 1751 is mounted. In addition, the chip 1751 may be sealed by a mold resin 1753, in which case it is sealed so that part of each of the terminals 1752 is exposed.

Figure 26B:
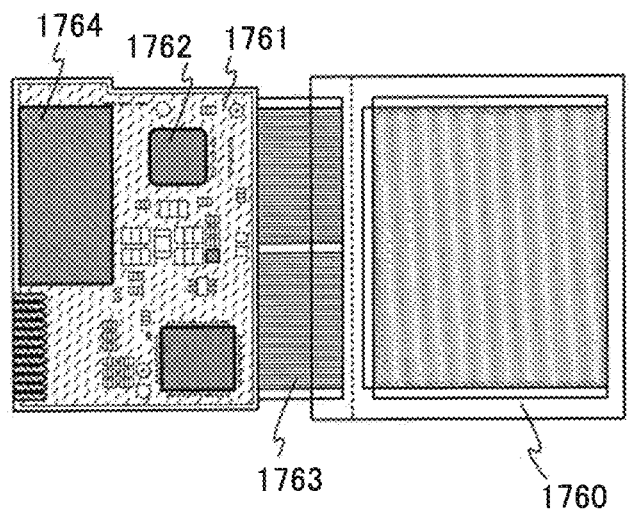

FIG. 26B illustrates the structure of a module of an electronic device (mobile phone) in which a package is mounted on a circuit board. In the module of a mobile phone shown in FIG. 26B, a package 1762 and a battery 1764 are mounted on a printed circuit board 1761. In addition, the printed circuit board 1761 is mounted on a panel 1760 provided with display elements by an FPC 1763.

Embodiment 6

An example of the structure of a semiconductor device including the semiconductor device (cell) according to one embodiment of the present invention is described using FIG. 28, FIG. 29, FIG. 30, and FIG. 31.

Figure 28:
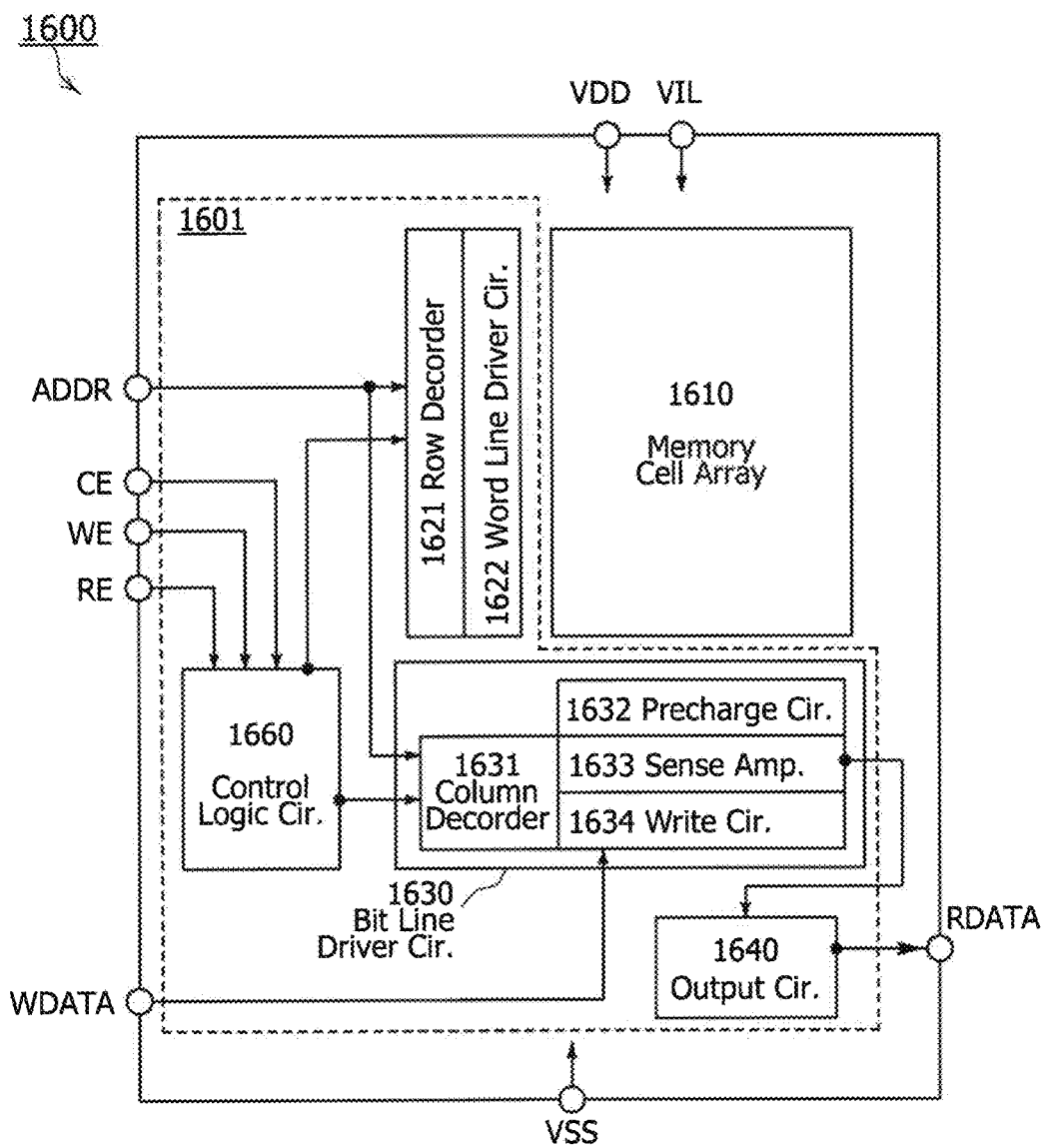
FIG. 28 is a block diagram showing an example of a memory device.

FIG. 28 shows an example of a structure of a semiconductor device. A semiconductor device 1600 shown in FIG. 28 is an example of a semiconductor device that can function as a memory device. The semiconductor device 1600 includes a memory cell array 1610, a row decoder 1621, a word line driver circuit 1622, a bit line driver circuit 1630, an output circuit 1640, and a control logic circuit 1660.

The bit line driver circuit 1630 includes a column decoder 1631, a precharge circuit 1632, a sense amplifier 1633, and a writing circuit 1634. The precharge circuit 1632 has a function of precharging wirings (BL and BLB) and a function of making the voltages of the wiring BL and the wiring BLB in the same column equal. The sense amplifier 1633 has a function of amplifying signals (D and DB) read from the wirings (BL and BLB). The amplified signals are output to the outside of the semiconductor device 1600 as digital signals RDATA, through the output circuit 1640.

Furthermore, to the semiconductor device 1600, a low power supply voltage (VSS), a high power supply voltage (VDD) for a circuit portion 1601 other than the memory cell array, and a high power supply voltage (VIL) for the memory cell array 1610 are supplied from the outside as power supply voltages.

In addition, to the semiconductor device 1600, control signals (CE, WE, and RE), an address signal ADDR, and a signal WDATA are input from the outside. ADDR is input to the row decoder 1621 and the column decoder 1631, and WDATA is input to the writing circuit 1634.

The control logic circuit 1660 processes the signals (a signal CE, a signal WE, and a signal RE) input from the outside, and generates signals for the row decoder 1621 and the column decoder 1631. The signal CE is a chip enable signal, the signal WE is a write enable signal, and the signal RE is a read enable signal. Signals processed by the control logic circuit 1660 are not limited thereto, and other signals may be input as necessary.

Note that whether each circuit or each signal described above is provided or not can be determined as appropriate as needed.

The semiconductor device (cell) according to one embodiment of the present invention can be used for the row decoder 1621, the word line driver circuit 1622, the bit line driver circuit 1630, the output circuit 1640, and the control logic circuit 1660, particularly to all the logic circuits that can be formed using a standard cell. Accordingly, the semiconductor device 1600 can be small. The semiconductor device 1600 can have reduced power consumption. The semiconductor device 1600 can have a higher operating speed.

When p-channel Si transistors and the transistor described in the above embodiment which includes an oxide semiconductor (preferably an oxide containing In, Ga, and Zn) in a channel formation region are used in the semiconductor device (cell) according to one embodiment of the present invention and the semiconductor device is used in the semiconductor device 1600, the semiconductor device 1600 can be small. The semiconductor device 1600 can have reduced power consumption. The semiconductor device 1600 can have a higher operating speed. Particularly when the Si transistors are only p-channel ones, the manufacturing cost can be reduced.

Note that a transistor including an oxide semiconductor (preferably an oxide containing In, Ga, and Zn) in a channel formation region can be used in the memory cell array 1610.

An example of such a memory cell will be described below using FIG. 29, FIG. 30, and FIG. 31.

Figure 29:
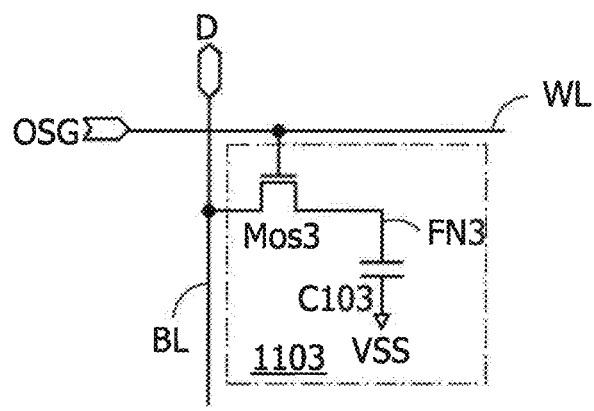
FIG. 29 is a circuit diagram showing an example of a memory cell.

FIG. 29 is a circuit diagram showing a configuration example of a memory cell. A memory cell 1103 includes a transistor Mos3 and a capacitor C103. A node FN3 is a data holding portion, and a terminal of the capacitor C103 is connected thereto. The transistor Mos3 functions as a switch connecting the node FN3 and the wiring BL, and a gate electrode thereof is connected to the wiring WL. As a signal for selecting a memory cell, the signal OSG is input to the wiring WL.

Figure 30:
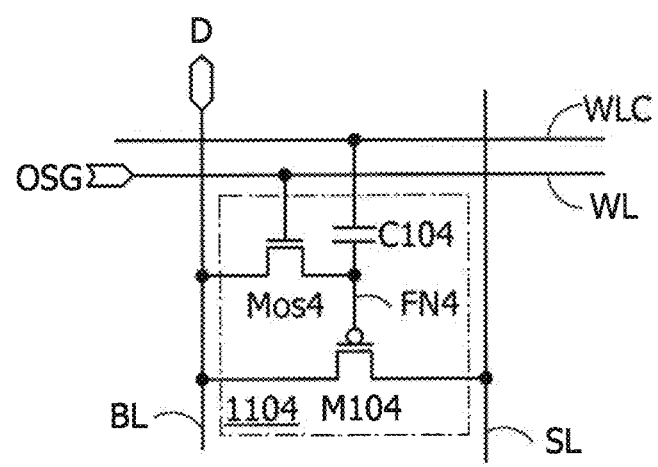
FIG. 30 is a circuit diagram showing an example of a memory cell.

FIG. 30 is a circuit diagram showing a configuration example of a memory cell. A memory cell 1104 includes a transistor Mos4, a transistor M104, and a capacitor C104. Anode FN4 is a data holding portion. The transistor Mos4 functions as a switch connecting the node FN4 and a wiring BL, and a gate electrode thereof is connected to the wiring WL. The signal OSG is input to the wiring WL. The capacitor C104 connects a wiring WLC and the node FN4. The wiring WLC is a wiring for supplying a constant voltage to a terminal of C104 at the time of a writing operation and at the time of a reading operation. The transistor M104 is a p-channel transistor, and a gate electrode, a source electrode, and a drain electrode thereof are connected to the node FN4, a wiring SL, and the wiring BL, respectively.

While a constant voltage is applied to the wirings WLC and SL, data is written by turning on the transistor Mos4 and connecting the node FN4 to the wiring BL. For reading data, a constant voltage is applied to the wirings BL, WLC, and SL. The value of a current flowing between a source electrode and a drain electrode of the transistor M104 changes depending on the voltage of the node FN4. The wiring BL is charged or discharged by the source electrode-drain electrode current of the transistor M104, so that the data value held in the memory cell 1104 can be read by detecting the voltage of the wiring BL.

Note that the transistor M104 can be an n-channel transistor. In accordance with the conductivity type of the transistor M104, a voltage applied to the wirings BL, SL, and WLC is determined.

Figure 31:
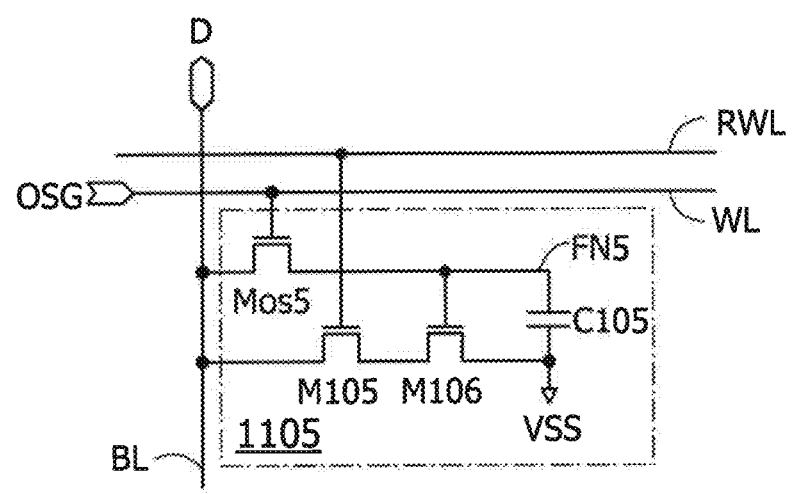
FIG. 31 is a circuit diagram showing an example of a memory cell.

FIG. 31 is a circuit diagram showing a configuration example of a memory cell. A memory cell 1105 includes a transistor Mos5, a transistor M105, a transistor M106, and a capacitor C105. A node FN5 is a data holding portion. The transistor Mos5 functions as a switch connecting the node FN5 and the wiring BL, and a gate electrode thereof is connected to the wiring WL. The signal OSG is input to the wiring WL. The transistors M105 and M106 connect the wiring BL and one terminal of the capacitor C105. A gate electrode of the transistor M105 is connected to a wiring RWL, and a gate electrode of the transistor M106 is connected to the node FN5. In addition, the other terminal of the capacitor C105 is connected to the node FN5.

Data is written by turning on the transistor Mos5 and connecting the node FN4 to the wiring BL. Data is read by turning on the transistor M105. The value of a current flowing between a source electrode and a drain electrode of the transistor M106 changes depending on the voltage of the node FN5. The wiring BL is charged or discharged by the source electrode-drain electrode current of the transistor M106, so that the data value held in the memory cell 1105 can be read by detecting the voltage of the wiring BL.

Note that the transistors M105 and M106 can be p-channel transistors. In accordance with the conductivity type of the transistors M105 and M106, a voltage applied to the wiring RWL and a voltage applied to the capacitor C105 should be determined.

In the configuration examples of the memory cells shown in FIG. 29 to FIG. 31, the transistors Mos3, Mos4, and Mos5 desirably include oxide semiconductors (preferably, oxides containing In, Ga, and Zn) in channel formation regions. As a result, since a leakage current (off-state current) that flows between a source electrode and a drain electrode of the transistor in an off-state is extremely low, a fluctuation in the voltage of the nodes FN3, FN4, and FN5 can be suppressed. That is to say, a circuit including the transistor Mos3 and the capacitor C103, a circuit including the transistor Mos4 and the capacitor C104, and a circuit including the transistor Mos3 and the capacitor C103 can each be operated as a nonvolatile memory circuit or a memory circuits capable of holding data for a long time without power supply.

The semiconductor device (cell) according to one embodiment of the present invention and the memory cell using the transistor which includes an oxide semiconductor in a channel formation region and is described as an example in the above embodiment can be used in the semiconductor device 1600, so that the semiconductor device that includes a nonvolatile memory circuit or a memory circuit capable of holding data for a long time without power supply can have a smaller size, reduced power consumption, a higher operating speed, or a smaller power supply voltage variation.

The transistor described as an example in the above embodiment can be used in the semiconductor device (cell) according to one embodiment of the present invention or the memory cell using a transistor including the oxide semiconductor in a channel formation region in the semiconductor device 1600 to reduce the manufacturing cost thereof. In particular, re-channel transistors used in the memory cell may each be replaced with the transistor which includes an oxide semiconductor in a channel formation region and is described as an example in the above embodiment in channel formation regions. When Si transistors are only p-channel ones, manufacturing cost can be reduced.

Note that this embodiment can be combined as appropriate with the other embodiments described in this specification.

Embodiment 7

Figure 27:
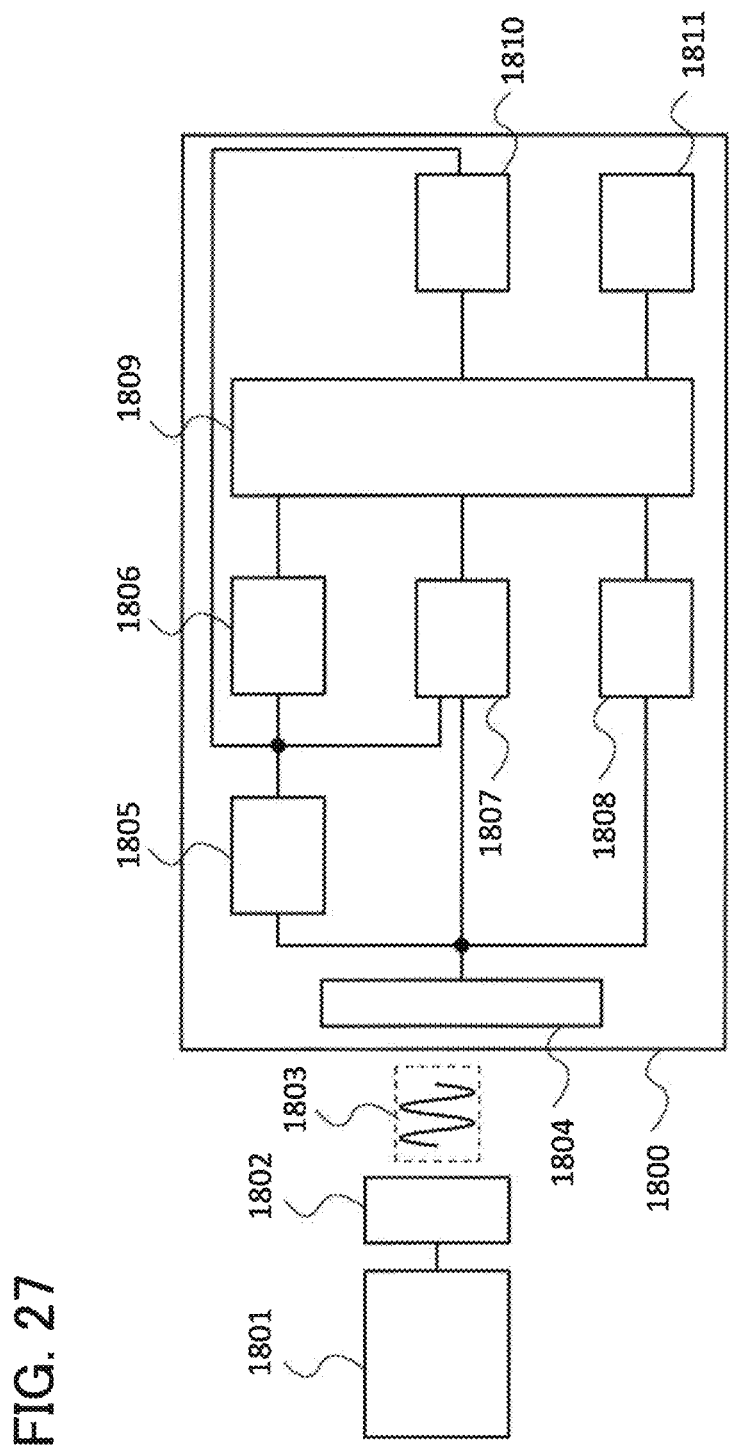
FIG. 27 is a block diagram showing a structural example of an RFIC.

An example of the structure of a device using the semiconductor device (cell) according to one embodiment of the present invention is described using FIG. 27.

A semiconductor device 1800 shown in FIG. 27 is an example of the structure of an RFIC. An RFIC in this embodiment includes a memory circuit inside, stores necessary data in the memory circuit, and transmits and receives data to/from the outside by using contactless means, for example, wireless communication. With such characteristics, an RFIC can be used for an individual authentication system in which an object is recognized by reading the individual information of the object or the like, for example. An RFIC may be referred to as an RF chip, an RF tag, an RFID, or the like.

The semiconductor device 1800 shown in FIG. 27 includes an antenna 1804, a rectifier circuit 1805, a constant voltage circuit 1806, a demodulation circuit 1807, a modulation circuit 1808, a logic circuit 1809, a memory circuit 1810, and a ROM 1811.

The antenna 1804 is a circuit for sending and receiving a radio signal 1803 with the antenna 1802 connected to a communication device 1801. In addition, the rectifier circuit 1805 is a circuit for generating an input potential by rectification, for example, half-wave voltage doubler rectification of the input alternating signal generated by reception of a radio signal at the antenna 1804 and smoothing of the rectified signal with a capacitor provided in a later stage. Note that a limiter circuit may be provided on the input side or the output side of the rectifier circuit 1805. The limiter circuit is a circuit for controlling electric power so that electric power that is higher than or equal to certain electric power is not input to a circuit in a later stage in the case where the amplitude of the input alternating signal is high and an internal generation voltage is high.

The constant voltage circuit 1806 is a circuit for generating a stable power supply voltage from an input potential and supplying it to each circuit. Note that the constant voltage circuit 1806 may include a reset signal generation circuit. The reset signal generation circuit generates a reset signal of the logic circuit 1809 by utilizing the rise of the stable power supply voltage.

The demodulation circuit 1807 is a circuit for demodulating the input alternating signal by envelope detection and generating the demodulated signal. Furthermore, the modulation circuit 1808 performs modulation in accordance with data to be output from the antenna 1804.

The logic circuit 1809 is a circuit for decoding and processing the demodulated signal. The memory circuit 1810 holds the input data and includes a row decoder, a column decoder, a memory region, and the like. Furthermore, the ROM 1811 stores an identification number (ID) or the like and outputs it in accordance with processing.

Note that data transmission formats include an electromagnetic coupling method in which a pair of coils is provided so as to face each other and communicates with each other by mutual induction, an electromagnetic induction method in which communication is performed using an induction field, a radio wave method in which communication is performed using a radio wave, and the like. The semiconductor device 1800 described in this embodiment can be used for any of the methods.

Note that whether each circuit described above is provided or not can be determined as appropriate as needed.

The semiconductor device (cell) according to one embodiment of the present invention can be used for the logic circuit 1809, the memory circuit 1810, the ROM 1811, and the like, particularly to all logic circuits that can be constituted using standard cells. Accordingly, the semiconductor device 1800 can be small. The semiconductor device 1800 can have reduced power consumption. The semiconductor device 1800 can have a higher operating speed.

When p-channel Si transistors and the transistor described in the above embodiment which includes an oxide semiconductor (preferably an oxide containing In, Ga, and Zn) in a channel formation region are used in the semiconductor device (cell) according to one embodiment of the present invention and the semiconductor device is used in the semiconductor device 1800, the semiconductor device 1800 can be small. The semiconductor device 1800 can have reduced power consumption. The semiconductor device 1800 can have a higher operating speed. Particularly when the Si transistors are only p-channel ones, the manufacturing cost can be reduced.

Note that the memory circuit described in the above embodiment can be used as the memory circuit 1810. Furthermore, the transistor described in the above embodiment which includes an oxide semiconductor (preferably an oxide containing In, Ga, and Zn) in a channel formation region may be used as an element having a rectifying function included in the demodulation circuit 1807. Since the transistor has a low off-state current, the reverse current of the element having a rectifying function can be reduced. Consequently, excellent rectification efficiency can be achieved.

Note that this embodiment is not limited to the above-described structure. For example, a battery not shown in FIG. 27 may be incorporated so as to form an active-type RFIC.

Note that this embodiment can be combined as appropriate with the other embodiments described in this specification.

Embodiment 8

An example of the structure of a semiconductor device (imaging device) according to one embodiment of the present invention is described with reference to FIGS. 33A and 33B and FIG. 34.

Figure 33A:
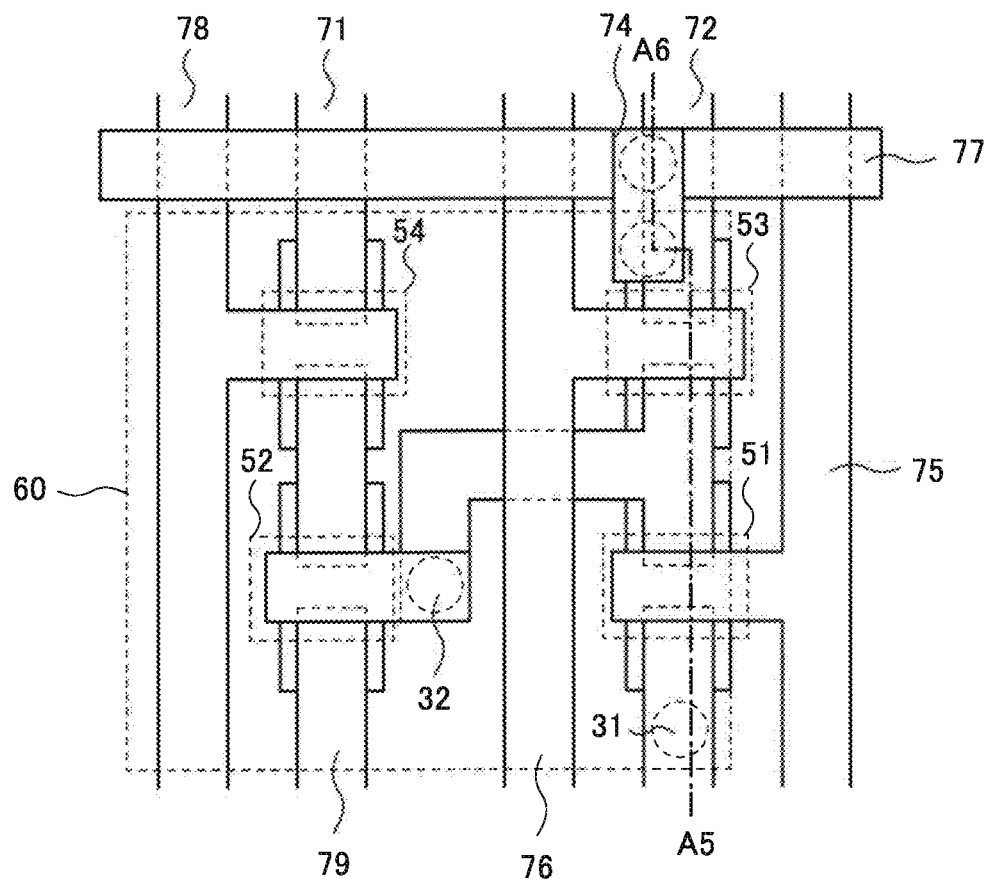
FIGS. 33A and 33B are a top view and a cross-sectional view illustrating a structural example of an imaging device.
Figure 33B:
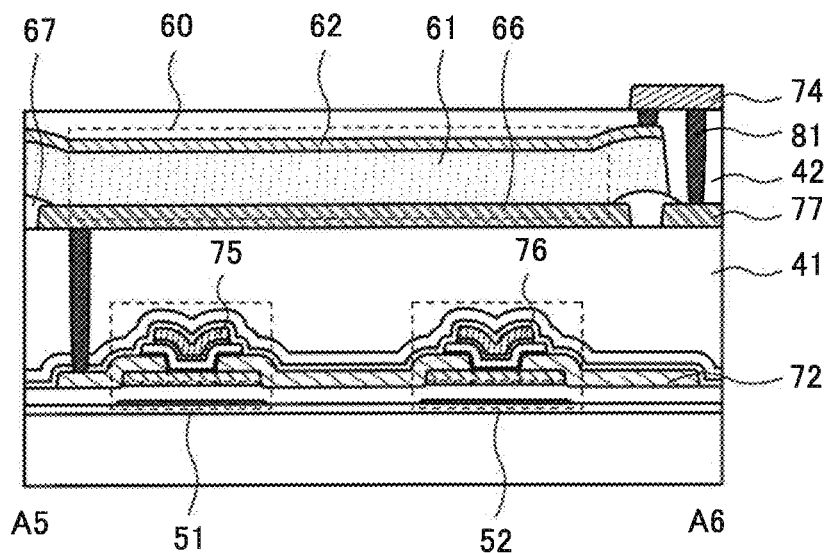
Figure 34:
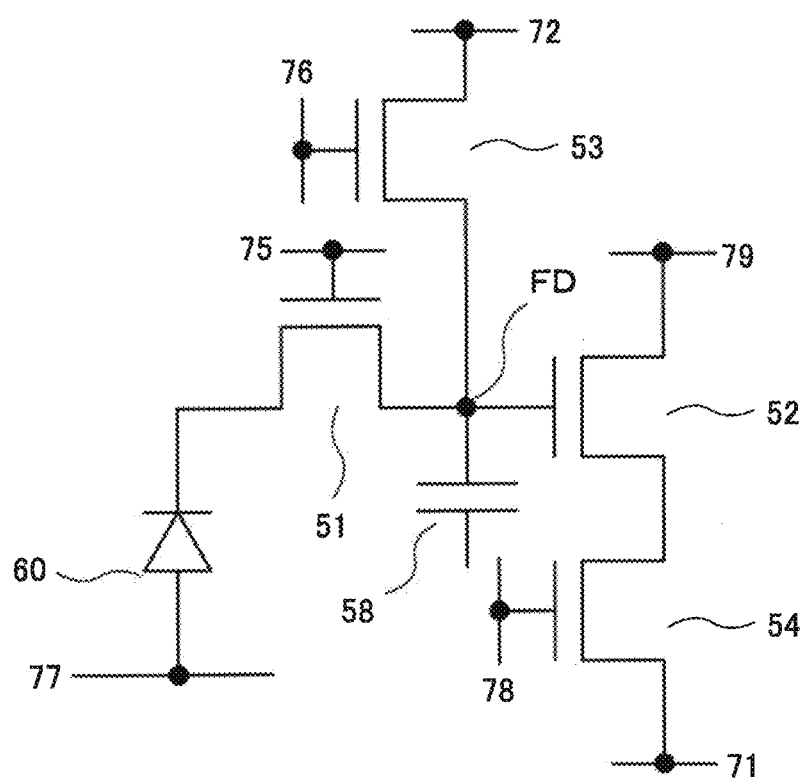
FIG. 34 is a circuit diagram showing an example of the imaging device.

FIG. 33A is a top view of the imaging device of one embodiment of the present invention and shows an example of a specific connection between a photoelectric conversion element 60, a transistor 51, a transistor 52, a transistor 53, and a transistor 54 which are included in a pixel circuit illustrated in FIG. 34. FIG. 33B is a cross-sectional view along the dash-dot line A5-A6 in FIG. 33A. Note that in the above drawings, some components are not illustrated for clarity.

The electrical connection between the above components is only an example. Although the wirings, the electrodes, and a conductor 81 are illustrated as independent components in the drawings, some of them are provided as one component in some cases when they are electrically connected to each other. In addition, an insulator 41 and an insulator 42 that serve as interlayer insulating films or planarizing films are provided between the components.

For example, an inorganic insulating film such as a silicon oxide film or a silicon oxynitride film can be used as the insulators 41 and 42. Alternatively, an organic insulating film such as an acrylic resin film or a polyimide resin film may be used. The top surfaces of the insulators 41 and 42 are preferably planarized by a chemical mechanical polishing (CMP) method or the like.

In some cases, one or more of the wirings are not provided or another wiring or transistor is included in each layer. Furthermore, another layer may be included in the stacked-layer structure. One or more of the layers are not included in some cases.

In the pixel circuit, one of a source electrode and a drain electrode of a transistor 51 is electrically connected to one electrode 66 of a photoelectric conversion element 60. The other of the source electrode and the drain electrode of the transistor 51 is electrically connected to a gate electrode of a transistor 52. The other of the source electrode and the drain electrode of the transistor 51 is also electrically connected to one of a source electrode and a drain electrode of a transistor 53. One of a source electrode and a drain electrode of the transistor 52 is electrically connected to one of a source electrode and a drain electrode of a transistor 54. Although not illustrated in FIGS. 33A and 33B, the other of the source electrode and the drain electrode of the transistor 51 may be electrically connected to one electrode of a capacitor 58 as illustrated in FIG. 34.

The source electrode and the drain electrode of each transistor can function as wirings. For example, one of wirings 71 and 79 can function as a power supply line, and the other of the wirings 71 and 79 can function as an output line. A wiring 72 can function as a power supply line. A wiring 77 can function as a power supply line (low-potential power supply line). Wirings 75, 76, and 78 can function as signal lines for controlling the on/off states of transistors. A wiring 74 can function as a connection wiring.

Here, the transistor 51 can function as a transfer transistor for controlling the potential of a charge accumulation portion (FD) in response to output of the photoelectric conversion element 60. The transistor 52 can function as an amplifying transistor that outputs a signal based on the potential of the charge accumulation portion (FD). The transistor 53 can function as a reset transistor for initializing the potential of the charge accumulation portion (FD). The transistor 54 can function as a selection transistor for selecting a pixel.

A transistor including an oxide semiconductor in an active layer (hereinafter also referred to as an OS transistor) can be used as the transistors 51 to 54.

Extremely low off-state current characteristics of the OS transistor can widen the dynamic range of image-capturing. In the circuit shown in FIG. 34, an increase in the intensity of light entering the photoelectric conversion element 60 reduces the potential of the charge storage portion (FD). Since the transistor using an oxide semiconductor has an extremely low off-state current, a current corresponding to the gate potential can be accurately output even when the gate potential is extremely low. Thus, it is possible to widen the detection range of illuminance, i.e., the dynamic range.

A period during which charge can be retained in the charge storage portion (FD) can be extremely long owing to the low off-state current characteristics of the transistors 51 and 53. Therefore, a global shutter system, in which charge accumulation operation is performed in all the pixel circuits at the same time, can be used without a complicated circuit configuration and operation method, and thus, an image with little distortion can be easily obtained even in the case of a moving object. Furthermore, exposure time (a period for conducting charge accumulation operation) can be long in a global shutter system; thus, the imaging device is suitable for imaging even in a low illuminance environment.

In addition, the OS transistor has lower temperature dependence of change in electrical characteristics than the Si transistor, and thus can be used in an extremely wide range of temperatures. Therefore, an imaging device and a semiconductor device which include OS transistors are suitable for use in automobiles, aircrafts, and spacecrafts.

Furthermore, the OS transistor has higher drain breakdown voltage than the Si transistor. In a photoelectric conversion element including a selenium-based material in a photoelectric conversion layer, a relatively high voltage (e.g., 10 V or more) is preferably applied to easily cause the avalanche phenomenon. Therefore, by combination of the OS transistor and the photoelectric conversion element including a selenium-based material in the photoelectric conversion layer, a highly reliable imaging device can be obtained.

This embodiment can be combined with any of the other embodiments in this specification as appropriate.

Embodiment 9

The semiconductor device (cell) according to one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device (cell) according to one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 32A to 32F illustrate specific examples of these electronic devices.

Figure 32A:
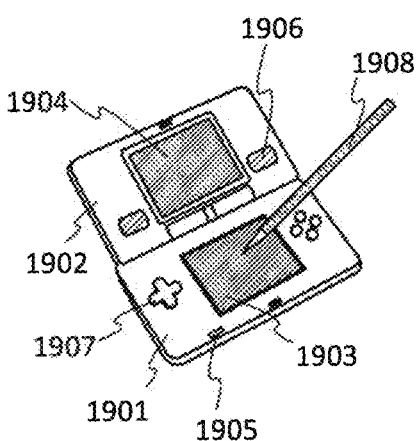
FIGS. 32A to 32F illustrate examples of electronic devices.

FIG. 32A illustrates a portable game console including a housing 1901, a housing 1902, a display portion 1903, a display portion 1904, a microphone 1905, a speaker 1906, an operation key 1907, a stylus 1908, and the like. Although the portable game machine in FIG. 32A has the two display portions 1903 and 1904, the number of display portions included in a portable game machine is not limited to this.

Figure 32B:
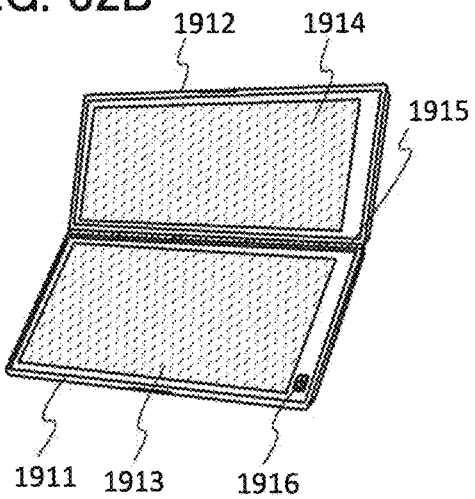

FIG. 32B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched depending on the angle between the first housing 1911 and the second housing 1912 at the joint 1915. A display device with a position input function may be used as at least one of the first display portion 1913 and the second display portion 1914. Note that the position input function can be added by provision of a touch panel in a display device. Alternatively, the position input function can be added by provision of a photoelectric conversion element called a photosensor in a pixel portion of a display device.

Figure 32C:
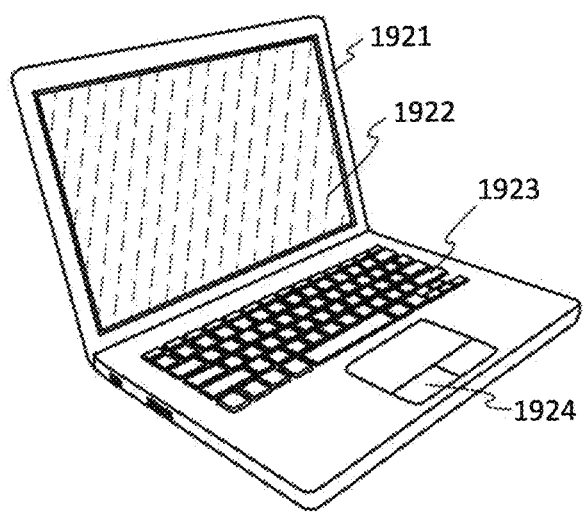

FIG. 32C illustrates a laptop personal computer, which includes a housing 1921, a display portion 1922, a keyboard 1923, a pointing device 1924, and the like.

Figure 32D:
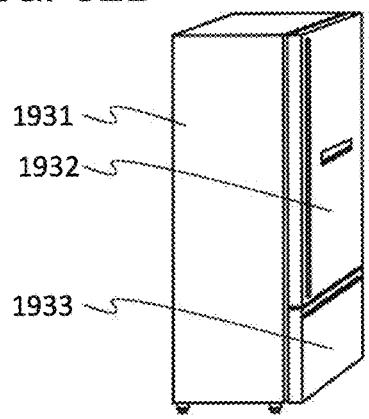

FIG. 32D illustrates an electric refrigerator-freezer including a housing 1931, a door for a refrigerator 1932, a door for a freezer 1933, and the like.

Figure 32E:
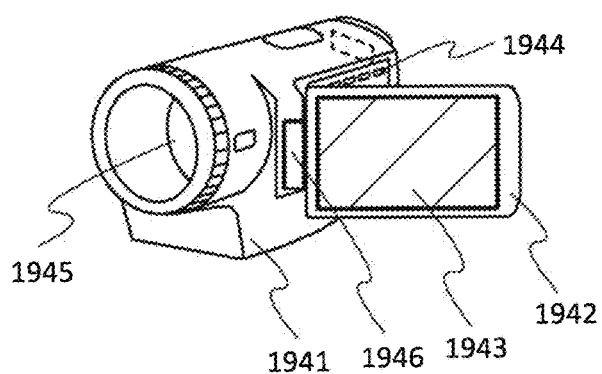

FIG. 32E illustrates a video camera including a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 32F:
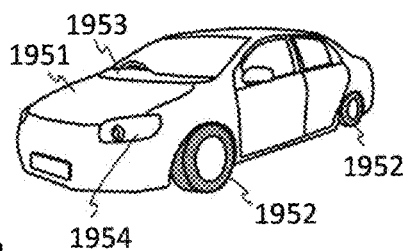

FIG. 32F illustrates an ordinary vehicle including a car body 1951, wheels 1952, a dashboard 1953, lights 1954, and the like.

Example 1

(Oxygen Vacancy)

This example shows device calculations of transistors each including an oxide semiconductor, which were performed to examine an effect of oxygen vacancies inside the oxide semiconductor on the transistors, and the results of the calculations.

In this example, 2D calculations were performed using the device simulator "ATLAS" produced by Silvaco Inc. as calculation software.

Figure 19:
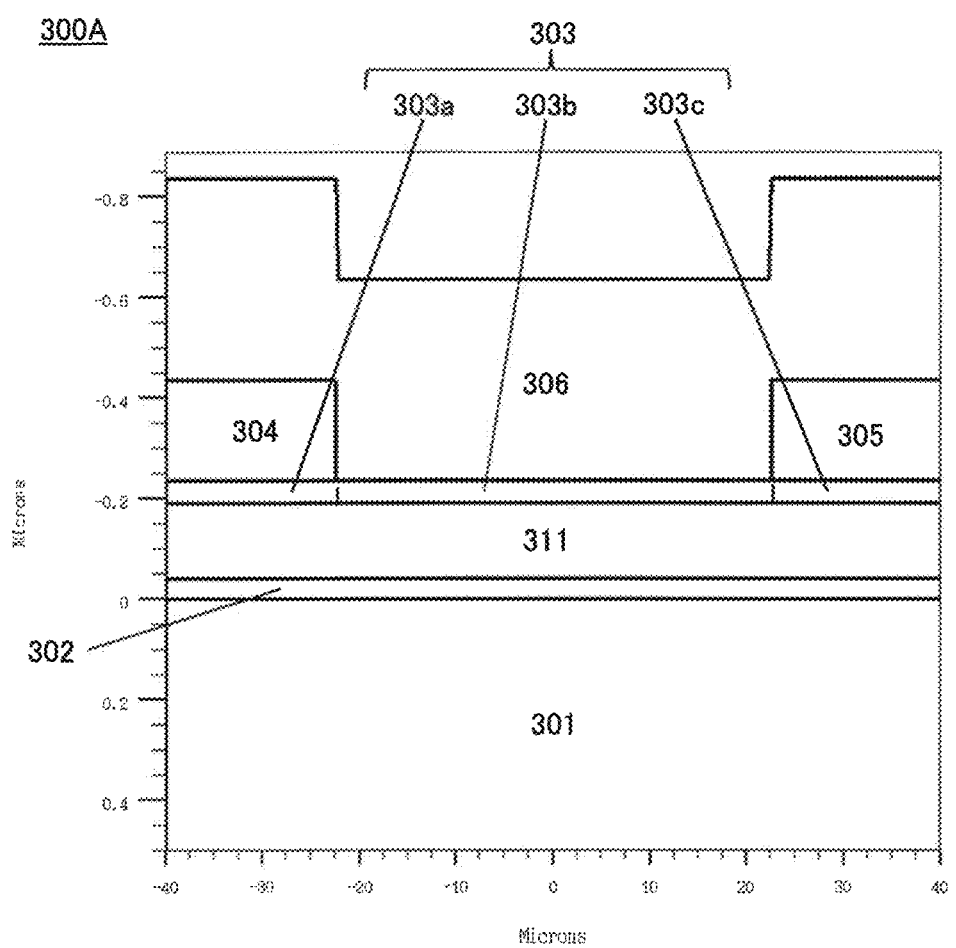
FIG. 19 shows calculation conditions of a transistor.

A structure of a transistor for the calculations for a bias-temperature stress test is described. A transistor 300A in FIG. 19 shows the structure and size of the transistor used in the calculations for the bias-temperature stress test. The transistor 300A includes a substrate 301, a conductor 302 serving as a gate electrode over the substrate 301, an insulator 311 over the conductor 302, an oxide semiconductor 303 over the insulator 311, a conductor 304 and a conductor 305 serving as a source electrode and a drain electrode over the oxide semiconductor 303, and an insulator 306 over the oxide semiconductor 303 and the conductors 304 and 305.

The parameters and constants of the transistor 300A used in the calculations are as follows. The conductor 302 has a work function of 5 eV. The insulator 311 has a thickness of 150 nm and a dielectric constant of 4.1. The oxide semiconductor 303 has a thickness of 45 nm, an electron affinity of 4.6 eV, a 3.2 eV energy barrier between the valence and conduction bands, a dielectric constant of 15, an electron mobility of 10 $cm^2/Vs$, and a hole mobility of 0.01 $cm^2/Vs$, and the effective densities of states in the valence and conduction bands are each $5.00 \times 10^{18}/cm^3$. An oxide semiconductor 303b in contact with the insulator 306 has a donor density of $6.60 \times 10^{-9}/cm^3$. An oxide semiconductor 303a and an oxide semiconductor 303c, which are just under the conductor 304 and the conductor 305, respectively, each have a donor density of $5.00 \times 10^{18}/cm^3$. The conductors 304 and 305 each have a work function of 4.6 eV. The insulator 306 has a dielectric constant of 4.1 and a thickness of 400 nm.

Figure 36A:
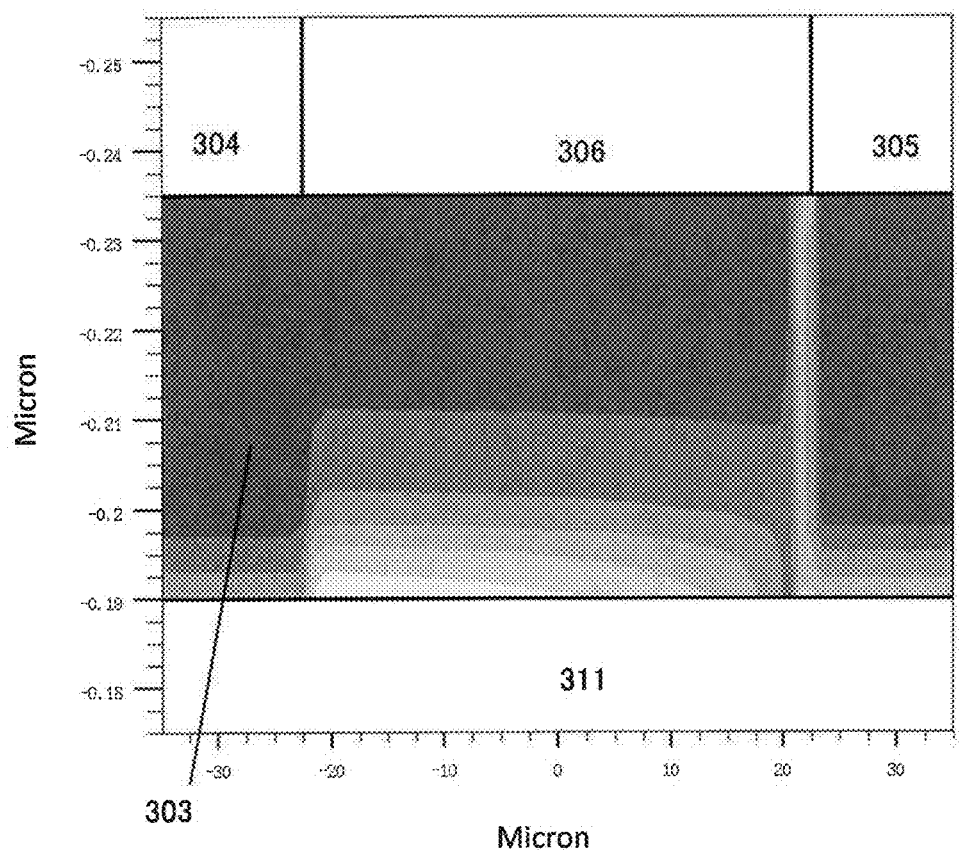
FIGS. 36A and 36B show calculation results of a transistor.
Figure 36B:
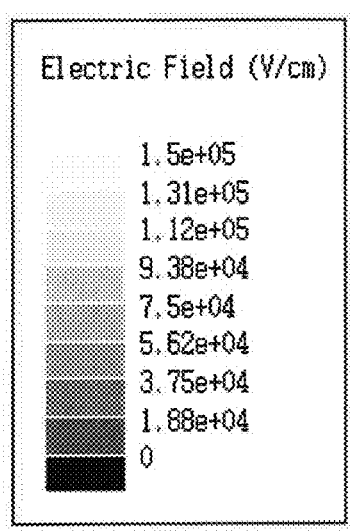

FIG. 36A shows the calculation results of an electric field distribution in the oxide semiconductor 303 of the transistor 300A, which was obtained when potentials of 20 V and 30 V were applied to the conductor 302 and the conductor 305, respectively, in the transistor 300A. FIG. 36B shows explanatory notes of the strength of the electric field. FIGS. 36A and 36B reveal that there is an electric field greater than or equal to $1.0 \times 10^5$ V/cm at the interface between the oxide semiconductor 303 and the insulator 311 and at a position of the oxide semiconductor 303, which is just under the boundary between the conductor 305 and the insulator 306. Note that the white color of the conductors 304 and 305 and the insulators 306 and 311 in FIG. 36A does not indicate an electric field inside the conductors 304 and 305 and the insulators 306 and 311; only the strength of the electric field in the oxide semiconductor 303 is shown.

Figure 35:
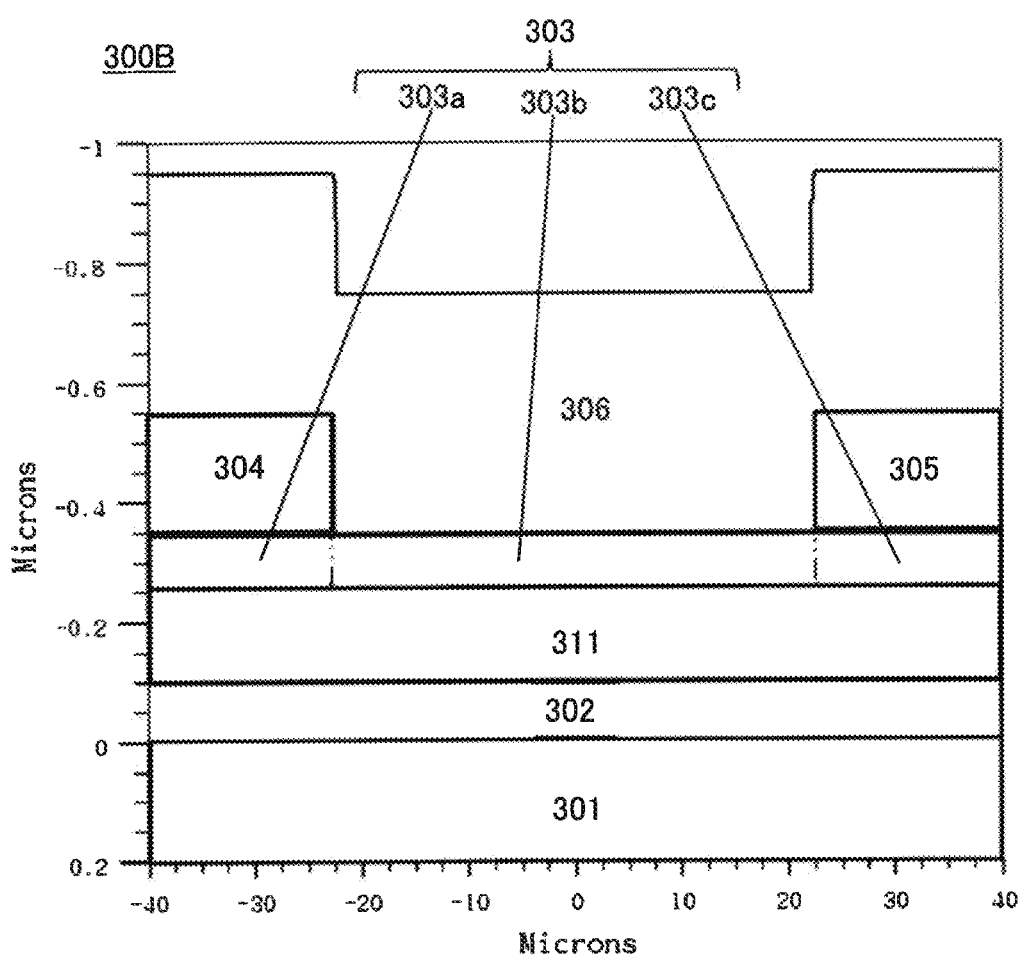
FIG. 35 shows calculation conditions of a transistor.

FIG. 35 illustrates a transistor 300B including the oxide semiconductor 303. The thickness of the oxide semiconductor is 100 nm and is the only difference from the transistor 300A.

Figure 37A:
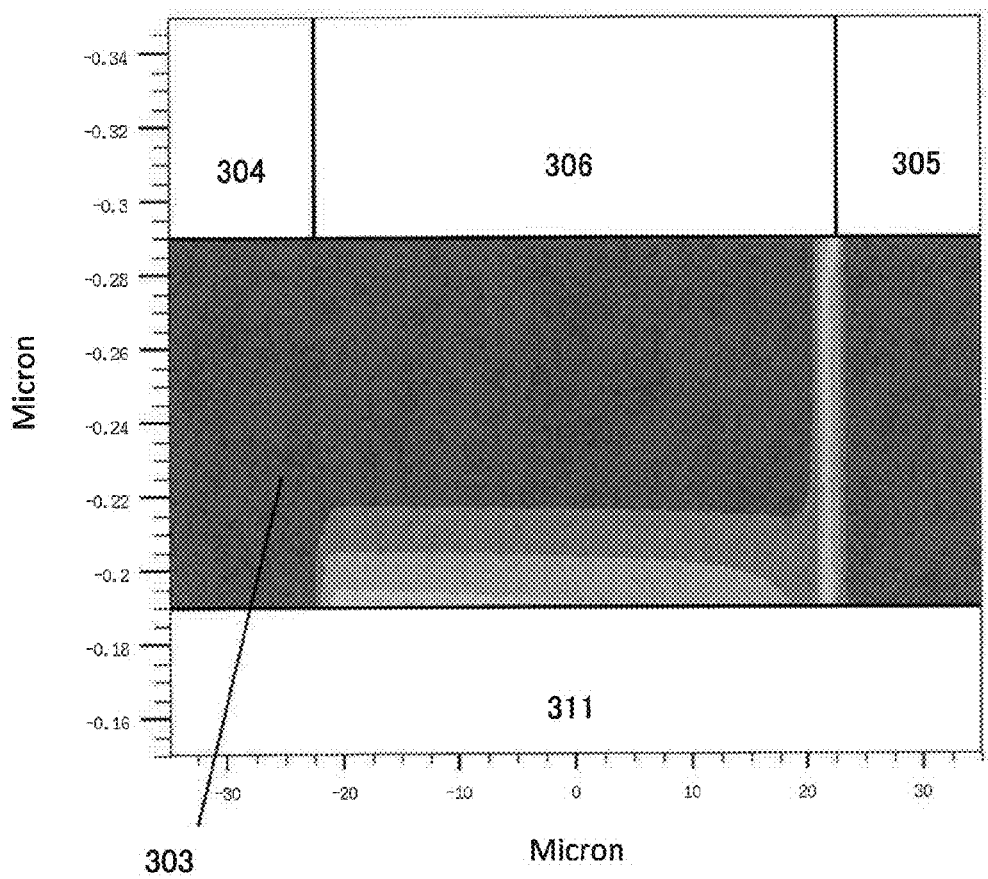
FIGS. 37A and 37B show calculation results of the transistor.
Figure 37B:
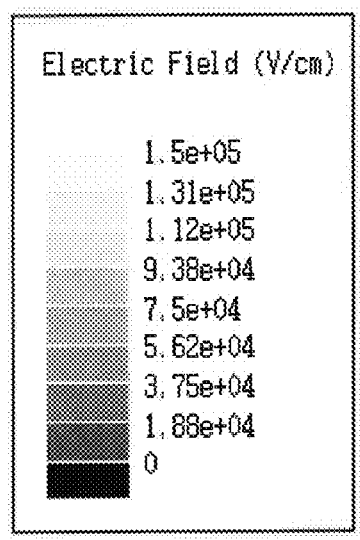

FIG. 37A shows the calculation results of an electric field in the oxide semiconductor 303 of the transistor 300B, which was obtained when potentials of 20 V and 30 V were applied to the conductor 302 and the conductor 305, respectively, in the transistor 300B. FIG. 37B shows explanatory notes of the strength of the electric field. FIGS. 37A and 37B reveal that there is an electric field greater than or equal to $5.62 \times 10^4$ V/cm at the interface between the oxide semiconductor 303 and the insulator 311 and at a position of the oxide semiconductor 303, which is just under the boundary between the conductor 305 and the insulator 306. Note that the white color of the conductors 304 and 305 and the insulators 306 and 311 in FIG. 37A does not indicate an electric field inside the conductors 304 and 305 and the insulators 306 and 311; only the strength of the electric field in the oxide semiconductor 303 is shown.

FIG. 36A and FIG. 37A show that, despite the thickness of the oxide semiconductor 303, application of high potentials to the conductors 302 and 305 causes generation of local electric fields at the interface between the oxide semiconductor 303 and the insulator 311 and at the position of the oxide semiconductor 303, which is just under the boundary between the conductor 305 and the insulator 306.

Continuous application of a strong local electric field in an oxide semiconductor might significantly increase the value of current flowing through the oxide semiconductor between the source electrode and the drain electrode after several hundreds or thousands of seconds, although depending on the constituent elements, structure, or density of the oxide semiconductor. The significant increase in current value may be attributed to oxygen vacancies $V_O$ generated by a local electric field in the oxide semiconductor.

$V_O$ generated in the oxide semiconductor forms DOS and serves as hole traps or the like. In addition, hydrogen included in the oxide semiconductor or in the source electrode, drain electrode, gate insulating film, or the like in contact with the oxide semiconductor might enters the sites of such oxygen vacancies $V_O$ and forms a donor level, increasing the donor density in the oxide semiconductor (hydrogen entering the sites of oxygen vacancies are also referred to as $V_OH$). As a bias-temperature stress test is continued, $V_O$ is increased and $V_OH$ might also be increased.

Figure 38:
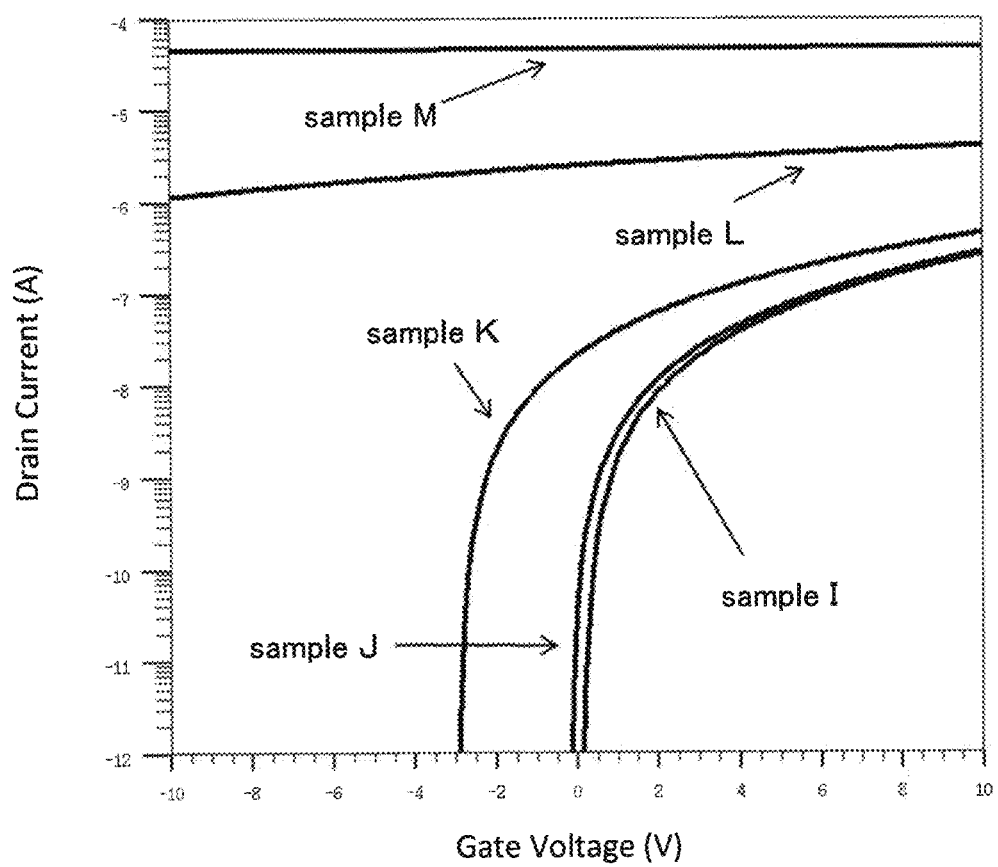
FIG. 38 shows calculation results of the transistor.

Next, the behavior of the transistor with various donor densities is described. FIG. 38 shows the calculation results of current-voltage characteristics of the transistor 300A described above. In the calculations, the oxide semiconductors 303 of samples had different donor densities.

The donor densities of a sample I, a sample J, a sample K, a sample L, and a sample M were $6.6 \times 10^{-9}/cm^3$, $1.0 \times 10^{16}/cm^3$, $1.0 \times 10^{17}/cm^3$, $1.0 \times 10^{18}/cm^3$, and $1.0 \times 10^{19}/cm^3$, respectively. FIG. 38 reveals that, as the donor density is increased, the threshold voltage of the transistor 300A is shifted in the negative direction. In particular, when the donor density is increased to $1.0 \times 10^{18}/cm^3$ or more, the threshold voltage is reduced to −10 V or less. The samples L and M were in an on-state at a gate-source voltage greater than or equal to −10 V and less than or equal to 10 V.

$V_OH$ generated when hydrogen is trapped by $V_O$ in an oxide semiconductor serve as a carrier supply source of an n-type donor in the oxide semiconductor. Therefore, the donor density of the oxide semiconductor is increased, which might shift the threshold voltage of the transistor including the oxide semiconductor in the negative direction, as shown in the above calculation results (FIG. 38).

As the bias-temperature stress test is further continued, $V_O$ is increased and $V_OH$ serving as a carrier supply source of an n-type donor is increased. Accordingly, the oxide semiconductor might be in an on-state at a gate-source voltage in a wide range, like the sample L and the sample M, as in FIG. 38.

Note that a generation mechanism of $V_O$ is not limited to the above. For example, in a formation process of the transistor 300A, after the conductor 302, the insulator 311, the oxide semiconductor 303, the conductor 304, the conductor 305, and the insulator 306 are formed over the substrate 301, a high-temperature baking in a nitrogen atmosphere might cause oxygen (an oxygen molecule, an oxygen atom, and an oxygen ion are collectively referred to as oxygen in this specification) in the oxide semiconductor 303 to react with hydrogen in the oxide semiconductor 303 and the insulator 306, the insulator 311, the conductor 304, or the conductor 305 in contact with the oxide semiconductor 303 to produce a water molecule (also referred to as water in this specification) or a hydroxide ion. Then, release of the water molecule or hydroxide ion from the transistor might generate $V_O$ in the oxide semiconductor 303.

The function of a transistor including an oxide semiconductor is degraded by oxygen vacancies $V_O$ in the oxide semiconductor and $V_OH$ formed of hydrogen entering the oxygen vacancies $V_O$. To fabricate a transistor having high drain breakdown voltage, a dense oxide semiconductor that does not allow a bias-temperature stress test to generate $V_O$ and has little $V_O$ and little hydrogen are needed to be formed.

Note that generation of an electric field, generation of oxygen vacancies, and current flow between a source and a drain, which are caused by a bias-temperature stress test as described above, are not necessarily caused only in the above-described structure of the transistor 300A and may be caused in a transistor having any structure.

(Method of Manufacturing Dense Oxide Semiconductor)

An example of a method of manufacturing a dense oxide semiconductor CAAC-OS is described below using FIG. 20.

The formation of an oxide semiconductor needs heat treatment after the deposition of the oxide semiconductor in Embodiment 1. As the heat treatment, a thermal annealing step, a rapid thermal annealing (RTA) step, and the like can be given, and an RTA step with a lamp is preferably employed to form a denser oxide semiconductor.

In particular, heat treatment with an RTA apparatus in an oxygen atmosphere is preferably performed to reduce oxygen vacancies $V_O$ in an oxide semiconductor CAAC-OS. Heat treatment in an oxygen atmosphere can supply oxygen without disordering crystallinity of a CAAC-OS, so that oxygen can enter the sites of oxygen vacancies $V_O$ generated in the deposition of the CAAC-OS.

FIG. 20 shows the results of the film densities of CAAC-OSs each including an In—Ga—Zn oxide, which were measured by X-ray reflectometry (XRR). A substrate to be provided with the In—Ga—Zn oxide was a silicon substrate including a 100-nm-thick thermal oxidation film and a 300-nm-thick oxynitride film over the thermal oxidation film. The In—Ga—Zn oxide was deposited under the following conditions: a sputtering target having an atomic ratio of In:Ga:Zn=1:1:1.2 was used; the distance between the target and the substrate was 60 mm; argon and oxygen were supplied at flow rates of 30 sccm and 15 sccm, respectively; the pressure was 0.7 Pa; and a 0.5 kW DC power source was used.

For a sample B, heat treatment was performed at 450° C. using a furnace in a nitrogen atmosphere for one hour and then performed at 450° C. using the same furnace in an oxygen atmosphere for one hour. For a sample C, heat treatment was performed at 500° C. using a furnace in a nitrogen atmosphere for one hour and then performed at 500° C. using the same furnace in an oxygen atmosphere for one hour. For a sample D, heat treatment was performed at 550° C. using a furnace in a nitrogen atmosphere for one hour and then performed at 550° C. using the same furnace in an oxygen atmosphere for one hour. For a sample E, heat treatment was performed at 700° C. using an RTA apparatus in an oxygen atmosphere for 30 secs. For a sample F, heat treatment was performed at 700° C. using an RTA apparatus in an oxygen atmosphere for 60 secs. For a sample G, heat treatment was performed at 700° C. using an RTA apparatus in an oxygen atmosphere for 120 secs. For a sample H, heat treatment was performed at 700° C. using an RTA apparatus in an oxygen atmosphere for 180 secs. The results of a sample A deposited under conditions without heat treatment (hereinafter, the conditions may be referred to as "as-depo") are also shown for reference.

As can be seen from FIG. 20, the film density of the sample A deposited under the conditions without heat treatment was the lowest, 6.24 g/cm$^3$, and the film densities of the sample B, the sample C, and the sample D each subjected to the heat treatment using a furnace were as low as that of the sample A, from 6.25 g/cm$^3$ to 6.26 g/cm$^3$ inclusive. The film densities of the sample E, the sample F, the sample G, and the sample H each subjected to the heat treatment using an RTA apparatus were each 6.28 g/cm$^3$ or more. Thus, the CAAC-OSs that are oxides having a higher film density than the oxide formed without heat treatment and the oxides formed using the heat treatment with a furnace were obtained.

As described above, an RTA step can increase the film density of an oxide semiconductor. In addition, as the temperature or time of the heat treatment employing an RTA step is increased, the film density of an oxide semiconductor can be increased to make the physical property thereof close to that of a single-crystal oxide semiconductor. Furthermore, the heat treatment using an RTA apparatus is also effective in improving productivity because it needs only a short time as compared with the case of using a common furnace.

(ESR Measurements)

A method of quantitative evaluation of excess oxygen and oxygen vacancies ($V_O$) in an oxide film by electron spin resonance (ESR) analysis is described using FIGS. 12A and 12B, FIGS. 21A to 21C, and FIG. 22.

The ESR analysis is performed by generating a magnetic field in a space in which a specimen is placed and irradiating the specimen with microwaves. The magnetic flux density ($H_0$) and/or the microwave frequency (v) are varied. The frequency (v) and magnetic flux density ($H_0$) values of the microwave absorbed by the specimen are used in the equation $g=hv/\mu_B H_0$ to give the parameter g-factor. Note that h and $\mu_B$ represent the Planck constant and the Bohr magneton, respectively, and both are constants.

The spin density corresponding to a signal at a g-factor of 2.001 among the signals observed by ESR represents the number of dangling bonds. The g-factor of the signal detected here may be greater than or equal to 1.90 and less than or equal to 2.01, preferably greater than or equal to 2.00 and less than or equal to 2.05.

The spin density corresponding to a signal at a g-factor of 1.93 among signals observed by ESR represents the number of oxygen vacancies ($V_O$). The g-factor of the signal detected here may be greater than or equal to 1.83 and less than or equal to 2.03, preferably greater than or equal to 1.90 and less than or equal to 1.95.

Here are shown the analysis results of the spin densities in an oxide semiconductor obtained in such a manner that, after the oxide semiconductor was formed, a silicon oxynitride film was formed over the oxide semiconductor and heat treatment was then performed.

A method of fabricating specimens is described. First, a 300-nm-thick silicon oxynitride film was formed over a quartz substrate. For the formation of the silicon oxynitride film, silane and dinitrogen monoxide were supplied at flow rates of 2.3 sccm and 800 sccm, respectively, as source gases into a treatment chamber, and a power of 50 W was supplied with the use of a 27.12 MHz high-frequency power source. The temperature of the quartz substrate was 400° C. during the formation of the silicon oxynitride film. After the formation, heat treatment was performed at 450° C. for one hour.

Next, oxygen was implanted to the silicon oxynitride film by an ion implantation method. The conditions of the oxygen implantation were as follows: an acceleration voltage of 60 kV and a dosage of 2×10$^{16}$ ions/cm$^2$.

Then, a 50-nm-thick In—Ga—Zn oxide film was formed over the silicon oxynitride film by a sputtering method. The In—Ga—Zn oxide film was formed under the following conditions: a sputtering target having an atomic ratio of 1:1:1.2 was used; argon and oxygen were supplied at flow rates of 30 sccm and 15 sccm, respectively, as sputtering gases into a deposition chamber of a sputtering apparatus; the pressure in the deposition chamber was controlled to be 0.4 Pa; and a DC power of 0.5 kW was supplied. Note that the substrate temperature was 300° C. during the formation of the In—Ga—Zn oxide.

After the formation, heat treatment was performed at 450° C. in a nitrogen atmosphere for one hour and then in an oxygen atmosphere for one hour.

Next, a 20-nm-thick silicon oxynitride film was formed over the In—Ga—Zn oxide film. The silicon oxynitride film was formed under the following conditions: the quartz substrate was placed in a treatment chamber of a plasma chemical vapor deposition (CVD) apparatus; silane and dinitrogen monoxide were supplied at flow rates of 1 sccm and 800 sccm, respectively, as source gases into the treatment chamber; and a power of 150 W was supplied with the use of a 60 MHz high-frequency power source. The temperature of the quartz substrate was 350° C. during the formation of the silicon oxynitride film. The pressure in the film formation was 40 Pa, which might not be suitable for a gate insulating layer used in a semiconductor device of one embodiment of the present invention.

Here, the specimen that was not subjected to heat treatment was a specimen I1. Then, the specimen that was subjected to heat treatment at 350° C. in an oxygen atmosphere for one hour was a specimen I2, and a specimen that was subjected to heat treatment at 400° C. in an oxygen atmosphere for one hour was a specimen I3.

The specimens were subjected to ESR measurements. The ESR measurements were performed under the following conditions: the measurement temperature was room temperature (25° C.), the high-frequency power (power of microwaves) of 9.5 GHz was 20 mW, and the direction of a magnetic field was parallel to a film surface of each specimen. Note that the lower limit of detection of the spin density corresponding to a signal at a g-factor of 1.93 due to oxygen vacancies in the In—Ga—Zn oxide was 1×10$^{17}$ spins/cm$^3$.

Figure 21A:
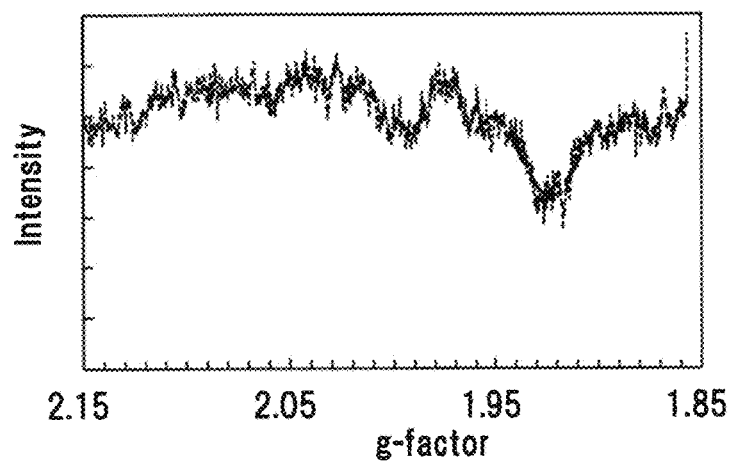
FIGS. 21A to 21C show ESR measurement results of oxide semiconductors.
Figure 21B:
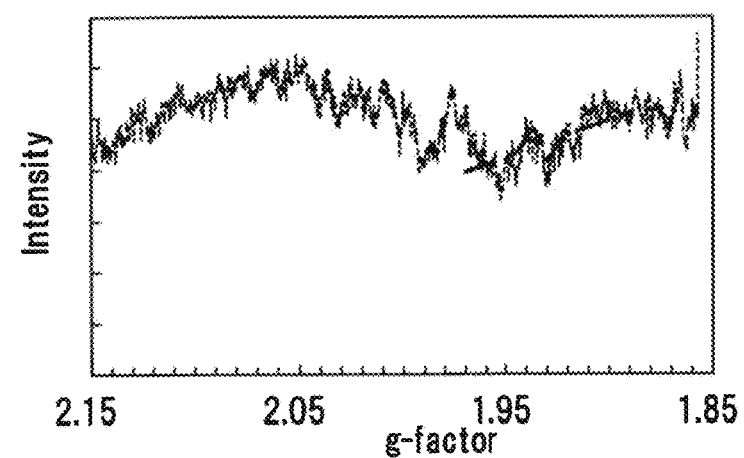
Figure 21C:
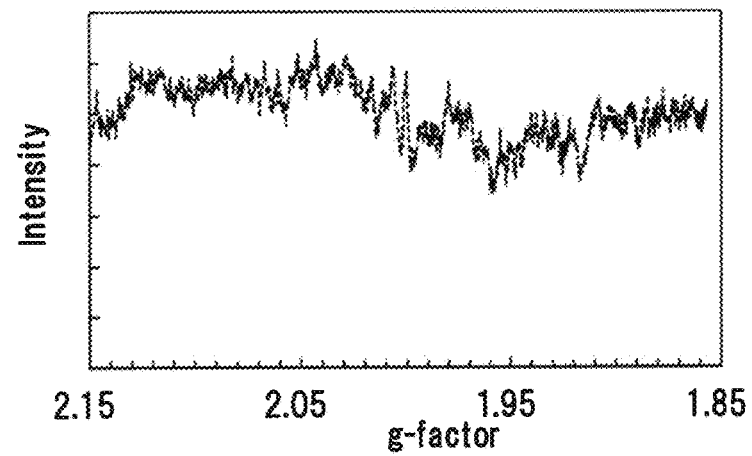

FIGS. 21A to 21C show the results of the ESR measurements. In the graphs shown in FIGS. 21A to 21C, the vertical axis represents a first-order derivative of the absorption intensity of a microwave, and the horizontal axis represents a g-factor. FIG. 21A, FIG. 21B, and FIG. 21C show the results of ESR measurements of the specimen I1, the specimen I2, and the specimen I3, respectively. FIGS. 21A to 21C also show values obtained by fitting with a Gaussian profile at a g-factor of 1.93 in the measurement results of the specimens. In each of FIGS. 21A to 21C, the dotted line indicates the measurement result and the solid line indicates the result of the fitting. The spin density corresponding to the absorption intensity of the microwave was obtained by calculating the integral value of the signal at a g-factor of around 1.93 with the fitted curve.

Figure 22:
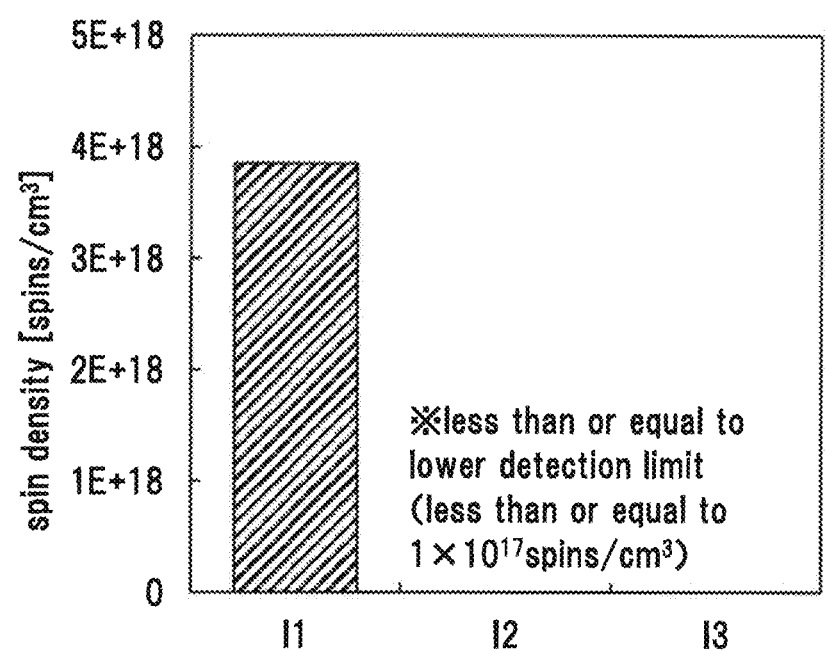
FIG. 22 shows spin densities of the oxide semiconductors.

FIG. 22 shows the spin densities. As seen from the result of the specimen I1, the spin density in the oxide semiconductor film was $3.9 \times 10^{18}$ spins/cm$^3$ owing to the formation of the silicon oxynitride film.

However, the spin density was decreased by heat treatment performed after the formation of the silicon oxynitride film, and became less than the lower limit of detection ($1 \times 10^{17}$ spins/cm$^3$) for both the specimen I2 and the specimen I3. Thus, oxygen vacancies generated in the oxide semiconductor after formation of the silicon oxynitride film can be filled by heat treatment that is performed while the oxide semiconductor is in contact with the silicon oxynitride film.

A transistor in FIG. 12B is described as an example. When heat treatment is performed using a film having a property of blocking oxygen as the insulator 408, oxygen released from one or both of the insulators 402 and 412 is prevented from being released to the outside of the semiconductor 406b of an oxide, so that more oxygen can be supplied to the semiconductor 406b of the oxide.

The heat treatment is preferably performed at a temperature higher than or equal to 300° C. and lower than 450° C., further preferably higher than or equal to 350° C. and lower than or equal to 400° C. In the case where a metal with a high oxygen affinity is used in the conductors 416a and 416b in contact with a semiconductor stacked layer 406 of the oxide, the heat treatment might allow the metal to extract oxygen from the semiconductor stacked layer 406 of the oxide. Thus, the temperature range may be appropriately set so that heat treatment is performed at such a temperature that the amount of oxygen supplied from the insulator 402 and the insulator 412 is larger than the amount of oxygen extracted to enter the conductor 416a and the conductor 416b.

The above heat treatment can reduce the number of oxygen vacancies in the semiconductor 406b of the oxide, thus stabilizing the characteristics of the semiconductor 406b of the oxide. In particular, when the channel length of the transistor is shortened, the effect of oxygen vacancies in the oxide semiconductor on the characteristics of the transistor becomes greater. Thus, the above heat treatment is performed to reduce the number of oxygen vacancies in the semiconductor 406b of the oxide, so that a highly reliable semiconductor device which can maintain normally-off characteristics can be provided even when the channel length is shortened.

The example of the transistor structure described above is not limited to that in FIGS. 12A and 12B. The film having a property of blocking oxygen may be used as the insulator 418. When the film having a property of blocking oxygen is located above the oxide semiconductor and/or the conductor, the transistor structure may be different from that in FIGS. 12A and 12B.

Furthermore, the use of ESR analysis can detect oxygen having an unpaired electron in the oxide semiconductor and a $SiO_X$ film in contact with the oxide semiconductor.

Oxygen vacancies generated in an oxide semiconductor in a device manufacturing process might change the electrical conductivity of the oxide semiconductor. The same occurs if water or hydrogen which forms an electron donor enters an oxide semiconductor. Such phenomena become factors of variation in the electric characteristics of a transistor using the oxide semiconductor. An oxide semiconductor is preferably formed in an oxygen-excess state so that a device can be constructed without generating oxygen vacancies.

Example 2

Structures of In—Sn—Zn oxides and the characteristics and reliability of transistors including the oxides are described below.

(In—Sn—Zn Oxide Structure 1)

Figure 40:
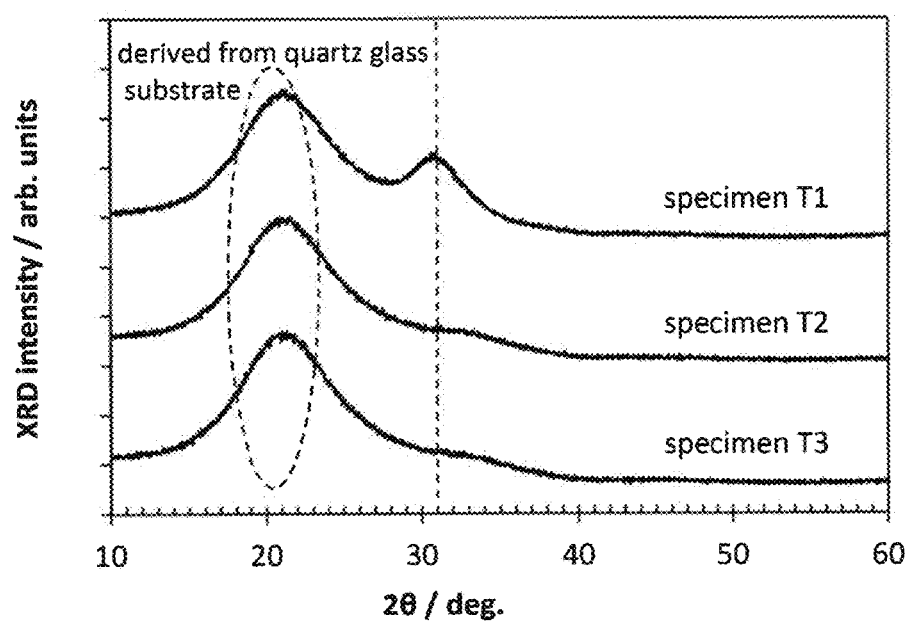
FIG. 40 shows structural analysis of In—Sn—Zn oxide semiconductors by XRD.

FIG. 40 shows X-ray diffraction (XRD) spectra of the In—Sn—Zn oxides by an out-of-plane method. A specimen T1 to a specimen T3 were each obtained by forming an In—Sn—Zn oxide over a quartz glass substrate using a magnetron sputtering method.

The specimen T1 was a sample obtained by forming an In—Sn—Zn oxide film under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition. The specimen T2 was a sample obtained by forming an In—Sn—Zn oxide film under the following conditions: a sputtering target having an atomic ratio of In:Sn:Zn=2:1:3 was used; argon and oxygen were supplied at flow rates of 20 sccm and 10 sccm, respectively, as sputtering gases into a deposition chamber; the pressure in the deposition chamber was controlled to be 0.4 Pa; a DC power of 200 W was supplied; and the substrate temperature was room temperature during deposition. The specimen T3 was a sample obtained by forming an In—Sn—Zn oxide film under the following conditions: a sputtering target having an atomic ratio of In:Sn:Zn=2:1:3 was used; argon and oxygen were supplied at flow rates of 98 sccm and 2 sccm, respectively, as sputtering gases into a deposition chamber; the pressure in the deposition chamber was controlled to be 1.0 Pa; a DC power of 100 W was supplied; and the substrate temperature was room temperature during deposition.

The spectrum of the specimen T1 has a peak at a diffraction angle (2θ) of 31°. The spectra of the specimens T2 and T3 have no peak at a diffraction angle (2θ) of 31°. The peaks of the spectra of the specimens T1 to T3 at a diffraction angle (2θ) of or near 21° are due to the quartz glass substrate.

The diffraction angle (2θ) of 31°, at which the peak of the spectrum of the specimen T1 is located, is identical with the diffraction angle (2θ) at which the peak of the XRD spectrum of the CAAC-OS in FIG. 3A is located. In other words, the spectrum of the specimen T1 in FIG. 40 indicates that the In—Sn—Zn oxide film of the specimen T1 has a CAAC-OS structure.

Figure 41A:
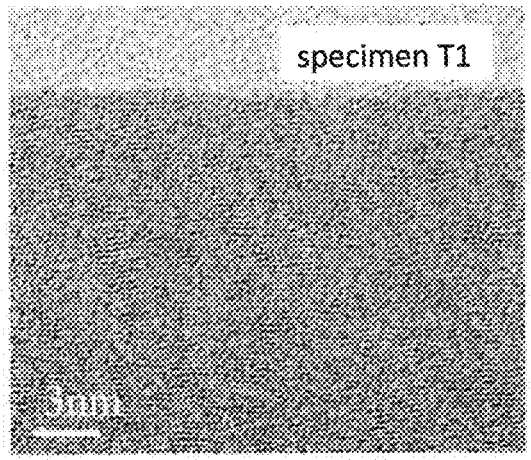
FIGS. 41A to 41C show cross-sectional TEM images of the In—Sn—Zn oxide semiconductors.
Figure 41B:
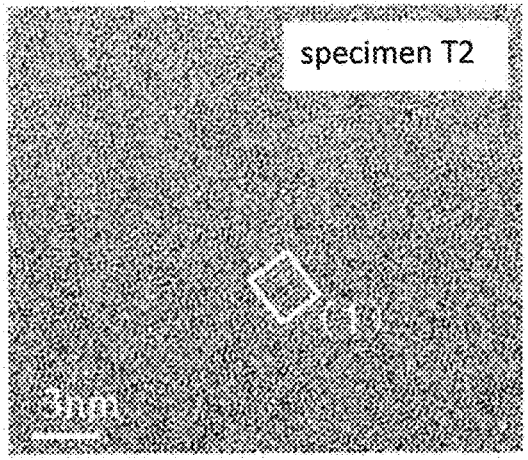
Figure 41C:
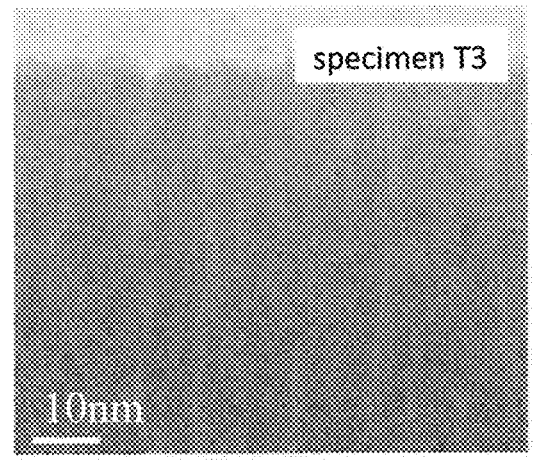

FIGS. 41A to 41C show TEM images of the specimens T1 to T3 observed from the direction substantially parallel to the specimen surface. FIG. 41A, FIG. 41B, and FIG. 41C show the cross-sectional TEM images of the specimen T1, the specimen T2, and the specimen T3, respectively.

FIG. 41A reveals that metal atoms are arranged in a layered manner. The layered arrangement of metal atoms in FIG. 41A is analogous to the layered arrangement of metal atoms of the CAAC-OS structure in FIGS. 1A and 1B. The specimen T1 shown in FIG. 41A may have a CAAC-OS structure.

FIG. 41B shows a periodic atomic order in a microscopic region (e.g., the region enclosed by the white frame (1) in FIG. 41B) and no crystal orientation in the whole film. FIG. 41B also shows no clear crystal grain boundary. Features of the nc-OS described in <nc-OS> in Embodiment 1 are as follows: the size of a crystal part included in a film is greater than or equal to 1 nm and less than or equal to 3 nm; the orientation of the whole film is not observed; and a grain boundary is not clearly observed. This indicates that the In—Sn—Zn oxide film of the specimen T2 has an nc-OS structure.

FIG. 41C shows that the In—Sn—Zn oxide film of the specimen T3 has a void. Since an a-like OS structure may have a void as described in <a-like OS> in Embodiment 1, the In—Sn—Zn oxide film of the specimen T3 may have an a-like OS structure.

In summary, FIG. 40 and FIGS. 41A to 41C reveal that the In—Sn—Zn oxides of the specimens T1, T2, and T3 have features of a CAAC-OS structure, an nc-OS structure, and an a-like OS structure, respectively. Furthermore, since the film densities of the specimens T1, T2, and T3 are 6.3 g/cm$^3$, 6.2 g/cm$^3$, and 5.9 g/cm$^3$, respectively, the In—Sn—Zn oxide film of the specimen T1 is a denser film than those of the specimens T2 and T3.

(In—Sn—Zn Oxide Structure 2)

Figure 42A:
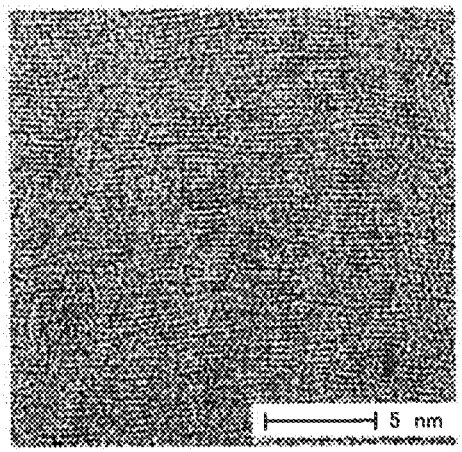
FIGS. 42A to 42C show an electron diffraction pattern of an In—Sn—Zn oxide semiconductor.
Figure 42B:
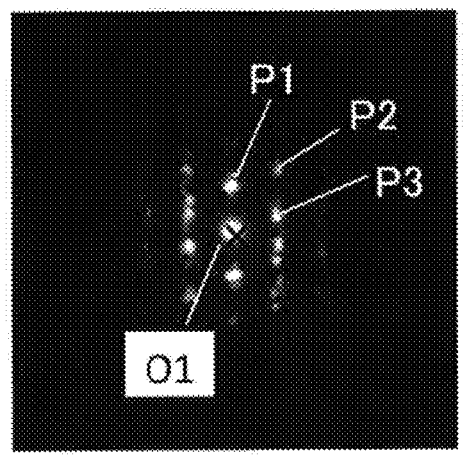
Figure 42C:
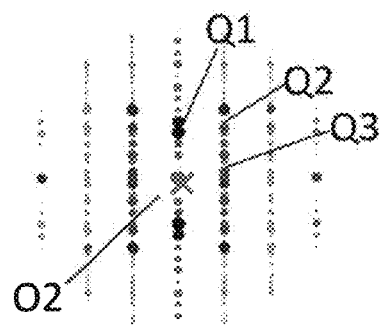

FIGS. 42A to 42C show a crystalline structure of a specimen including the In—Sn—Zn oxide film that was formed under the same conditions as those of the specimen T1 and then subjected to heat treatment at 800° C. in an atmosphere containing nitrogen at 80 vol % and oxygen at 20 vol %. FIG. 42A shows a TEM image obtained by observation from the direction substantially parallel to the specimen surface. FIG. 42B shows a diffraction pattern of a (100) plane obtained by nanobeam electron diffraction (NBED) of the specimen using a nanobeam with a probe diameter of 1 nm. FIG. 42C shows a diffraction pattern of a (100) plane obtained by calculation from the structure of InGaZn$_2$O$_5$ having a homologous phase.

In FIG. 42B, the d values of spots P1, P2, and P3 are 0.285 nm, 0.172 nm, and 0.281 nm, respectively. The segment between the spot P1 and the point O1 and the segment between the spot P2 and the point O1 form an angle (hereinafter, also referred to as ∠P1O1P2) of 36.6°. The segment between the spot P2 and the point O1 and the segment between the spot P3 and the point O1 form an angle (hereinafter, also referred to as ∠P2O1P3) of 38.1°. The segment between the spot P3 and the point O1 and the segment between the spot P1 and the point O1 form an angle (hereinafter, also referred to as ∠P3O1P1) of 74.4°.

In FIG. 42C, the d values of spots Q1, Q2, and Q3 are 0.282 nm, 0.177 nm, and 0.276 nm, respectively. The segment between the spot Q1 and the point O2 and the segment between the spot Q2 and the point O2 form an angle (hereinafter, also referred to as ∠Q1O2Q2) of 38.3°. The segment between the spot Q2 and the point O2 and the segment between the spot Q3 and the point O2 form an angle (hereinafter, also referred to as ∠Q2O2Q3) of 37.5°. The segment between the spot Q3 and the point O2 and the segment between the spot Q1 and the point O2 form an angle (hereinafter, also referred to as ∠Q3O2Q1) of 75.8°.

FIGS. 42B and 42C show that there are substantial correspondences between the d values of the spots P1 and Q1, between the d values of the spots P2 and Q2, between the d values of the spots P3 and Q3, between ∠P1O1P2 and ∠Q1O2Q2, between ∠P2O1P3 and ∠Q2O2Q3, and between ∠P3O1P1 and ∠Q3O2Q1. This indicates that the structure of the In—Sn—Zn oxide film is analogous to that of InGaZn$_2$O$_5$ having a homologous phase.

(Reliability of Transistor Including In—Sn—Zn Oxide)

Next, bias-temperature stress tests of transistors each including an In—Sn—Zn oxide are described.

Figure 39:
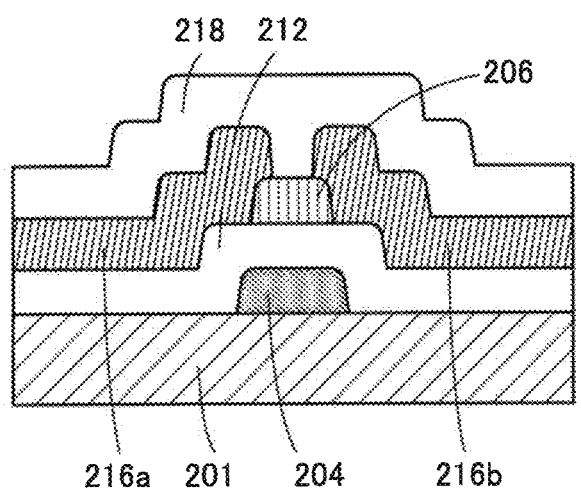
FIG. 39 illustrates a structural example of a transistor.

FIG. 39 is a schematic view illustrating a structure of a transistor. A transistor 200 includes a conductor 204 (hereinafter, also referred to as a gate electrode) over a substrate 201, an insulator 212 over the conductor 204, a semiconductor 206 over the insulator 212, a conductor 216a (hereinafter, also referred to as a source electrode) and a conductor 216b (hereinafter, also referred to as a drain electrode) which are provided with a space therebetween over the semiconductor 206, and an insulator 218 over the conductors 216a and 216b and the semiconductor 206.

Figure 43:
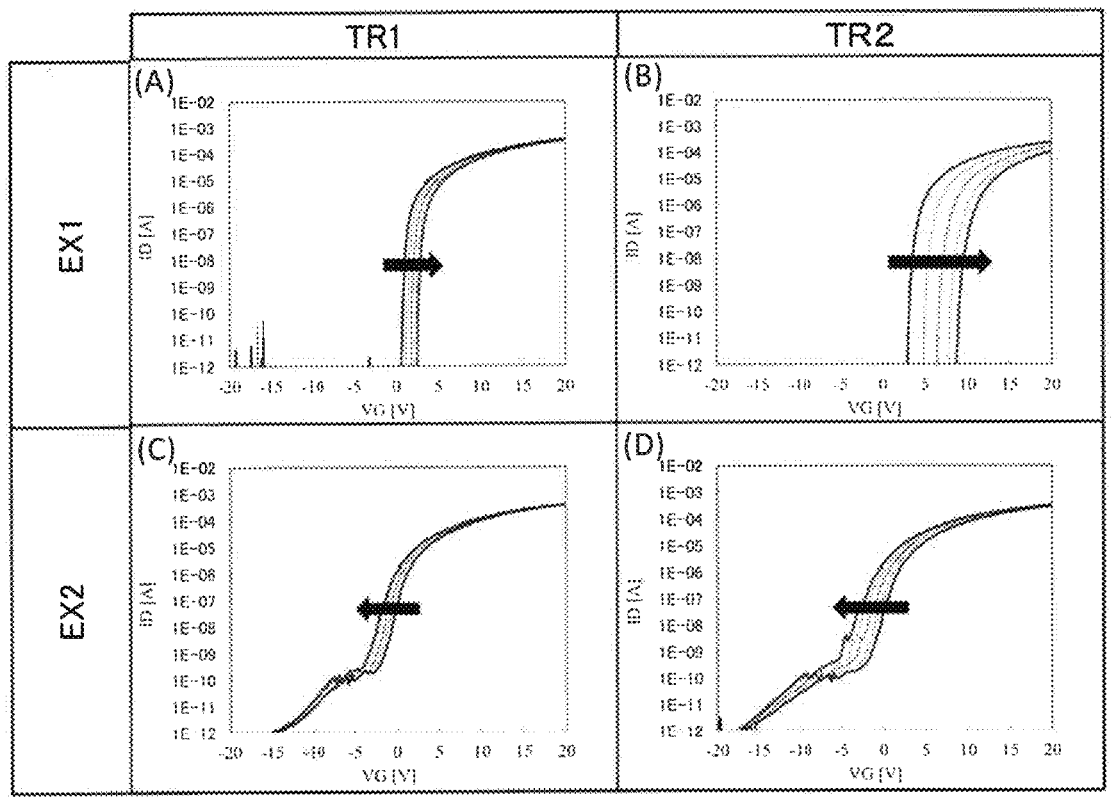
FIG. 43 shows results of bias-temperature stress tests of transistors.

FIG. 43 shows the results of a test EX1 and a test EX2 on a transistor TR1 and a transistor TR2.

The test EX1 is a positive gate bias-temperature stress test in a dark environment, under the conditions where the temperature of a heat source that applied heat to the transistor was 60° C., the potential applied to the gate electrode was 30 V, the potential applied to the source electrode was 0 V, and the potential applied to the drain electrode was 0 V. The test EX2 is a negative gate bias-temperature stress test in which measurements were performed with the transistors irradiated with light from a white LED, under the conditions where the temperature of a heat source that applied heat to the transistor was 60° C., the potential applied to the gate electrode was −30 V, the potential applied to the source electrode was 0 V, and the potential applied to the drain electrode was 0 V. The data obtained by each of the tests EX1 and EX2 are current-voltage characteristics immediately after the start of the test (0 secs) and after the elapse of 1.0×10$^2$ secs, 6.0×10$^2$ secs, 1.8×10$^3$ secs, and 3.6×10$^3$ secs from the start of the test. The symbol I$_D$ [A] represents drain current I$_D$ and the symbol VG [V] represents gate voltage V$_{gs}$.

Structures of the transistors TR1 and TR2 are specifically described. A schematic view of each of the transistors TR1 and TR2 are as illustrated in FIG. 39. The conductor 204 is a 150-nm-thick tungsten film formed by a sputtering method. The insulator 212 is a stack of a 400-nm-thick silicon nitride film and a 50-nm-thick silicon oxynitride film. The conductors 216a and 216b are a stacked layer of a 50-nm-thick tungsten film, a 400-nm-thick aluminum film, and a 100-nm-thick titanium film formed by a sputtering method. The insulator 218 is a 450-nm-thick silicon oxynitride film.

The semiconductor 206 of the transistor TR1 is a 20-nm-thick film of an In—Sn—Zn oxide having a CAAC-OS structure formed under the same conditions as those of the specimen T1. The transistor TR1 has a channel length of 6 μm and a channel width of 50 μm. The semiconductor 206 of the transistor TR2 is a 20-nm-thick film of an In—Sn—Zn oxide having an nc-OS structure formed under the same conditions as those of the specimen T2. The transistor TR2 has a channel length of 6 μm and a channel width of 50 μm.

The results A and B in FIG. 43 show that a positive shift in threshold voltage is smaller in the transistor TR1 than in the transistor TR2. The results C and D in FIG. 43 show that a negative shift in threshold voltage is smaller in the transistor TR1 than in the transistor TR2. In other words, a transistor including the In—Sn—Zn oxide having a CAAC-OS structure has higher reliability than a transistor including the In—Sn—Zn oxide having an nc-OS structure.

Figure 44:
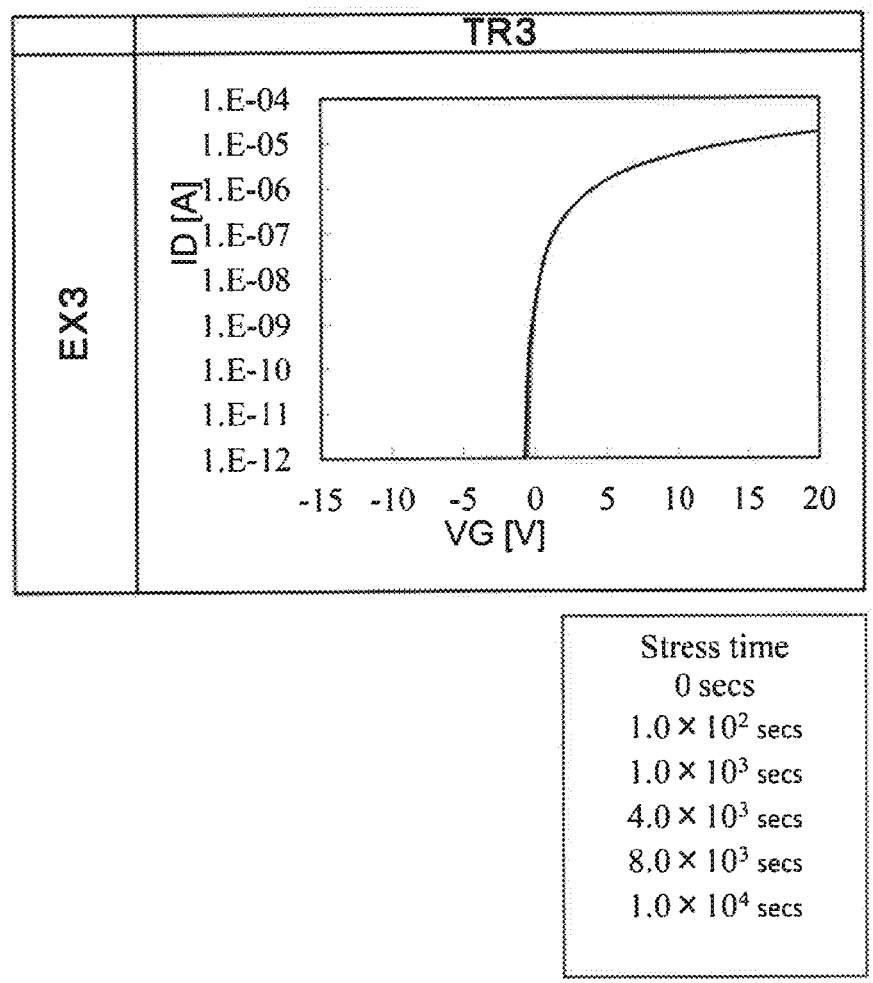
FIG. 44 shows results of a bias-temperature stress test of a transistor.

FIG. 44 shows the results of a test EX3 of a transistor TR3.

The test EX3 is a temperature stress test in a dark environment under the conditions where the temperature of a heat source that applied heat to the transistor was 50° C., the potential applied to the gate electrode (hereinafter, also referred to as gate voltage) was 20 V, the potential applied to the source electrode (hereinafter, also referred to as source voltage) was 0 V, and the potential applied to the drain electrode (hereinafter, also referred to as drain voltage) was 20 V. The data obtained by the test EX3 are current-voltage characteristics immediately after the start of the test (0 secs) and after the elapse of 1.0×10$^2$ secs, 1.0×10$^3$ secs, 4.0×10$^3$ secs, 8.0×10$^3$ secs, and 1.0×10$^4$ secs after the start of the test.

A structure of the transistor TR3 is described. The transistor TR3 has the outline illustrated in the schematic view of FIG. 39, like the transistors TR1 and TR2. The conductor 204 is a 150-nm-thick tungsten film formed by a sputtering method. The insulator 212 is a stack of a 50-nm-thick silicon nitride film and a 150-nm-thick silicon oxynitride film. The conductors 216a and 216b are a stacked layer of a 50-nm-thick tungsten film, a 400-nm-thick aluminum film, and a 100-nm-thick titanium film formed by a sputtering method. The insulator 218 is a 450-nm-thick silicon oxynitride film.

The semiconductor 206 of the transistor TR3 is a 10-nm-thick film of an In—Sn—Zn oxide film having a CAAC-OS structure formed under the same conditions as those of the specimen T1. The transistor TR3 has a channel length of 6 μm and a channel width of 50 μm.

FIG. 44 shows current-voltage characteristics measured from the time immediately after the start of the test (0 secs) to the time after the elapse of $1.0 \times 10^4$ secs. The symbol $I_D$ [A] represents drain current $I_D$ and the symbol VG [V] represents gate voltage $V_{gs}$. The curves of the current-voltage characteristics measured from the time immediately after the start of the test (0 secs) to the time after the elapse of $1.0 \times 10^4$ secs all overlap with each other. This means that the test EX3 does not cause a shift in the threshold voltage of the transistor TR3. In other words, the In—Sn—Zn oxide film having a CAAC-OS structure has high resistance to drain voltage stress. Furthermore, observation of no drain current indicates generation of no carriers of electrons or holes due to impact ionization.

(CPM Measurements of In—Sn—Zn Oxides)

Next, the measurement results of the density of localized states of the In—Sn—Zn oxides by a constant photocurrent method (CPM) are described. In general, by reducing the density of localized states of a material used as a channel formation region of a transistor, the transistor can have stable electrical characteristics.

In order that the transistor can have a high field-effect mobility and stable electrical characteristics, the absorption coefficient due to the localized states obtained by the CPM measurements is preferably lower than $1 \times 10^{-3}$ cm$^{-1}$, further preferably lower than $3 \times 10^{-4}$ cm$^{-1}$.

The In—Sn—Zn oxides obtained by the CPM measurements are described. The specimen T4 of an In—Sn—Zn oxide having an nc-OS structure and the specimen T5 of an In—Sn—Zn oxide having a CAAC-OS structure were each obtained by the CPM measurements.

The specimen T4 was a sample obtained by forming a 100-nm-thick In—Sn—Zn oxide film over a quartz substrate under the following conditions: a sputtering target having an atomic ratio of In:Sn:Zn=2:1:3 was used; argon and oxygen were supplied at flow rates of 20 sccm and 10 sccm, respectively, as sputtering gases into a deposition chamber; the pressure in the deposition chamber was controlled to be 0.4 Pa; a DC power of 200 W was supplied; and the substrate temperature was room temperature during deposition. The In—Sn—Zn oxide having an nc-OS structure can be formed under these conditions as described in "In—Sn—Zn oxide structure 1".

The specimen T5 was a sample obtained by forming a 100-nm-thick In—Sn—Zn oxide film over a quartz substrate under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition. The In—Sn—Zn oxide film having a CAAC-OS structure can be formed under these conditions as described in "In—Sn—Zn oxide structure 1".

To increase the accuracy of the CPM measurements, the thicknesses of the measured In—Sn—Zn oxide films having an nc-OS structure and a CAAC-OS structure were each 100 nm.

For the CPM measurements, a first electrode and a second electrode need to be provided in each of the In—Sn—Zn oxide film of the specimen T4 and the In—Sn—Zn oxide film of the specimen T5. As these electrodes, a 150-nm-thick tungsten film was formed by a sputtering method.

In the CPM measurements, the amount of light with which a surface of the specimen between terminals is irradiated is adjusted so that a photocurrent value is kept constant in the state where voltage is applied between the first electrode and the second electrode provided in contact with the specimen T4 or the specimen T5, and then an absorption coefficient is derived from the amount of the irradiation light at each wavelength. In the CPM measurements, when the specimen has a defect, the absorption coefficient of energy which corresponds to a level at which the defect exists (calculated from a wavelength) is increased. The increase in the absorption coefficient is multiplied by a constant, whereby the defect density of the specimen can be obtained.

Figure 45A:
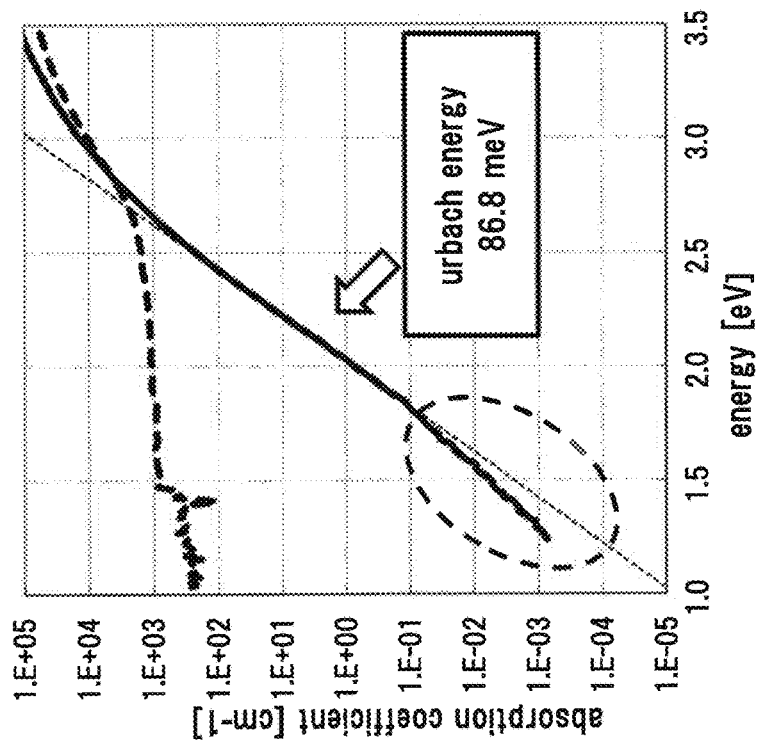
FIGS. 45A and 45B show CPM measurement results of In—Sn—Zn oxide semiconductors.
Figure 45B:
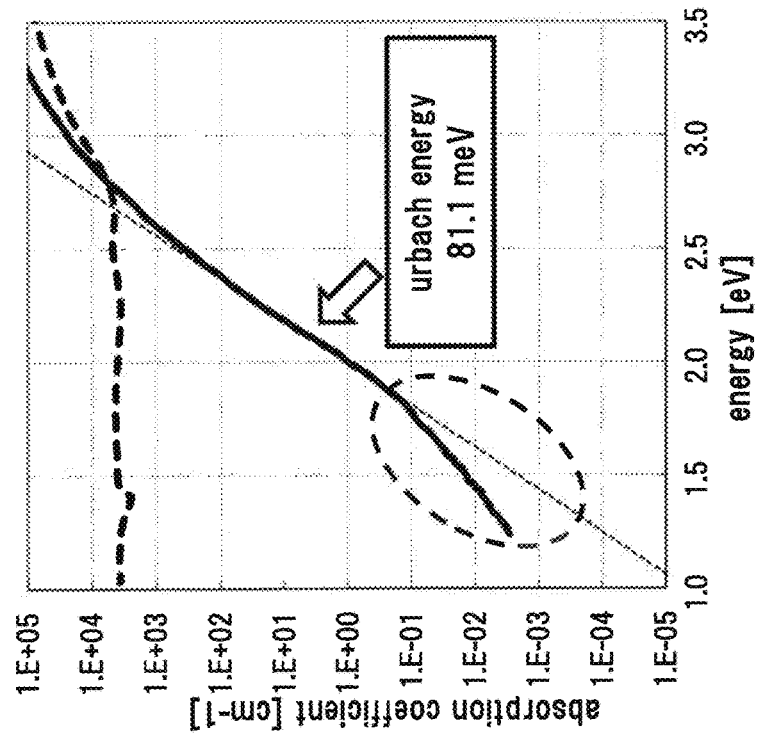

FIGS. 45A and 45B show the results of fitting the absorption coefficient (indicated by the dotted line) measured using a spectrophotometer, the absorption coefficient (indicated by the solid line) obtained by the CPM measurements, and an extrapolated straight line (indicated by the thin dotted line and also referred to as a background) corresponding to a straight portion of the absorption coefficient obtained by the CPM measurements. In FIGS. 45A and 45B, the energy range is higher than or equal to the energy gap of the In—Sn—Zn oxide films of the specimens T4 and T5.

The straight portion in the curve indicating the absorption coefficient represents absorption due to the Urbach tail, and it is known that the slope of the straight portion increases due to disarrangement of atoms or lattice distortion depending on temperature in the case of amorphous silicon or the like, for example. In FIGS. 45A and 45B, a calculated value of Urbach energy is shown as an indicator of the slope of the absorption coefficient due to the Urbach tail. Here, the Urbach energy is defined as an energy difference when the absorption coefficient changes by one digit. As the value of Urbach energy increases, the slope of the straight portion of the absorption coefficient is lower. Note that the Urbach energy obtained based on the absorption coefficient obtained by the CPM measurements was 81.1 meV for the specimen T4 and 86.8 meV for the specimen T5. This indicates that disarrangement of atoms or lattice distortion depending on temperature is less likely to occur in the In—Sn—Zn oxide having a CAAC-OS structure of the specimen T5 than in the In—Sn—Zn oxide having an nc-OS structure of the specimen T4.

As for an energy value around the center of the band gap, a portion out of the background represents absorption due to defect states in a semiconductor. As the density of defect states increases, the difference with the background increases.

Figure 46:
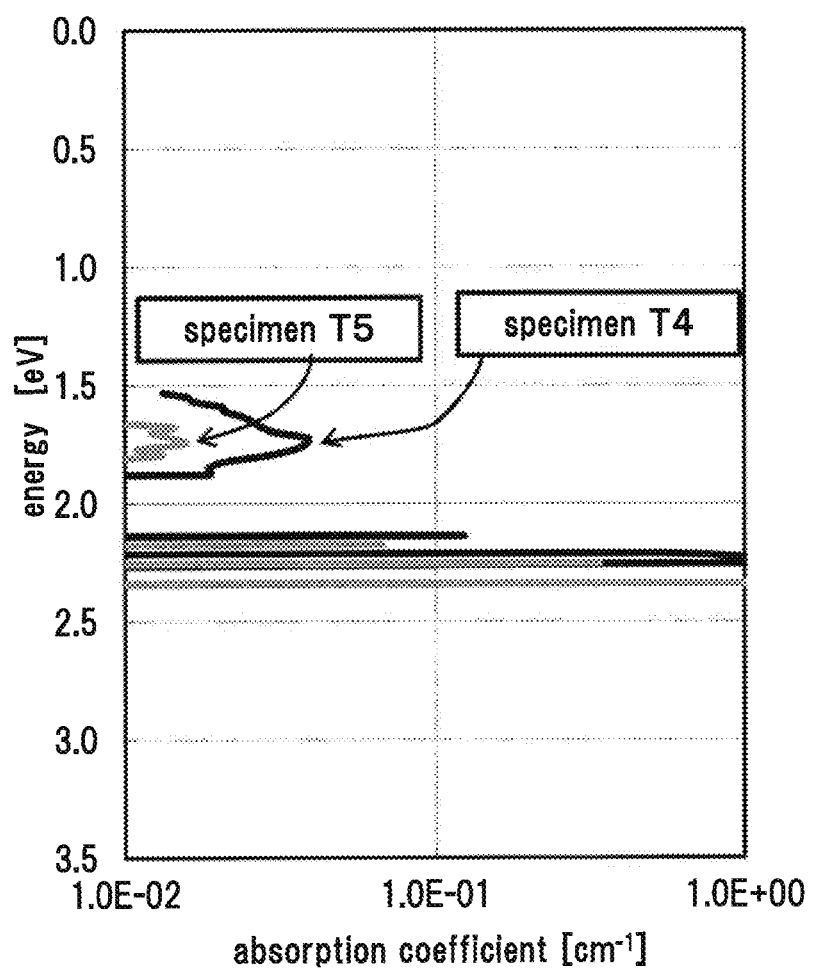
FIG. 46 shows CPM measurement results of the In—Sn—Zn oxide semiconductors.

The integral value of the absorption coefficient in the energy range was derived in such a manner that a background was subtracted from the absorption coefficient obtained by the CPM measurements in the energy range shown with the broken line circle in each of FIGS. 45A and 45B (see FIG. 46). As a result, the absorption coefficients due to the localized states of the specimen T4 and the specimen T5 were found to be $4.41 \times 10^{-2}$ cm$^{-1}$ and $2.85 \times 10^{-2}$ cm$^{-1}$, respectively.

The absorption coefficients due to the localized states obtained here are probably due to an impurity or a defect. Thus, the absorption coefficient due to the localized state of the specimen T5 is lower than the absorption coefficient due to the localized state of the specimen T4, and accordingly, the In—Sn—Zn oxide having a CAAC-OS structure was found to have a lower density of states due to an impurity or a defect than the In—Sn—Zn oxide having an nc-OS structure.

A transistor including the In—Sn—Zn oxide semiconductor, which is described as an example in this example, in a channel formation region can be used in the semiconductor device according to one embodiment of the present invention, so that a semiconductor device having high reliability and a property of withstanding high voltage can be provided.

The oxide semiconductor described as an example in this example is not limited to the In—Sn—Zn oxide. For example, an In—Ga—Zn oxide may be used instead of the In—Sn—Zn oxide in some cases.

This example can be combined as appropriate with any of the other embodiments in this specification.

Example 3

Example 2 shows the results of the test EX3 on the transistor TR3 including an In—Sn—Zn oxide with a channel length of 6 μm, and the test was the temperature stress test performed in a dark environment from 0 secs to $1.0 \times 10^4$ secs with a gate voltage of 20 V, a drain voltage of 20 V, a source voltage of 0 V, and a heat source temperature of 50° C. This example shows the results of temperature stress tests of transistors each including an In—Sn—Zn oxide having a CAAC-OS structure, and the tests were performed for $1.0 \times 10^4$ secs or more. This example also shows cause analysis of the results and the results of calculations using a model constructed for the test results.

Experiment 1

Figure 47:
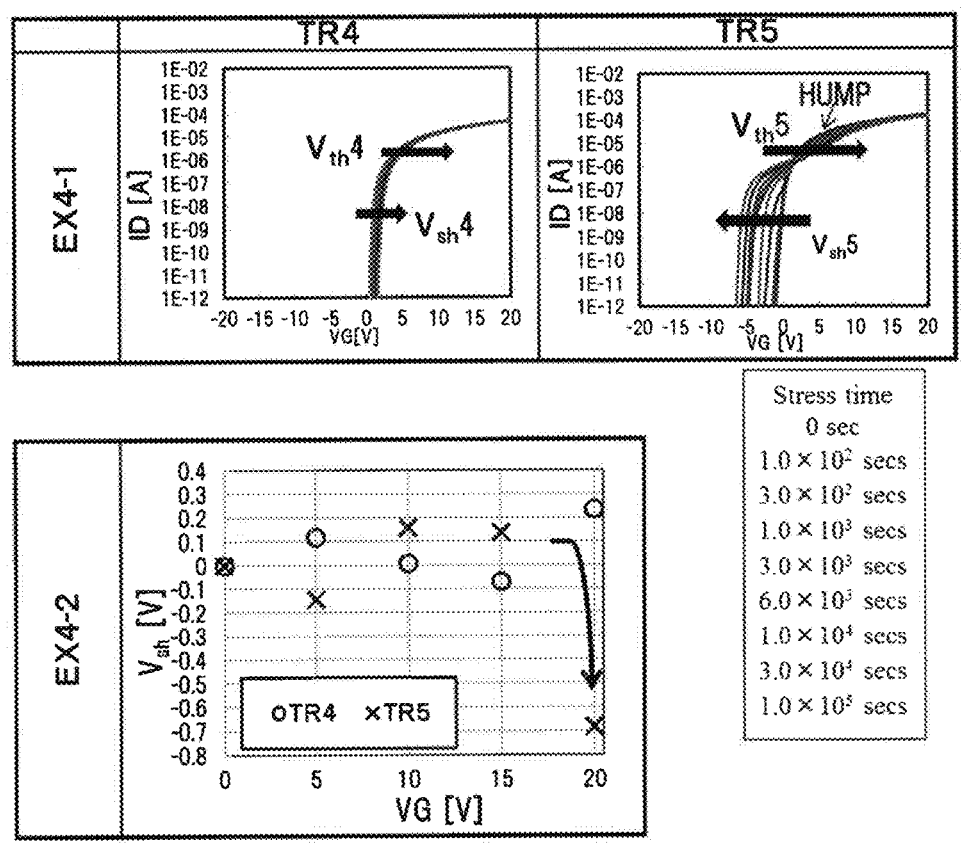
FIG. 47 shows results of bias-temperature stress tests of transistors.

FIG. 47 shows the results of a test EX4-1 on a transistor TR4 and a transistor TR5.

The transistor TR4 is a transistor including an In—Ga—Zn oxide film having a CAAC-OS structure with a channel length of 8 μm and a channel width of 50 μm. The transistor TR4 has a structure similar to that of the transistor 200 illustrated in the schematic view of FIG. 39. The transistor TR4 includes the conductor 204 which was a 150-nm-thick tungsten film formed by a sputtering method, the insulator 212 which was a stacked layer of a 400-nm-thick silicon nitride film and a 50-nm-thick silicon oxynitride film, the conductors 216a and 216b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The transistor TR4 includes, as the semiconductor 206, a 35-nm-thick In—Ga—Zn oxide film formed by a sputtering method. The In—Ga—Zn oxide film was formed under the following conditions: a sputtering target having an atomic ratio of In:Ga:Zn=1:1:1.2 was used; argon and oxygen were supplied at flow rates of 20 sccm and 10 sccm, respectively, as sputtering gases into a deposition chamber; the pressure in the deposition chamber was controlled to be 0.4 Pa; a DC power of 200 W was supplied; and the substrate temperature was 300° C. during deposition.

The transistor TR5 is a transistor including an In—Sn—Zn oxide film having a CAAC-OS structure with a channel length of 8 μm and a channel width of 50 μm. The transistor TR5 has a structure similar to that of the transistor 200 illustrated in the schematic view of FIG. 39. The transistor TR5 includes the conductor 204 which was a 150-nm-thick tungsten film formed by a sputtering method, the insulator 212 which was a stacked layer of a 400-nm-thick silicon nitride film and a 50-nm-thick silicon oxynitride film, the conductors 216a and 216b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The transistor TR5 includes, as the semiconductor 206, a 20-nm-thick In—Sn—Zn oxide film formed by a sputtering method. The In—Sn—Zn oxide film was formed under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition.

The test EX4-1 was a temperature stress test in a dark environment under the conditions where the temperature of a heat source that applied heat to each of the transistors TR4 and TR5 was 50° C., the potential applied to the gate electrode of each transistor was 20 V, the potential applied to the drain electrode of each transistor was 20 V, and the potential applied to the source electrode of each transistor was 0 V. The data obtained by the test EX4-1 are current-voltage characteristics immediately after the start of the test (0 secs) and after the elapse of $1.0 \times 10^2$ secs, $3.0 \times 10^2$ secs, $1.0 \times 10^3$ secs, $3.0 \times 10^3$ secs, $6.0 \times 10^3$ secs, and $1.0 \times 10^4$ secs, $3.0 \times 10^4$ secs, and $1.0 \times 10^5$ secs after the start of the test. The symbol $I_D$ [A] represents drain current $I_D$ and the symbol VG [V] represents gate voltage $V_{gs}$.

When a change in gate voltage $V_{gs}$ with a drain current $I_D$ of $1.0 \times 10^{-12}$ A is referred to as a shift value, the shift value of the transistor TR4 subjected to the test EX4-1 for $1.0 \times 10^5$ secs was +0.32 V (this shift is indicated by the arrow $V_{sh}4$ in FIG. 47) and the shift value of the transistor TR5 subjected to the test EX5 for $1.0 \times 10^5$ secs was −5.32 V (this shift is indicated by the arrow $V_{sh}5$ in FIG. 47). Changes in threshold voltage during the test EX4-1 performed for $1.0 \times 10^5$ secs were +1.27 V for the transistor TR4 (this shift is indicated by the arrow $V_{th}4$ in FIG. 47) and +3.24 V for the transistor TR5 (this shift is indicated by the arrow $V_{th}5$ in FIG. 47). Note that there is no increase over time in the drain current $I_D$ of the transistors TR4 and TR5.

Particularly for the transistor TR5, the shift value was a negative value and the threshold voltage was moved in the positive direction, forming a hump in the current-voltage characteristics (denoted by HUMP in FIG. 47). Thus, the long-time temperature stress test on the transistor including an In—Sn—Zn oxide in a dark environment resulted in a significant deterioration in the transport property of the transistor.

In a test EX4-2, temperature stress tests were performed on the transistors TR4 and TR5 under the conditions where the potential applied to the drain electrode was 20 V, the potential applied to the source electrode was 0 V, the potential applied to the gate electrode was set to 0 V, 5 V, 10

V, 15 V, and 20 V, and the temperature of the heat source was 50° C. The shift value $V_{sh}$ of each transistor after $2.4 \times 10^4$ secs are shown in the graph.

The shift value $V_{sh}$ of the transistor TR4 was greater than −0.2 V and less than 0.2 V for potentials from 0 V to 15 V applied to the gate electrode, and was greater than 0.2 V for a potential of 20 V applied to the gate electrode. The shift value $V_{sh}$ of the transistor TR5 was greater than −0.2 V and less than 0.2 V, like that of the transistor TR4, for potentials from 0 V to 15 V applied to the gate electrode, and was less than −0.6 V for a potential of 20 V applied to the gate electrode.

The above results reveal that the shift value $V_{sh}$ of the transistor including an In—Sn—Zn oxide was considerably increased by application of a potential of 20 V to each of the drain electrode and the gate electrode, although the shift value $V_{sh}$ of the transistor including an In—Ga—Zn oxide was not significantly changed.

Experiment 2

Figure 48A:
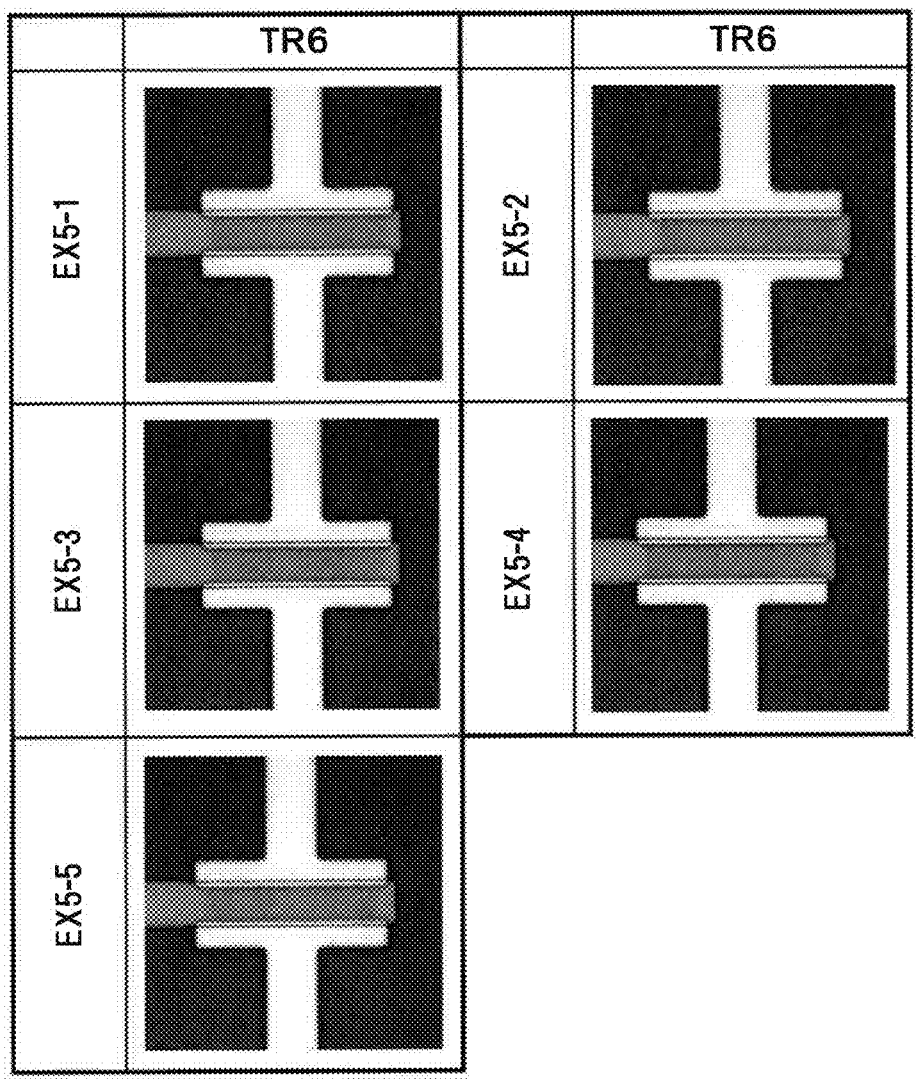
FIGS. 48A and 48B show images of transistors taken with an emission microscope.

FIG. 48A shows the results of observation of hot carriers in a transistor including an In—Sn—Zn oxide. For the observation of hot carriers, an emission microscope (PHEMOS-1000) manufactured by Hamamatsu Photonics K.K. was used and pictures were taken with a charge-coupled device (CCD) camera. Note that the wavelength range for observation with the CCD camera was greater than or equal to 300 nm and less than or equal to 1100 nm (visible light region).

The transistor TR6 is a transistor including an In—Sn—Zn oxide having a CAAC-OS structure with a channel length of 10 μm and a channel width of 50 μm.

The transistor TR6 has a structure similar to that of the transistor 200 illustrated in the schematic view of FIG. 39. The transistor TR6 includes the conductor 204 which was a 150-nm-thick tungsten film formed by a sputtering method, the insulator 212 which was a stacked layer of a 400-nm-thick silicon nitride film and a 50-nm-thick silicon oxynitride film, the conductors 216a and 216b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The In—Sn—Zn oxide film was formed under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition.

A test EX5-1 to a test EX5-5 were performed on the transistor TR6 under the conditions where the potential applied to the drain electrode was 20 V, the potential applied to the source electrode was 0 V, and potentials of 0 V, 5 V, 10 V, 15 V, and 20 V were applied to the gate electrode in the respective tests. Pictures of the states of the transistor after the elapse of $1.0 \times 10^2$ secs from the start of the application (accumulative observation was performed for 60 secs in the period of $1.0 \times 10^2$ secs) were taken.

As illustrated in FIG. 48A, luminescence due to hot carriers was not observed in the tests EX5-1 to EX5-5.

Figure 48B:
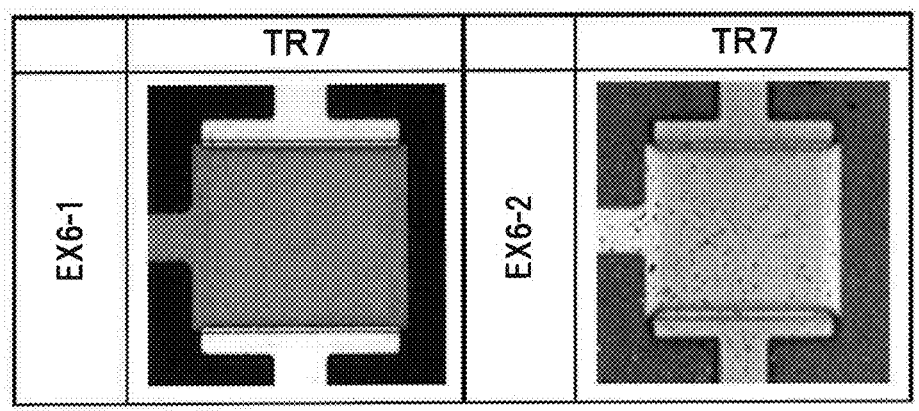

FIG. 48B shows the observation results of a transistor different from the above transistor. Pictures were taken with the same CCD camera as in the above tests in a test EX6-1 and with an InGaAs camera in a test EX6-2. The wavelength range for observation with the InGaAs camera was greater than or equal to 950 nm and less than or equal to 1700 nm (infrared region). To take both of the pictures, an emission microscope (PHEMOS-1000) manufactured by Hamamatsu Photonics K.K. was used.

The transistor TR7 is a transistor including an In—Sn—Zn oxide film having a CAAC-OS structure with a channel length of 50 μm and a channel width of 50 μm.

The transistor TR7 has a structure similar to that of the transistor 200 illustrated in the schematic view of FIG. 39. The transistor TR7 includes the conductor 204 which was a 150-nm-thick tungsten film formed by a sputtering method, the insulator 212 which was a stacked layer of a 400-nm-thick silicon nitride film and a 50-nm-thick silicon oxynitride film, the conductors 216a and 216b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The transistor TR7 includes, as the semiconductor 206, a 20-nm-thick In—Sn—Zn oxide film formed by a sputtering method. The In—Sn—Zn oxide film was formed under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition.

The tests EX6-1 and EX6-2 were performed on the transistor TR7 under the conditions where the potential applied to the drain electrode was 20 V, the potential applied to the source electrode was 0 V, and the potential applied to the gate electrode was 20 V. Pictures of the states of the transistor after the elapse of $1.0 \times 10^2$ secs from the start of the application (accumulative observation was performed for 60 secs in the period of $1.0 \times 10^2$ secs) were taken.

As illustrated in FIG. 48B, luminescence due to hot carriers was not observed in the tests EX6-1 and EX6-2.

This shows that no impact ionization occurred due to hot carriers, which is an indication that no drain avalanche hot carrier (DAHC) deterioration occurred due to impact ionization.

Experiment 3

Next, the results of the observation using scanning spreading resistance microscopy (SSRM) are described. In an SSRM method, a resistance value is measured while the specimen plane is scanned with a conductive probe, and the distribution of the resistance value on the specimen plane is visualized. In this experiment, a current measuring atomic force microscope "E-sweep" manufactured by SII Nano Technology Inc. was used for the observation.

<Results of SSRM in the Vicinity of Drain Electrode>

Figure 49A:
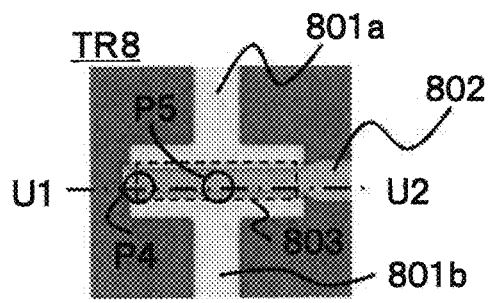
FIGS. 49A and 49B show an image of a transistor taken with an optical microscope and cross-sectional views and current images of the transistor.

FIG. 49A shows an image of a measured transistor TR8, which was taken with an optical microscope. The transistor TR8 has a structure similar to that of the transistor 200 illustrated in the schematic view of FIG. 39 and has a channel length of 8 μm and a channel width of 50 μm. A conductor 801a serves as one of the conductors 216a and 216b. A conductor 801b serves as the other of the conductors 216a and 216b. A conductor 802 serves as the conductor 204. A semiconductor 803 serves as the semiconductor 206. Although not shown in the figure, films serving as the insulators 212 and 218 are also included in the transistor TR8.

The transistor TR8 includes the semiconductor 803 which was a 150-nm-thick tungsten film formed by a sputtering method, the insulator 212 which was a stacked layer of a 400-nm-thick silicon nitride film and a 50-nm-thick silicon oxynitride film, the conductors 801a and 801b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The transistor TR8 includes, as the semiconductor 803, a 20-nm-thick In—Sn—Zn oxide film formed by a sputtering method. The In—Sn—Zn oxide film was formed under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition.

Figure 49B:
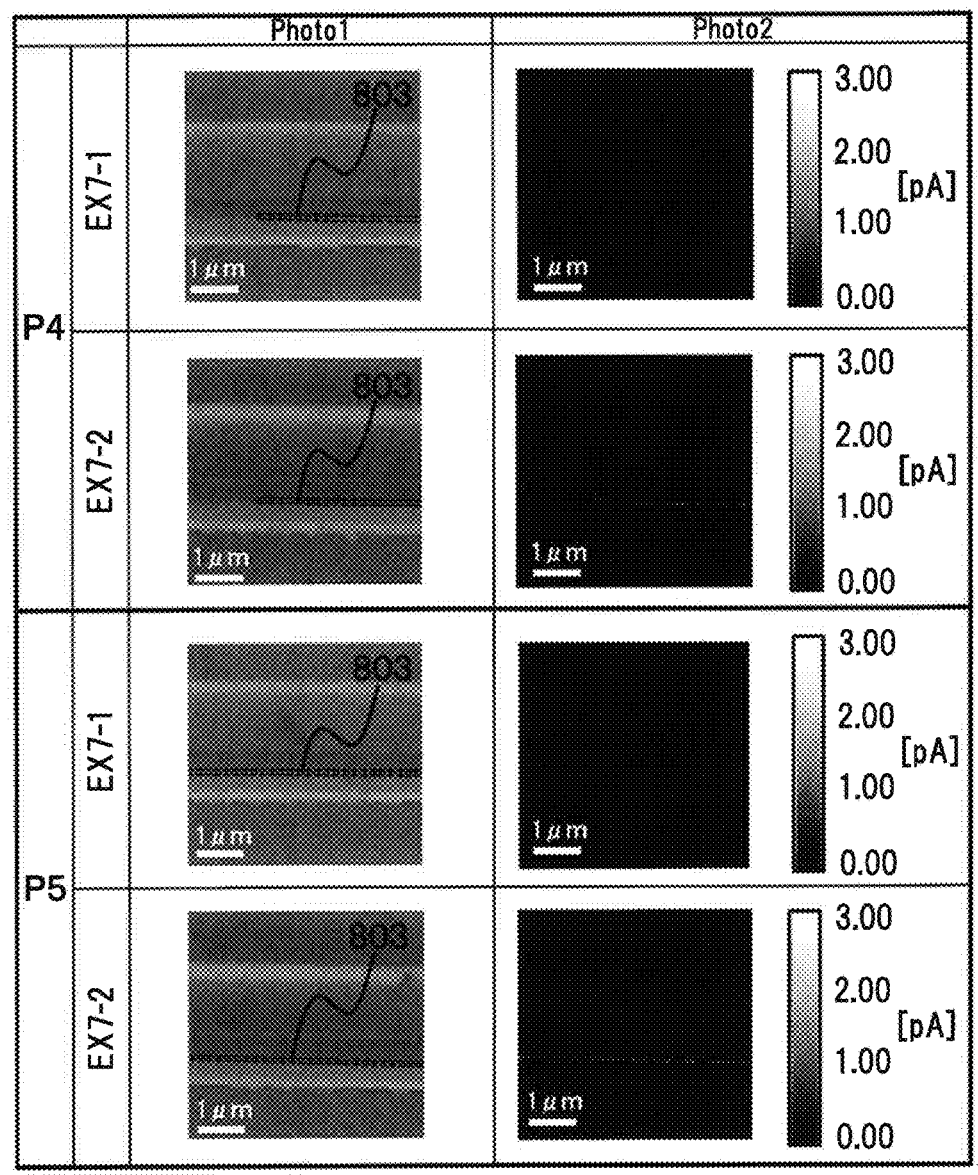

Photo 1 in FIG. 49B shows atomic force microscope (AFM) images of a cross section of the transistor TR8 along the dash-dot line U1-U2 in FIG. 49A. Note that the dash-dot line U1-U2 is along the channel width direction of the transistor TR8 and crosses a part of the semiconductor 803 near the conductor 801b. Photo 2 shows images of current output in the positions shown in Photo 1 by an SSRM method. The measured cross section was subjected to mechanical polishing with diamond abrasive particles and finishing polishing with colloidal silica.

The AFM images and current images in FIG. 49B are of the observed position P4 and the observed position P5 on the dash-dot line U1-U2 of the transistor TR8.

AFM images and current images of a test EX7-1 and a test EX7-2 were taken in temperature stress tests in a dark environment. In the temperature stress tests, the temperature of a heat source that applied heat to the transistor TR8 was 50° C., the potential applied to the gate electrode of the transistor TR8 was 20 V, the potential applied to the drain electrode of the transistor TR8 was 20 V, and the potential applied to the source electrode of the transistor TR8 was 0 V. The test EX7-1 shows AFM images and current images taken immediately after the start of the temperature stress test, and the test EX7-2 shows AFM images and current images taken after the elapse of $1.0 \times 10^5$ secs. Specifically, the potentials were applied using the conductor 801a as a source electrode, the conductor 801b as a drain electrode, and the conductor 802 as a gate electrode.

In view of the results and grayscale bars in Photo 2 in FIG. 49B, no current was observed in both the observed positions P4 and P5 in the test EX7-1, and a current greater than or equal to 0.5 pA and less than or equal to 3.0 pA was observed in the positions where the observed positions P4 and P5 overlapped with the semiconductor 803 in the test EX7-2.

This means that the temperature stress tests in a dark environment increased the donor densities of the semiconductor 803 in the observed positions P4 and P5 near the drain electrode.

<SSRM Results of the Middle Part of Active Layer Island>

The SSRM results of the middle part of an active layer island, which is a position out of the dash-dot line U1-U2, are next described.

Figure 50A:
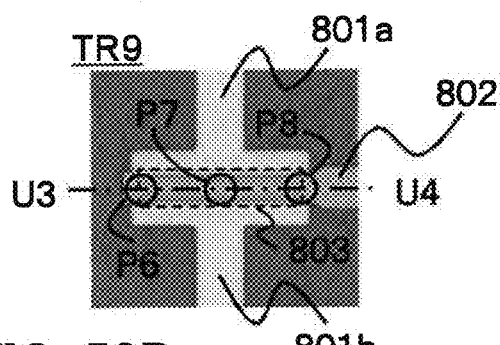
FIGS. 50A and 50B show an image of a transistor taken with an optical microscope and cross-sectional views and current images of the transistor.

FIG. 50A shows an image of a measured transistor TR9, which was taken with an optical microscope. For the structure of the transistor TR9 and the conductors 801a, 801b, and 802 and the semiconductor 803 in the transistor TR9, the description of the transistor TR8 can be referred to.

Figure 50B:
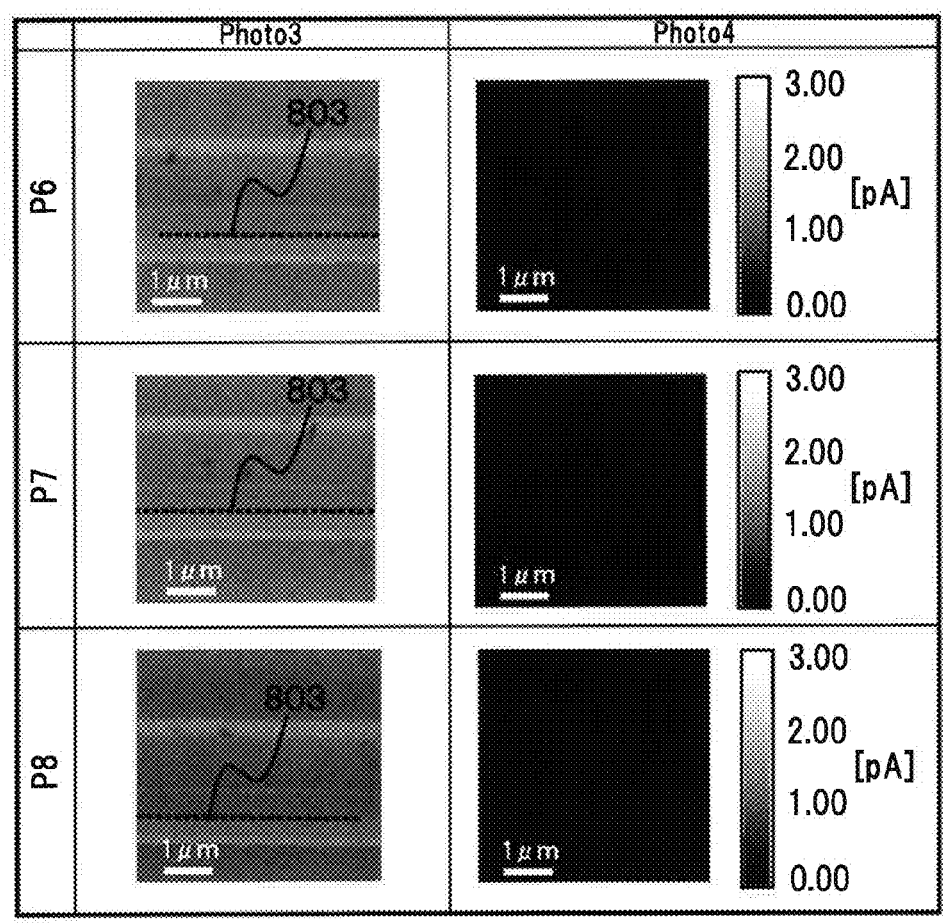

Photo 3 in FIG. 50B shows AFM images of a cross section of the transistor TR9 along the dash-dot line U3-U4 in FIG. 50A. Note that the dash-dot line U3-U4 is along the channel width direction of the transistor TR9 and crosses the middle part of the semiconductor 803. Photo 4 shows images of current output in the positions shown in Photo 3 by an SSRM method. Note that for the cross-section processing of the transistor TR9, the description of the cross-section processing of the transistor TR8 can be referred to.

The AFM images and current images in FIG. 50B are of the observed positions P6 to P8 on the dash-dot line U3-U4 of the transistor TR9.

The AFM images and current images shown in FIG. 50B were taken after a temperature stress test was performed in a dark environment for $1.0 \times 10^5$ secs. In the temperature stress test, the temperature of a heat source that applied heat to the transistor TR9 was 50° C., the potential applied to the gate electrode of the transistor TR9 was 20 V, the potential applied to the drain electrode of the transistor TR9 was 20 V, and the potential applied to the source electrode of the transistor TR9 was 0 V. Specifically, the potentials were applied using the conductor 801a as a source electrode, the conductor 801b as a drain electrode, and the conductor 802 as a gate electrode.

In view of the results and grayscale bars in Photo 4 in FIG. 50B, a current greater than or equal to 0.5 pA and less than or equal to 3.0 pA was observed in a part of the observed position P6. In addition, no current was observed in both the observed positions P7 and P8.

This indicates that the temperature stress test in a dark environment increased the donor density of the observed position P6, which was an edge portion in the channel width direction of the semiconductor 803 forming the active layer.

<Results of SSRM in the Vicinity of Source Electrode>

The SSRM results of vicinity of the source electrode, which is a position out of the dash-dot line U1-U2 and the dash-dot line U3-U4, are next described.

Figure 51A:
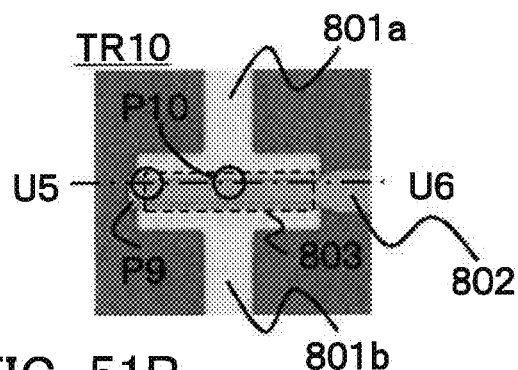
FIGS. 51A and 51B show an image of a transistor taken with an optical microscope and cross-sectional views and current images of the transistor.

FIG. 51A shows an image of a measured transistor TR10, which was taken with an optical microscope. For the structure of the transistor TR10 and the conductors 801a, 801b, and 802 and the semiconductor 803 in the transistor TR10, the description of the transistor TR8 can be referred to.

Figure 51B:
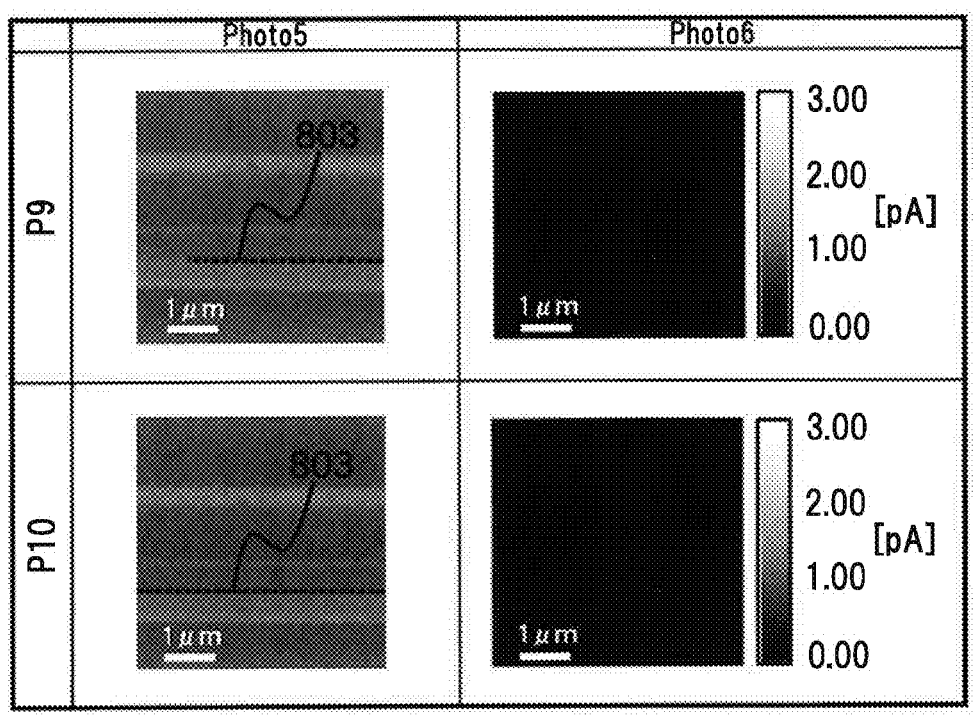

Photo 5 in FIG. 51B shows AFM images of a cross section of the transistor TR10 along the dash-dot line U5-U6 in FIG. 51A. Note that the dash-dot line U5-U6 is along the channel width direction of the transistor TR10 and crosses a part of the semiconductor 803 near the conductor 801a. Photo 6 shows images of current output in the positions shown in Photo 5 by an SSRM method. Note that for the cross-section processing of the transistor TR10, the description of the cross-section processing of the transistor TR8 can be referred to.

The AFM images and current images in FIG. 51B are of the observed positions P9 and P10 on the dash-dot line U5-U6 of the transistor TR10.

The AFM images and current images shown in FIG. 51B were taken after a temperature stress test was performed in a dark environment for $1.0 \times 10^5$ secs. In the temperature stress test, the temperature of a heat source that applied heat to the transistor TR10 was 50° C., the potential applied to the gate electrode of the transistor TR10 was 20 V, the potential applied to the drain electrode of the transistor TR10 was 20 V, and the potential applied to the source electrode of the transistor TR10 was 0 V. Specifically, the potentials were applied using the conductor 801a as a source electrode, the conductor 801b as a drain electrode, and the conductor 802 as a gate electrode.

In view of the results and grayscale bars in Photo 6 in FIG. 51B, a current greater than or equal to 0.5 pA and less than or equal to 3.0 pA was observed in a part of the observed position P9.

This indicates that the temperature stress test in a dark environment increased the donor density of the observed positions P9 and P10 in the semiconductor 803 forming the active layer, near the conductor 801a.

In summary, the above results reveal that the positions of the semiconductor 803, which deteriorated due to the temperature stress test in a dark environment to have an increased donor density, were the vicinity of the drain electrode and the side-edge portion in the channel width direction.

Experiment 4

Device calculations were used to construct a model of the deterioration with a hump (HUMP in FIG. 47) shown in the current-voltage characteristics of the In—Sn—Zn oxide in Experiment 1 and the phenomenon of an increase in the donor density of the channel portion near the drain electrode in Experiment 3, which are described below.

Using the TCAD simulator produced by Silvaco Inc., 3D calculations were performed.

A structure of a transistor used for the calculations is described. FIGS. 52A to 52C illustrate a structure of a transistor 700 for the calculations. FIGS. 52A and 52C are top views of the transistor 700 and FIG. 52B is a cross-sectional view of the transistor 700 along the dash-dot line Q1-Q2. Note that in FIGS. 52A and 52C, some layers are not illustrated. In FIG. 52C, a semiconductor edge portion 704d, a semiconductor edge portion 704e, and ΔW are illustrated for explanation and hatching in FIG. 52A is omitted.

The transistor 700 includes a conductor 701 serving as a gate electrode, an insulator 702 over the conductor 701, and an oxide semiconductor 704 over the insulator 702. The transistor 700 includes, over the insulator 702 and the oxide semiconductor 704, a conductor 703a serving as one of a source electrode and a drain electrode and a conductor 703b serving as the other thereof. The transistor 700 includes an insulator 705 over the oxide semiconductor 704 and the conductors 703a and 703b.

The parameters and constants of the transistor 700 used in the calculations are as follows. The conductor 701 has a thickness of 150 nm and a work function of 4.6 eV. The insulator 702 has a thickness of 550 nm and a dielectric constant of 4.1. The oxide semiconductor 704 has a thickness of 20 nm, an electron affinity of 4.6 eV, a 2.9 eV energy barrier between the valence and conduction bands, a dielectric constant of 15, an electron mobility of 30 cm$^2$/Vs, and a hole mobility of 0.01 cm$^2$/Vs, and the effective densities of states in the valence and conduction bands are each $5.00 \times 10^{18}$/cm$^3$. An oxide semiconductor 704b in contact with the insulator 705 has a donor density of $6.60 \times 10^{-9}$/cm$^3$. An oxide semiconductor 704a and an oxide semiconductor 704c, which are just under the conductor 703a and the conductor 703b, respectively, each have a donor density of $5.00 \times 10^{18}$/cm$^3$. The conductors 703a and 703b each have a work function of 4.6 eV. The insulator 705 has a dielectric constant of 4.1 and a thickness of 450 nm. The transistor 700 has a channel length L of 8 μm and a channel width W of 50 μm.

In this experiment, in addition to the above parameters, the width ΔW of each of the semiconductor edge portions 704d and 704e, which correspond to edge portions of the oxide semiconductor 704, and a donor density $N_d$ of each of the semiconductor edge portions 704d and 704e were used as parameters. Specifically, donor densities $N_d$ of $1.00 \times 10^{16}$/cm$^3$, $5.00 \times 10^{16}$/cm$^3$, $1.00 \times 10^{17}$/cm$^3$, $5.00 \times 10^{17}$/cm$^3$, and $1.00 \times 10^{18}$/cm$^3$ were used in tests EX8-1, EX8-2, EX8-3, EX8-4, and EX8-5, respectively. In each of the tests EX8-1 to EX8-5, current-voltage characteristics were calculated with various widths ΔW of 50 nm, 100 nm, 250 nm, and 500 nm.

Figure 53:
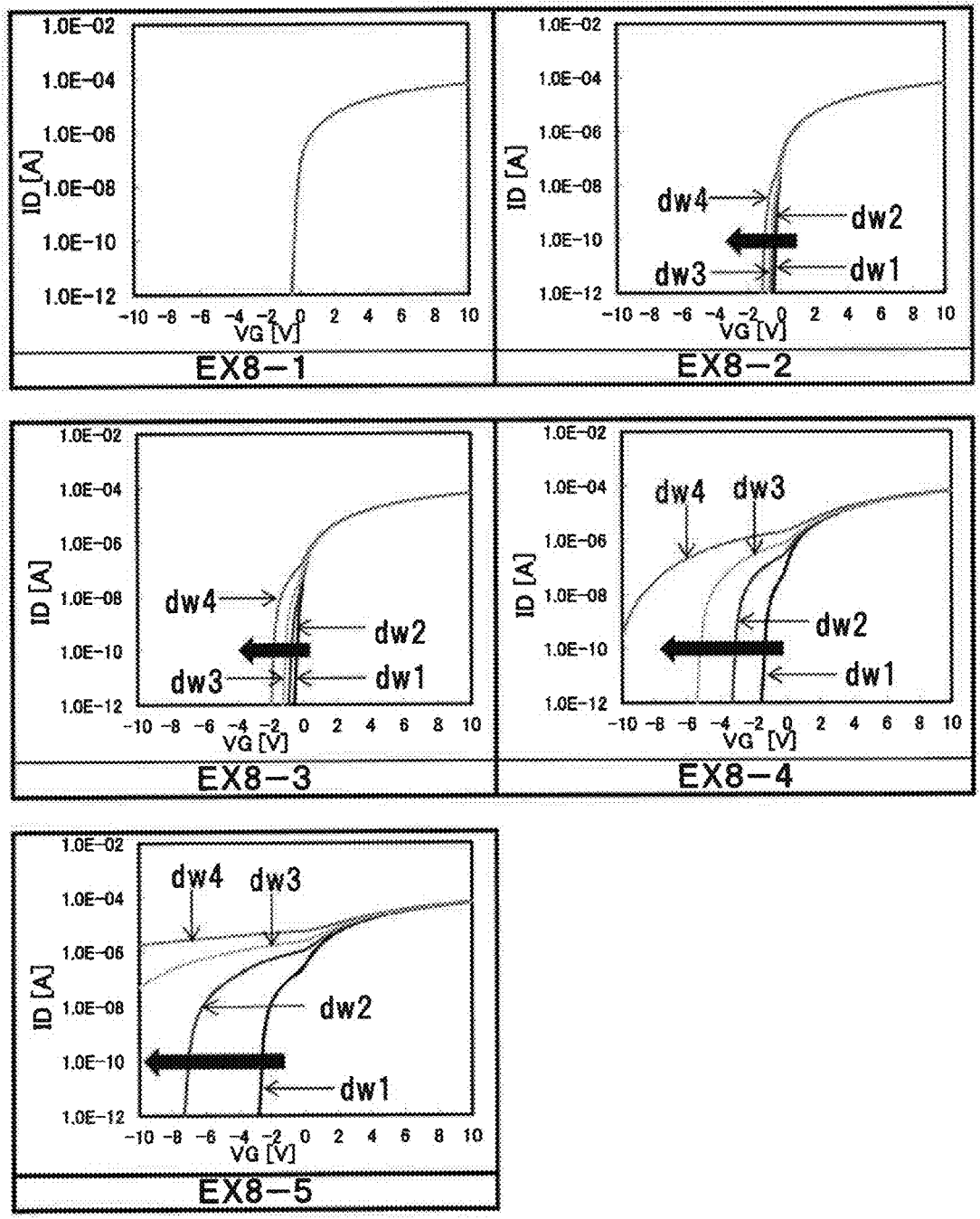
FIG. 53 shows calculation results of the transistor.

FIG. 53 shows the calculation results of the current-voltage characteristics, where dw1 represents the conditions with a width ΔW of 50 nm, dw2 represents those with a width ΔW of 100 nm, dw3 represents those with a width ΔW of 250 nm, and dw4 represents those with a width ΔW of 500 nm. The symbol $I_D$ [A] represents drain current $I_D$ and the symbol VG [V] represents gate voltage $V_{gs}$.

In the tests EX8-1 and EX8-2, the increases in width ΔW did not change the current-voltage characteristics. In the tests EX8-3 to EX8-5, as in the test EX4-1 on the transistor TR5 showing the current-voltage characteristics in FIG. 47, the increases in width ΔW resulted in the negative shift value and the change in threshold voltage in the positive direction, forming a hump. Thus, when the donor density $N_d$ is $1.00 \times 10^{17}$/cm$^3$ or more, the shift value is a negative value and the threshold voltage is changed in the positive direction.

According to Experiment 1, by subjecting the transistor including an In—Sn—Zn oxide to a long-time temperature stress test in a dark environment where high potentials were applied to the gate electrode and the drain electrode, current-voltage characteristics of the transistor exhibited a negative shift value and a change in threshold voltage in the positive direction, resulting in a deterioration of the transport property of the transistor. Furthermore, drain current $I_D$ was not increased in Experiment 1 and hot carriers were not observed in Experiment 2, indicating that there was no DAHC deterioration due to impact ionization.

Furthermore, according to Experiment 3, a long-time temperature stress test in a dark environment where high potentials were applied to the gate electrode and the drain electrode increased the donor density of the channel portion near the drain electrode. In Experiment 4, calculations using a deterioration model based on the results obtained in Experiment 3 replicated the current-voltage characteristics in Experiment 1 with a negative shift value and a change in threshold voltage in the positive direction. Therefore, the deterioration of the transistor due to a temperature stress test in a dark environment is attributed to the increases in the donor densities of a channel portion near the drain electrode and a channel side-edge portion in the channel width direction.

Example 4

In Example 2 and Example 3, the stress tests on the transistors each including an In—Sn—Zn oxide in a channel formation region and the results are described. In this example, stress tests on transistors each including an In—Ga—Zn oxide in a channel formation region and the results are described.

Experiment 5

Figure 54A:
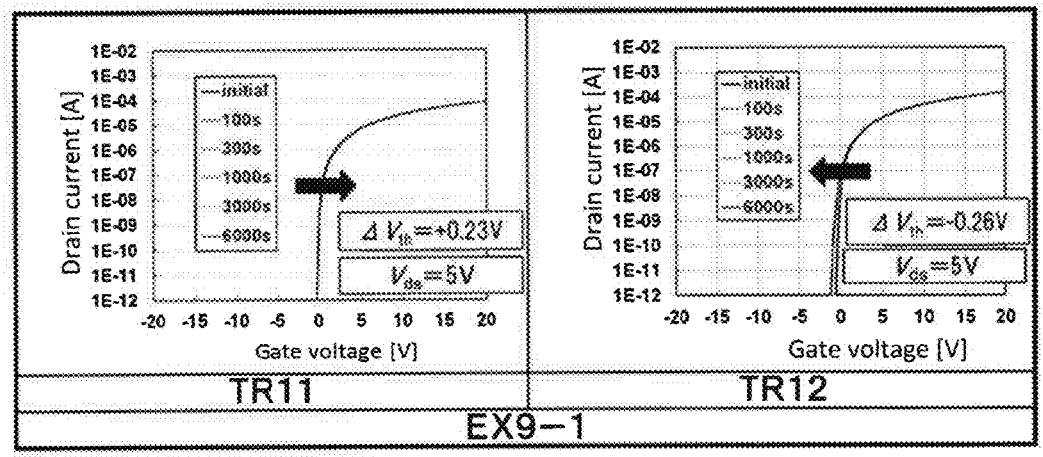
FIGS. 54A to 54C show results of bias-temperature stress tests of transistors.
Figure 54B:
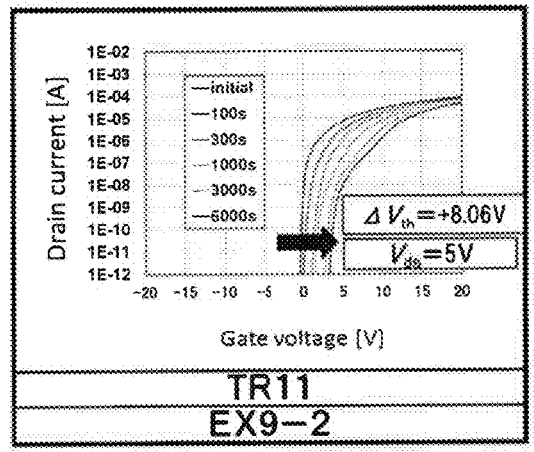

FIG. 54A shows the results of a test EX9-1 on a transistor TR11 and a transistor TR12, and FIG. 54B shows the results of a test EX9-2 on the transistor TR11.

The transistors TR11 and TR12 are each a transistor including an In—Ga—Zn oxide film having a CAAC-OS structure with a channel length of 6 μm and a channel width of 50 μm. The transistor TR11 has the inverted staggered structure illustrated in FIG. 39. The transistor TR12 has an s-channel structure based on the inverted staggered structure illustrated in FIG. 18A. Note that an active layer formed in the transistor TR12 has not a stacked-layer structure of the insulator 606a, the semiconductor 606b, and the insulator 606c but a single-layer structure (hereinafter, this single-layer semiconductor is referred to as a semiconductor 606).

The transistor TR11 includes a glass substrate as the substrate 201, the conductor 204 which was a 100-nm-thick tungsten film formed by a sputtering method, the insulator 212 which was a stacked layer of a 400-nm-thick silicon nitride film and a 50-nm-thick silicon oxynitride film, the semiconductor 206 which was a 20-nm-thick In—Ga—Zn oxide film, the conductors 216a and 216b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The transistor TR12 includes a glass substrate as the substrate 201, the conductor 604 which was a 100-nm-thick tungsten film formed by a sputtering method, the insulator 612 which was a stacked layer of a 400-nm-thick silicon nitride film and a 50-nm-thick silicon oxynitride film, the semiconductor 606 which was a 25-nm-thick In—Ga—Zn oxide film, the conductors 616a and 616b which were stacked layers of a 50-nm-thick tungsten film, a 400-nm-thick aluminum film, and a 100-nm-thick titanium film formed by a sputtering method, the insulator 618 which was a 450-nm-thick silicon oxynitride film, and the conductor 613 which was a 100-nm-thick indium tin oxide film.

The test EX9-1 was a temperature stress test in a dark environment under the conditions where the temperature of a heat source that applied heat to each of the transistors TR11 and TR12 was 50° C., the potential applied to the gate electrode of each transistor was 20 V, and the potential applied to the drain electrode of each transistor was 20 V. The data obtained by the test EX9-1 are current-voltage characteristics immediately after the start of the test (0 secs, denoted by "initial" in FIG. 54A) and after the elapse of $1.0 \times 10^2$ secs, $3.0 \times 10^2$ secs, $1.0 \times 10^3$ secs, $3.0 \times 10^3$ secs, and $6.0 \times 10^3$ secs after the start of the test. In FIG. 54A, the horizontal axis represents gate voltage and the vertical axis represents drain current. In the graphs of FIG. 54A, $\Delta V_{th}$ represents a shift in threshold voltage from the start to the finish of the test and $\Delta V_{ds}$ represents drain-source voltage.

The test EX9-2 was a temperature stress test in a dark environment under the conditions where the temperature of a heat source that applied heat to the transistor TR11 was 50° C., the potential applied to the gate electrode was 30 V, and the potential applied to the drain electrode of each transistor was 30 V. For the data obtained by the test EX9-2 in FIG. 54B and the notes in the graph, the description of the test EX9-1 in FIG. 54A can be referred to.

FIG. 54A shows that, at the finish of the stress test, the threshold voltage of the transistor TR11 was changed in the positive direction by 0.23 V and the threshold voltage of the transistor TR12 was changed in the negative direction by 0.26 V. The change in the threshold voltage of the transistor TR12 in the negative direction was attributed to an increase in the donor density of a channel due to drain current.

For the stress applied to the transistor TR11, the amperage was initially 220 mA and, just before the finish of the test, 218 mA. For the stress applied to the transistor TR12, the amperage was initially 400 mA and, just before the finish of the test, 419 mA. These reveal that the increase in the donor density of the channel of the transistor TR12 depended on the amount of current flowing in the channel.

Note that the reason for the difference in amperage between the transistors TR11 and TR12 is that the transistor TR12 has an s-channel structure. A transistor having an s-channel structure can have a high on-state current, as described in Embodiment 3.

The test EX9-2 was performed to observe deterioration caused by flow of a higher current into the transistor including an In—Ga—Zn oxide than in the test EX9-1. As shown in FIG. 54B, the test EX9-2 resulted in formation of a hump in the current-voltage characteristics of the transistor TR11. In other words, the transport property of the transistor TR11 was significantly degraded by the temperature stress test in a dark environment where the potential applied to the gate electrode was 30 V and the potential applied to the drain electrode was 30 V.

Experiment 6

Figure 54C:
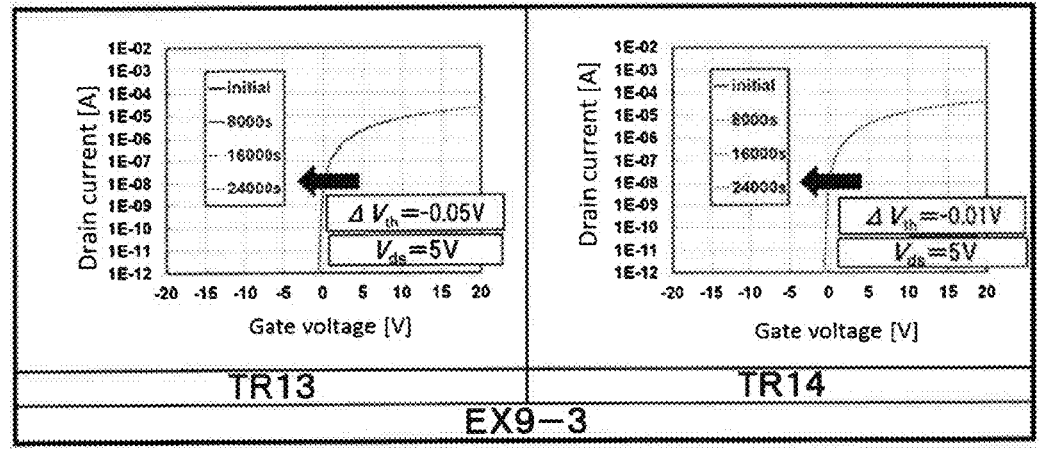

FIG. 54C shows a test EX9-3 on a transistor TR13 and a transistor TR14.

The transistors TR13 and TR14 are each a transistor including an In—Ga—Zn oxide film having a CAAC-OS structure with a channel length of 6 μm and a channel width of 10 μm. The transistor TR13 has the inverted staggered structure illustrated in FIG. 39. The transistor TR14 has an s-channel structure based on the inverted staggered structure illustrated in FIG. 18A. Note that as in the transistor TR12, a semiconductor formed in the transistor TR14 has not a stacked-layer structure of the insulator 606a, the semiconductor 606b, and the insulator 606c but a single-layer structure of the semiconductor 606 (hereinafter, this single-layer semiconductor is referred to as a semiconductor 606).

For the materials forming the transistor TR13, the description of the transistor TR11 can be referred to.

For the materials forming the transistor TR14, the description of the transistor TR12 can be referred to.

The test EX9-3 was a temperature stress test in a dark environment under the conditions where the temperature of a heat source that applied heat to each of the transistors TR13 and TR14 was 50° C., the potential applied to the gate electrode of each transistor was 6 V, and the potential applied to the drain electrode of each transistor was 30 V. The data obtained by the test EX9-3 are current-voltage characteristics immediately after the start of the test (0 secs, denoted by "initial" in FIG. 54C) and after the elapse of $8.0 \times 10^3$ secs, $1.6 \times 10^4$ secs, and $2.4 \times 10^4$ secs after the start of the test. In FIG. 54C, the horizontal axis represents gate voltage and the vertical axis represents drain current. In the graphs of FIG. 54C, $\Delta V_{th}$ represents a shift in threshold voltage from the start to the finish of the test and $\Delta V_{ds}$ represents drain-source voltage.

FIG. 54C shows that, at the finish of the stress test, the threshold voltages of the transistors TR13 and TR14 were shifted in the negative direction by 0.05 V and 0.01 V, respectively. In other words, the stress test did not cause significant deterioration in both the transistors TR13 and TR14.

Experiment 7

Figure 55:
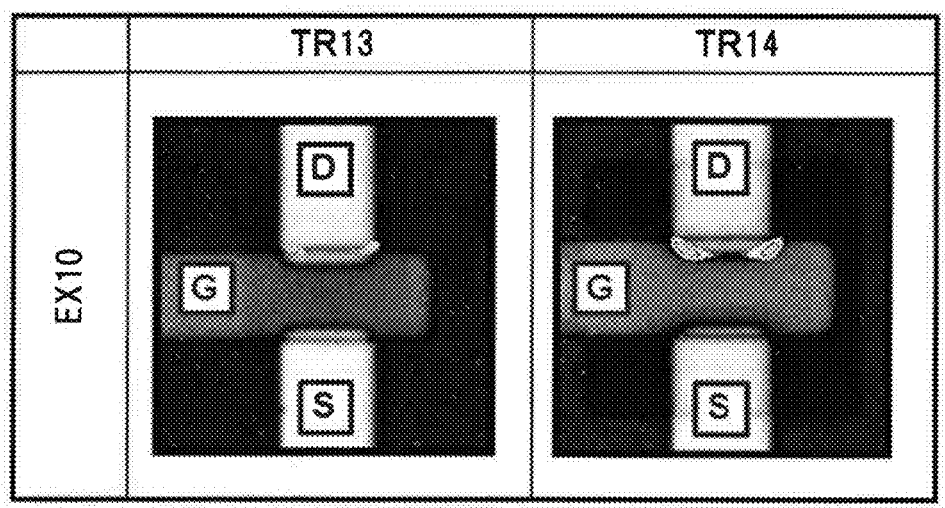
FIG. 55 shows images of transistors taken with an emission microscope.

FIG. 55 shows the results of observation of hot carriers in the transistors TR13 and TR14. For the observation of hot carriers, an emission microscope (PHEMOS-1000) manufactured by Hamamatsu Photonics K.K. was used and pictures were taken with a CCD camera. Note that the wavelength range for observation with the CCD camera was greater than or equal to 300 nm and less than or equal to 1100 nm (visible light region).

FIG. 55 shows the observation results of the transistors TR13 and TR14 under the same stress conditions as those in Experiment 6 described above. In FIG. 55, D represents the drain electrode, G represents the gate electrode, and S represents the source electrode. From the results in FIG. 55, luminescence due to hot carriers, was observed from both corners of the drain electrode, which overlapped with the gate electrode in each of the transistors TR13 and TR14.

Experiment 6 and Experiment 7 in this example show that the transistors each including an In—Ga—Zn oxide were highly reliable in that generation of hot carriers caused neither DAHC injection nor channel hot electron (CHE) injection.

The reason why generation of hot carriers does not cause deterioration is that an In—Ga—Zn oxide is a wide-gap semiconductor. One cause of the DAHC injection is, for example, impact ionization in a channel. The impact ionization requires hot carriers to have theoretically 1.5 times as high energy as that of the band gap of a semiconductor used as the active layer. For an In—Ga—Zn oxide, the value of the band gap is approximately 3 eV and therefore energy of 4.5 eV is required to cause impact ionization. Hot carriers having such energy were not observed under the conditions where a local electric field was applied in Experiments 5 and 6 of this example. For this reason, neither impact ionization nor DAHC injection occurred in the transistors including an In—Ga—Zn oxide under the conditions of the tests EX9-1 to EX9-3.

Example 5

Example 2 shows the results of the test EX3 on the transistor TR3 including an In—Sn—Zn oxide having an nc-OS structure. The test EX3 was the temperature stress test performed in a dark environment for $1.0 \times 10^4$ secs with a gate voltage of 20 V, a drain voltage of 20 V, a source voltage of 0 V, and a heat source temperature of 50° C. Example 3 shows the results of the test EX4-1 on the transistor TR4 including an In—Ga—Zn oxide having a CAAC-OS structure and the transistor TR5 including an In—Sn—Zn oxide having a CAAC-OS structure. The test EX4-1 was the temperature stress test performed in a dark environment for $1.0 \times 10^5$ secs with a gate voltage of 20 V, a drain voltage of 20 V, a source voltage of 0 V, and a heat source temperature of 50° C. This example shows the results of temperature stress tests on transistors including In—Sn—Zn oxides having a CAAC-OS structure and an nc-OS structure, each of which were doped with oxygen in the middle of the transistor fabrication process.

Figure 56A:
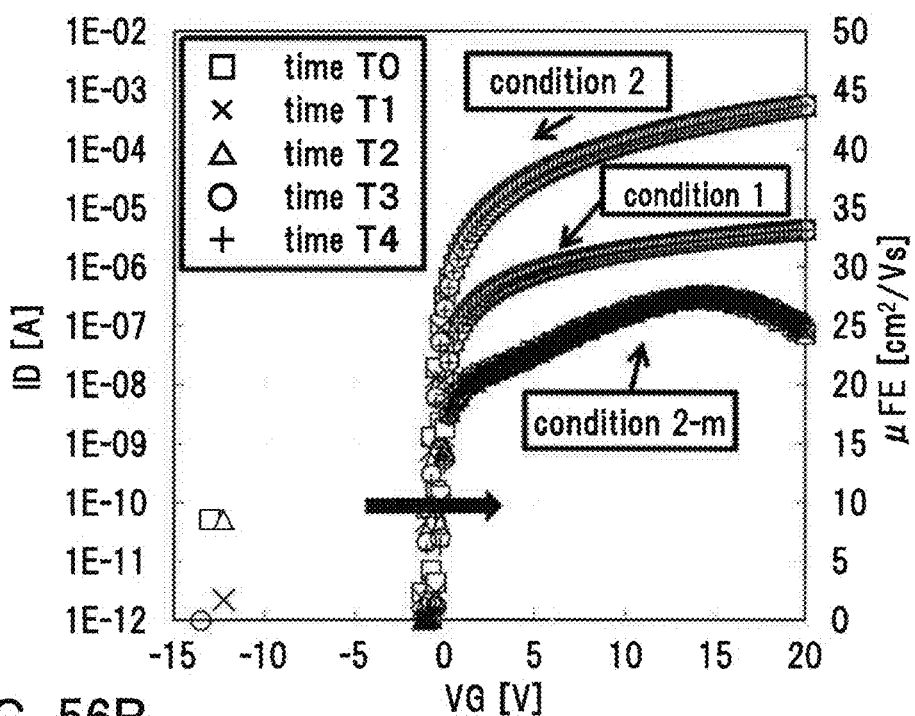
FIGS. 56A and 56B show results of bias-temperature stress tests of transistors.
Figure 56B:
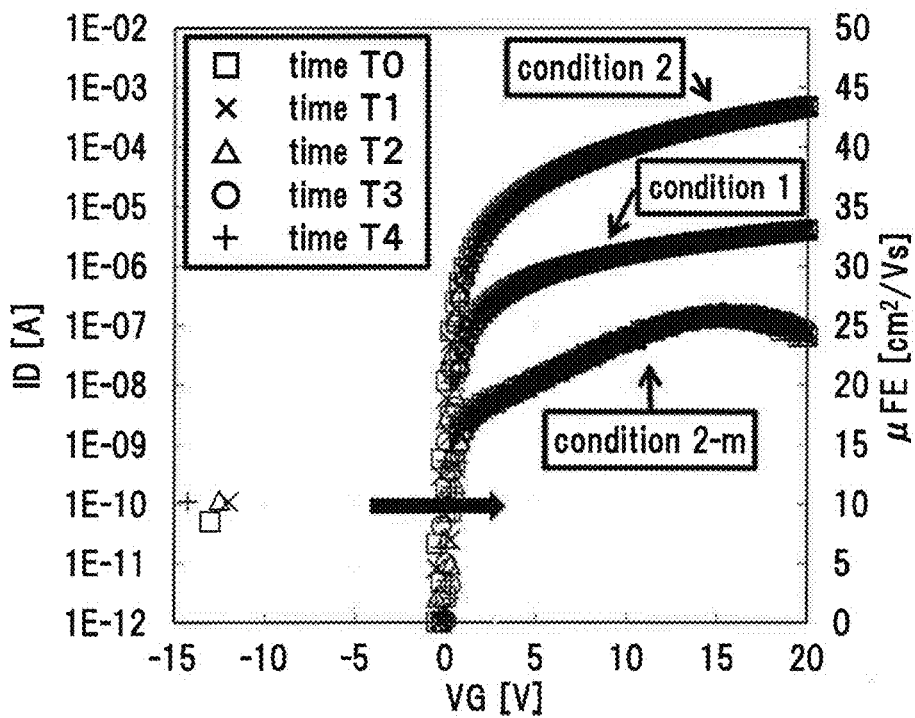
Figure 57A:
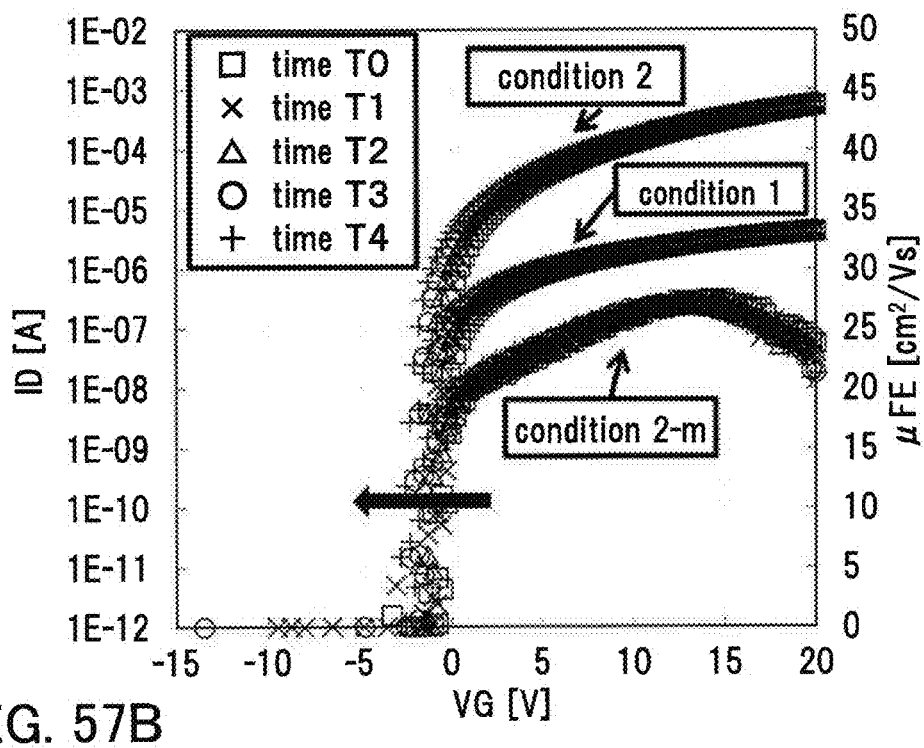
FIGS. 57A and 57B show results of bias-temperature stress tests of transistors.
Figure 57B:
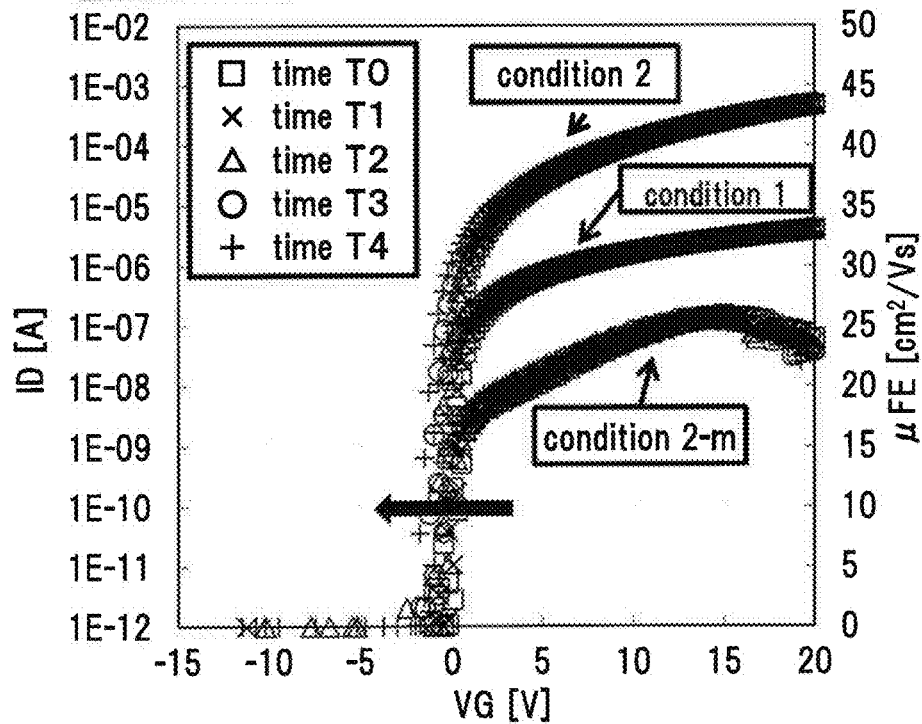

FIGS. 56A and 56B show the results of the test EX11 on the transistor TR15 and the transistor TR16, respectively. FIGS. 57A and 57B show the results of the test EX12 on the transistor TR15 and the transistor TR16, respectively.

Figure 58:
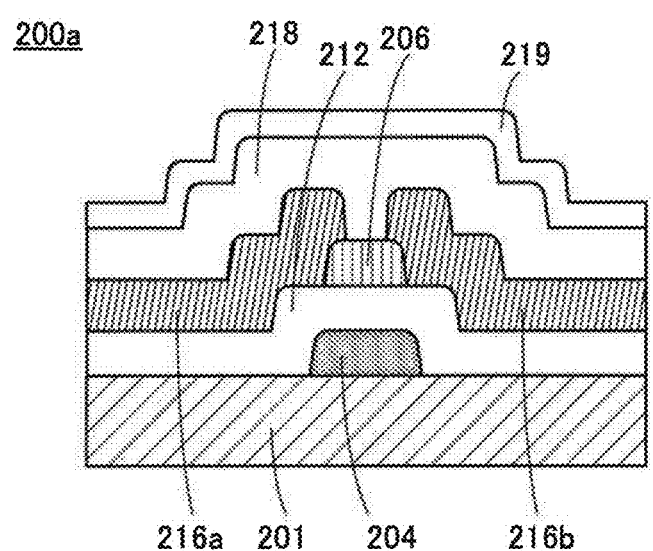
FIG. 58 illustrates a structural example of a transistor.

The transistor TR15 is a transistor including an In—Sn—Zn oxide film having a CAAC-OS structure with a channel length of 6 μm and a channel width of 50 μm. The transistor TR15 has the same structure as a transistor 200a illustrated in the schematic view of FIG. 58. The transistor 200a includes a conductor 219 over the insulator 218, in addition to the components of the transistor 200 illustrated in FIG. 39. The transistor TR15 includes the conductor 204 which was a 150-nm-thick tungsten film formed by a sputtering method, the insulator 212 which was a stacked layer of a 400-nm-thick silicon nitride film and a 50-nm-thick silicon oxynitride film, the conductors 216a and 216b which were stacked layers of a 50-nm-thick tungsten film, a 400-nm-thick aluminum film, a 100-nm-thick titanium film formed by a sputtering method, the insulator 218 which was a 450-nm-thick silicon oxynitride film, and an insulator 219 which was a 100-nm-thick silicon nitride film.

The transistor TR15 includes, as the semiconductor 206, a 35-nm-thick In—Sn—Zn oxide film formed by a sputtering method. The In—Sn—Zn oxide film was formed under the following conditions: a sputtering target having an atomic ratio of In:Sn:Zn=1:1:1 was used; argon and oxygen were supplied at flow rates of 20 sccm and 10 sccm, respectively, as sputtering gases into a deposition chamber; the pressure in the deposition chamber was controlled to be 0.4 Pa; a DC power of 200 W was supplied; and the substrate temperature was 300° C. during deposition.

For the transistor TR15, a 5-nm-thick indium tin oxide film was formed over the insulator 218 before the insulator 219 was formed. After the indium tin oxide film was formed, heating was performed in an oxygen atmosphere to dope the indium tin oxide film with oxygen. This step can supply oxygen to the insulator 218 and the semiconductor 206. After that, the indium tin oxide film was removed by etching and the insulator 219 was formed.

The transistor TR16 is a transistor including an In—Sn—Zn oxide film having an nc-OS structure with a channel length of 6 μm and a channel width of 50 μm. The transistor TR16 has the same structure as a transistor 200a illustrated in the schematic view of FIG. 58. The transistor 200a includes a conductor 219 over the insulator 218, in addition to the components of the transistor 200 illustrated in FIG. 39. The transistor TR16 includes the conductor 204 which was a 150-nm-thick tungsten film formed by a sputtering method, the insulator 212 which was a stacked layer of a 400-nm-thick silicon nitride film and a 50-nm-thick silicon oxynitride film, the conductors 216a and 216b which were stacked layers of a 50-nm-thick tungsten film, a 400-nm-thick aluminum film, a 100-nm-thick titanium film formed by a sputtering method, and the insulator 218 which was a 450-nm-thick silicon oxynitride film.

The transistor TR16 includes, as the semiconductor 206, a 35-nm-thick In—Sn—Zn oxide film formed by a sputtering method. The In—Sn—Zn oxide film was formed under the following conditions: a sputtering target having an atomic ratio of In:Sn:Zn=2:1:3 was used; oxygen was supplied at a flow rate of 30 sccm as a sputtering gas into a deposition chamber; the pressure in the deposition chamber was controlled to be 0.4 Pa; a DC power of 200 W was supplied; and the substrate temperature was 300° C. during deposition.

As in the case of the transistor TR15, for the transistor TR16, a 5-nm-thick indium tin oxide film was formed over the insulator 218 before the insulator 219 was formed. After the indium tin oxide film was formed, heating was performed in an oxygen atmosphere to dope the indium tin oxide film with oxygen. This step can supply oxygen to the insulator 218 and the semiconductor 206. After that, the indium tin oxide film was removed by etching and the insulator 219 was formed.

FIGS. 56A and 56B show the results of the test EX11 on the transistor TR15 and the transistor TR16, respectively. The test EX11 was a temperature stress test in a dark environment where the temperature of a heat source that applied heat to each of the transistors TR15 and TR16 was 60° C. and the potential applied to the gate electrode of each transistor 30 V. The condition 1 indicates the measurement results of current-voltage characteristics with a drain-source voltage of 0.1 V, and the condition 2 indicates the measurement results of current-voltage characteristics with a drain-source voltage of 20 V. The condition 2-m indicates the calculation results of the field-effect mobility based on the data obtained in the condition 2. The data of the conditions 1, 2, and 2-m were obtained from the time T0 to the time T4. The time T0 is immediately after the start of the test (0 secs), and the time T1, the time T2, the time T3, and the time T4 are after the elapse of $1.0\times10^2$ secs, $6.0\times10^2$ secs, $1.8\times10^3$ secs, and $3.6\times10^3$ secs, respectively, from the start of the test. The symbol $I_D$ [A] represents drain current $I_D$ and the symbol VG [V] represents gate voltage $V_{gs}$.

FIGS. 57A and 57B show the results of the test EX12 on the transistor TR15 and the transistor TR16, respectively. The test EX12 was a temperature stress test in a dark environment where the temperature of a heat source that applied heat to each of the transistors TR15 and TR16 was 60° C. and the potential applied to the gate electrode of each transistor was −30 V. The condition 1 indicates the measurement results of current-voltage characteristics with a drain-source voltage of 0.1 V, and the condition 2 indicates the measurement results of current-voltage characteristics with a drain-source voltage of 20 V. The condition 2-m indicates the calculation results of the field-effect mobility based on the data obtained in the condition 2. The data of the conditions 1, 2, and 2-m were obtained from the time T0 to the time T4. The time T0 is immediately after the start of the test (0 secs), and the time T1, the time T2, the time T3, and the time T4 are after the elapse of $1.0\times10^2$ secs, $6.0\times10^2$ secs, $1.8\times10^3$ secs, and $3.6\times10^3$ secs, respectively, from the start of the test. The symbol $I_D$ [A] represents drain current $I_D$ and the symbol VG [V] represents gate voltage $V_{gs}$.

FIGS. 56A and 56B show that the transistors TR15 and TR16 each exhibit an extremely small shift in threshold voltage. Under the condition 2 in the test EX11, changes in the threshold voltage of the transistor TR15 and the transistor TR16 were 0.21 V in the positive direction and 0.29 V in the positive direction, respectively. In the period from the time T0 to the time T4, when a change in gate voltage $V_{gs}$ at a drain current $I_D$ of $1.0\times10^{-12}$ A is referred to as a shift value, under the condition 2 in the test EX11, the shift values of the transistor TR15 and the transistor TR16 were 0.13 V and 0.27 V, respectively.

The transistors TR15 and TR16 also exhibited high field-effect mobility. The field-effect mobility was at most 27.7 cm²/(V·s) for the transistor TR15 and at most 26.1 cm²/(V·s) for the transistor TR16.

FIGS. 57A and 57B show that the transistors TR15 and TR16 each exhibit an extremely small shift in threshold voltage. Under the condition 2 in the test EX12, changes in the threshold voltage of the transistor TR15 and the transistor TR16 were 1.55 V in the negative direction and 1.23 V in the negative direction, respectively. In the period from the time T0 to the time T4, when a change in gate voltage $V_{gs}$ at a drain current $I_D$ of $1.0\times10^{-12}$ A is referred to as a shift value, under the condition 2 in the test EX12, the shift values of the transistor TR15 and the transistor TR16 were −1.64 V and 1.26 V, respectively.

The transistors TR15 and TR16 also exhibited high field-effect mobility, as in the test EX11. The field-effect mobility was at most 27.4 cm²/(V·s) for the transistor TR15 and at most 25.9 cm²/(V·s) for the transistor TR16.

The above-described results of the tests EX11 and EX12 reveal that doping the transistor including an In—Sn—Zn oxide with oxygen enabled the transistor to have high reliability and high field-effect mobility.

This example can be combined as appropriate with any of the other embodiments in this specification.

This application is based on Japanese Patent Application serial no. 2014-242856 filed with Japan Patent Office on Dec. 1, 2014, Japanese Patent Application serial no. 2015-047546 filed with Japan Patent Office on Mar. 10, 2015, Japanese Patent Application serial no. 2015-118401 filed with Japan Patent Office on Jun. 11, 2015, and Japanese Patent Application serial no. 2015-126832 filed with Japan Patent Office on Jun. 24, 2015, the entire contents of which are hereby incorporated by reference.

What is claimed is:

1. A method of manufacturing an oxide by a sputtering method:
   after supplying a sputtering gas containing at least one of oxygen and a rare gas into a deposition chamber including a target and a substrate, generating plasma including an ion of the sputtering gas in the vicinity of the target by generating a potential difference between the target and the substrate;
   accelerating the ion of the sputtering gas toward the target by the potential difference;
   separating a compound containing a plurality of elements, an atom of the target, and an aggregate of atoms of the target from the target by collision of the accelerated ion of the sputtering gas with the target; and
   depositing the compound over the substrate,
   wherein the oxide is subjected to rapid thermal annealing at a temperature higher than a temperature at which the oxide is formed and lower than a temperature at which the oxide comes to have a different crystal structure,
   wherein the oxide has a c-axis-aligned crystalline structure,
   wherein a carrier density of the oxide is less than $8\times10^{11}$/cm³, and
   wherein a film density of the oxide is greater than or equal to 90% of a film density obtained when the oxide has a single crystal structure.

2. The method of manufacturing an oxide according to claim 1, wherein the temperature of the rapid thermal annealing is higher than 300° C. and lower than 1500° C.

3. The method of manufacturing an oxide according to claim 1, wherein the rapid thermal annealing is performed in an oxygen atmosphere.

4. The method of manufacturing an oxide according to claim 1, wherein a lamp is used for the rapid thermal annealing.

5. The method of manufacturing an oxide according to claim 1, wherein the oxide is formed on a surface having an amorphous structure.

6. The method of manufacturing an oxide according to claim 1,
   wherein the target comprises indium, zinc, an element M, and an oxygen,
   wherein the element M is one of aluminum, gallium, yttrium, and tin, and
   wherein the target comprises a region having a polycrystalline structure.

7. A semiconductor device comprising a transistor, the transistor comprising the oxide according to claim 1.

8. A method of manufacturing an oxide by a sputtering method:
   after supplying a sputtering gas containing at least one of oxygen and a rare gas into a deposition chamber including a target and a substrate, generating plasma including an ion of the sputtering gas in the vicinity of the target by generating a potential difference between the target and the substrate;
   accelerating the ion of the sputtering gas toward the target by the potential difference;

separating a compound containing a plurality of elements, an atom of the target, and an aggregate of atoms of the target from the target by collision of the accelerated ion of the sputtering gas with the target; and depositing the compound over the substrate, wherein the oxide is subjected to rapid thermal annealing at a temperature higher than a temperature at which the oxide is formed and lower than a temperature at which the oxide comes to have a different crystal structure, wherein the target comprises indium, zinc, gallium, and an oxygen, wherein a carrier density of the oxide is less than $8 \times 10^{11}/cm^3$, and wherein a film density of the oxide is greater than or equal to 90% of a film density obtained when the oxide has a single crystal structure.

9. The method of manufacturing an oxide according to claim 8, wherein the temperature of the rapid thermal annealing is higher than 300° C. and lower than 1500° C.

10. The method of manufacturing an oxide according to claim 8, wherein the rapid thermal annealing is performed in an oxygen atmosphere.

11. The method of manufacturing an oxide according to claim 8, wherein a lamp is used for the rapid thermal annealing.

12. The method of manufacturing an oxide according to claim 8, wherein the oxide is formed on a surface having an amorphous structure.

13. The method of manufacturing an oxide according to claim 8, wherein the target comprises a region having a polycrystalline structure.

14. A semiconductor device comprising a transistor, the transistor comprising the oxide according to claim 8.

\* \* \* \* \*